(12) United States Patent
Hoekstra et al.

(10) Patent No.: US 10,455,309 B2
(45) Date of Patent: Oct. 22, 2019

(54) MEMS TRANSDUCER PACKAGE

(71) Applicant: Cirrus Logic International Semiconductor Ltd., Edinburgh (GB)

(72) Inventors: Tsjerk Hoekstra, Balerno (GB); David Talmage Patten, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 204 days.

(21) Appl. No.: 15/538,567

(22) PCT Filed: Dec. 4, 2015

(86) PCT No.: PCT/GB2015/053727
§ 371 (c)(1),
(2) Date: Jun. 21, 2017

(87) PCT Pub. No.: WO2016/102923
PCT Pub. Date: Jun. 30, 2016

(65) Prior Publication Data
US 2017/0374441 A1  Dec. 28, 2017

Related U.S. Application Data

(60) Provisional application No. 62/096,494, filed on Dec. 23, 2014.

(51) Int. Cl.
*H04R 1/00* (2006.01)
*H04R 1/04* (2006.01)
(Continued)

(52) U.S. Cl.
CPC ............. *H04R 1/04* (2013.01); *B81B 7/0061* (2013.01); *B81C 1/00309* (2013.01);
(Continued)

(58) Field of Classification Search
CPC ............ B81B 2201/0257; H04R 19/04; H04R 19/005; H04R 2201/003; H04R 1/2853; H04R 2499/11; H04R 31/006
See application file for complete search history.

(56) References Cited

U.S. PATENT DOCUMENTS

| | | | |
|---|---|---|---|
| 8,618,619 B1* | 12/2013 | Miks | H04R 1/021 257/414 |
| 8,750,550 B2* | 6/2014 | Lee | H04R 19/005 381/351 |

(Continued)

OTHER PUBLICATIONS

International Search Report and Written Opinion of the International Searching Authority, International Application No. PCT/GB2015/053727, dated Feb. 25, 2016.

*Primary Examiner* — Matthew A Eason
(74) *Attorney, Agent, or Firm* — Jackson Walker L.L.P.

(57) ABSTRACT

A MEMS transducer package (1) comprises a semiconductor die element (3) and a cap element (23). The semiconductor die element (3) and cap element (23) have mating surfaces (9, 21). The semiconductor die element (3) and cap element (23) are configured such that when the semiconductor die element (3) and cap element (4) are conjoined, a first volume (7, 27) is formed through the semiconductor die element (3) and into the semiconductor cap element (23), and an acoustic channel is formed to provide an opening between a non-mating surface (11) of the semiconductor die element (3) and either a side surface (10, 12) of the transducer package or a non-mating surface (29) of the cap element (23).

35 Claims, 51 Drawing Sheets

(51) Int. Cl.
*H04R 1/28* (2006.01)
*H04R 19/00* (2006.01)
*H04R 19/04* (2006.01)
*H04R 31/00* (2006.01)
*B81B 7/00* (2006.01)
*B81C 1/00* (2006.01)
*H04R 1/34* (2006.01)

(52) U.S. Cl.
CPC ......... *H04R 1/2853* (2013.01); *H04R 19/005* (2013.01); *H04R 19/04* (2013.01); *H04R 31/00* (2013.01); *B81B 2201/0257* (2013.01); *B81B 2207/015* (2013.01); *H01L 2224/16225* (2013.01); *H01L 2224/48091* (2013.01); *H01L 2224/48137* (2013.01); *H01L 2224/48227* (2013.01); *H01L 2924/10155* (2013.01); *H01L 2924/10158* (2013.01); *H01L 2924/16151* (2013.01); *H01L 2924/16152* (2013.01); *H01L 2924/16195* (2013.01); *H04R 1/342* (2013.01); *H04R 2201/003* (2013.01); *H04R 2410/07* (2013.01)

(56) References Cited

U.S. PATENT DOCUMENTS

| | | | |
|---|---|---|---|
| 8,983,105 B2* | 3/2015 | Reining | B81B 7/0061 381/150 |
| 9,006,845 B2* | 4/2015 | Dehe | B81B 3/0072 257/415 |
| 9,790,089 B2* | 10/2017 | Dawson | B81B 7/0061 |
| 2006/0140431 A1 | 6/2006 | Zurek | |
| 2010/0272302 A1* | 10/2010 | Feiertag | B81B 7/0077 381/361 |
| 2011/0156176 A1* | 6/2011 | Huckabee | B81B 7/0061 257/414 |
| 2013/0075836 A1* | 3/2013 | Lee | H04R 19/005 257/416 |
| 2013/0147040 A1 | 6/2013 | Ochs et al. | |
| 2014/0042565 A1 | 2/2014 | Fuergut et al. | |
| 2014/0197501 A1 | 7/2014 | Dehe | |
| 2014/0341402 A1 | 11/2014 | Traynor et al. | |
| 2016/0167948 A1* | 6/2016 | Holliday | B81B 7/0029 428/212 |
| 2017/0374442 A1* | 12/2017 | Pennock | B81B 7/0061 |
| 2018/0215609 A1* | 8/2018 | Agashe | B81B 7/0038 |
| 2018/0376254 A1* | 12/2018 | Pal | B32B 3/30 |

\* cited by examiner

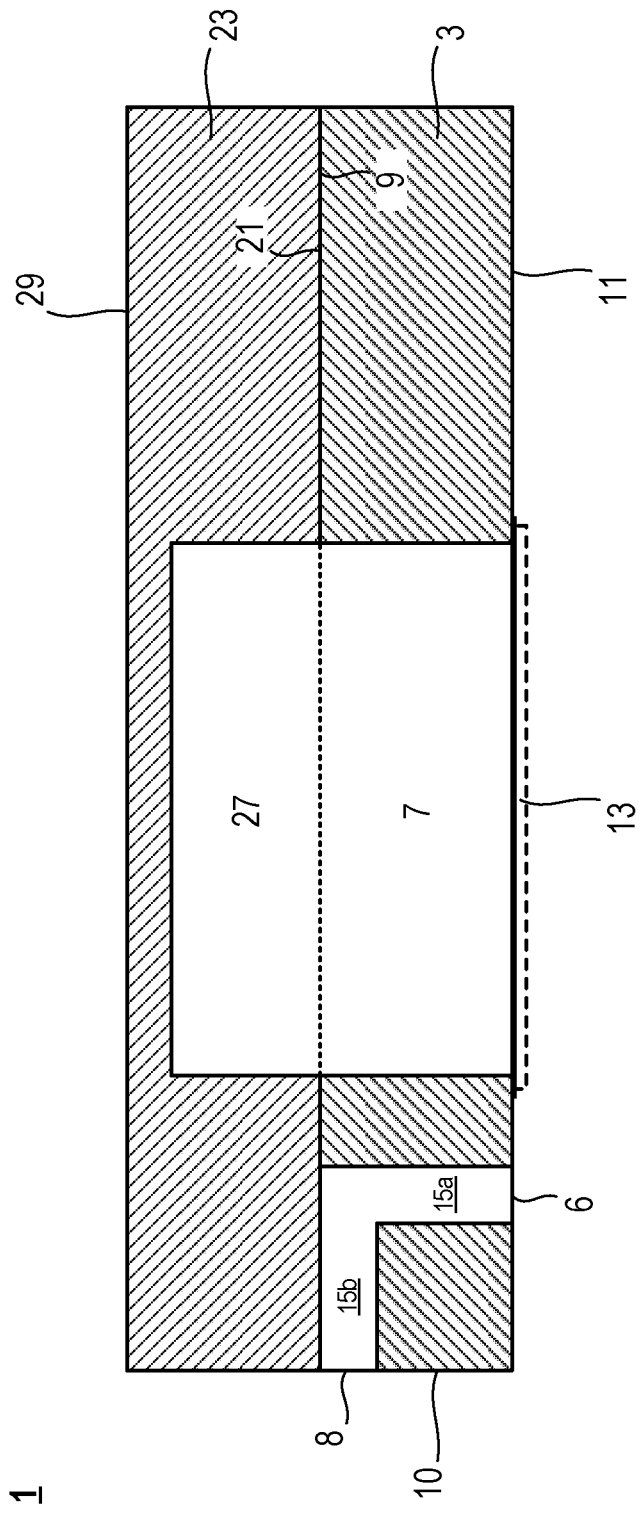

| WaferCap | | | | |
|---|---|---|---|---|
| Bottom port, omni | Top port, omni | Side port, omni | Side port, omni | Bottom port, omni |
| Bottom port, omni | Top port, omni | Side port, omni | Side port, omni | Side port, omni |
| Side port, omni | 2 port, directional | 2 port, directional | Side port, omni | Side port, omni |
| Side port, omni | Side & Top port omni | Side port, omni | 2 port, directional | Side port, omni |
| Side port, omni | Side & Top port omni | Side port, omni | 2 port, directional | 2 port, directional |
| 2 port, directional | 2 port, directional | 2 port, directional | 2 port, directional | 2 port, directional |

Figure 27

Waferdie

MEMS TRANSDUCER PACKAGE

TECHNICAL FIELD

The present application relates to a Micro-electromechanical-system (MEMS) transducer package, for example a MEMS microphone package (including a Capacitive-type MEMS transducer, a Piezo-type MEMS transducer, or an optical-type microphone), and to a semiconductor die portion and cap portion for use in a MEMS transducer package.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices. Requirements of the mobile phone industry for example, are driving the components to become smaller with higher functionality and reduced cost. It is therefore desirable to integrate functions of electronic circuits together and combine them with transducer devices such as microphones and speakers.

Micro-electromechanical-system (MEMS) transducers, such as MEMS microphones are finding application in many of these devices. There is therefore also a continual drive to reduce the size and cost of the MEMS devices.

Microphone devices formed using MEMS fabrication processes typically comprise one or more membranes with electrodes for read-out/drive that are deposited on or within the membranes and/or a substrate or back-plate. In the case of MEMS pressure sensors and microphones, the electrical output signal is usually obtained by measuring a signal related to the capacitance between the electrodes. However in some cases the output signal may be derived by monitoring piezo-resistive or piezo-electric elements. In the case of capacitive output transducers, the membrane is moved by electrostatic forces generated by varying a potential difference applied across the electrodes, though in some other output transducers piezo-electric elements may be manufactured using MEMS techniques and stimulated to cause motion in flexible members.

To provide protection, the MEMS transducer may be contained within a package. The package effectively encloses the MEMS transducer and can provide environmental protection while permitting the physical input signal to access the transducer and providing external connections for the electrical output signal.

FIG. 1a illustrates one conventional MEMS microphone package 100a. A MEMS transducer 101 is attached to a first surface of a package substrate 102. The MEMS transducer 101 may typically be formed on a semiconductor die by known MEMS fabrication techniques. The package substrate 102 may be silicon or a printed circuit board (PCB) or a ceramic laminate or any other suitable material. A cover 103 is located over the transducer 101 attached to the first surface of the package substrate 102. The cover 103 may be a metallic lid. An aperture, i.e. hole, 104 in the cover 103 provides a sound port and allows acoustic signals to enter the package. In this example, the transducer 101 is wire bonded from bond pads 105 on the transducer to bond pads 105a on the package substrate 102. Electrical pathways in or on the substrate connect between the bond pads on the internal face of the substrate and lead, i.e. solder, pads 108 on the external face of the substrate to provide an external electrical connection to the transducer.

The sound port, or acoustic port, 104 allows transmission of sound waves to/from the transducer within the package. The transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port 104 acoustically couples to a first volume on one side of the transducer membrane, which may sometimes be referred to as a front volume. The second volume, sometimes referred to as a back volume, on the other side of the one of more membranes, is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths such as bleed holes, i.e. small holes in the membrane, that are configured so as to present a relatively high acoustic impedance at the desired acoustic frequencies but which allow for low-frequency pressure equalisation between the two volumes to account for pressure differentials due to temperature changes or the like).

FIG. 1b illustrates another known MEMS transducer package 100b. Again, a transducer 101, which may be a MEMS microphone, is attached to the first surface of a package substrate 102. In this example, the package 100b also contains an integrated circuit 106, which although not illustrated may also be present in FIG. 1a. The integrated circuit 106 may be provided for operation of the transducer and may, for example, be a low-noise amplifier for amplifying the signal from a MEMS microphone. The integrated circuit 106 is electrically connected to electrodes of the transducer 101 and is also attached to the first surface of the package substrate 102. The integrated circuit 106 is electrically connected to the transducer 101 via wire-bonding. A cover 107 is located on the package substrate so as to enclose the transducer 101 and the integrated circuit 106. In this package, the cover 107 is a two-piece cover that comprises an upper part or lid portion 107a and a spacer or frame portion 107b surrounding a cavity in which the transducer 101 and the integrated circuit 106 are situated. The package substrate 102, cover and frame portion may all be formed of PCB or ceramic material which may be multi-layer laminate structures. The cover 107 has a sound port 104 in the upper part 107a which allows acoustic signals to enter the package. Each of the substrates in FIGS. 1a and 1b have external lead pads, i.e. solder pads, 108 for external connection to an end user's PCB via a solder reflow process for example.

In order to buffer the generally weak transducer output signal, an integrated circuit amplifier circuit may also be used in the packages similar to that shown in FIG. 1a and connected internally in similar fashion to that shown in FIG. 1b. In some examples, the acoustic port may be provided through the substrate 102 rather than the cover, or sometimes in both to provide a differential or directional microphone.

Various other styles of packages for MEMS microphone and other MEMS transducers are available, but may be complex multi-part assemblies and/or require physical clearance around the transducer for connections, impacting material and manufacturing cost and physical size.

The embodiments disclosed herein relate to improved MEMS transducer packages.

SUMMARY

According to a first aspect of the present invention, there is provided a MEMS transducer package comprising a semiconductor die portion having a thickness bounded by a first surface and an opposite second surface, and a transducer element incorporated in the second surface. A die back volume extends through the thickness of the semiconductor die portion between the first surface and the transducer element. An acoustic die channel extends through the thickness of the semiconductor die portion between the first surface and the second surface.

In one embodiment the MEMS transducer package further comprises a cap portion that abuts the semiconductor die portion. The cap portion may comprise: a thickness bounded by a first surface and an opposite second surface; and an acoustic cap channel that extends through the thickness of the cap portion between the first surface and the second surface.

The second surface of the cap portion may abuts a first surface of the semiconductor die portion.

In one embodiment an opening formed by the acoustic die channel in the first surface of the semiconductor die portion at least partially overlaps with an opening formed by the acoustic cap channel in the cap portion, to provide an acoustic path through the transducer package.

The opening formed by the acoustic die channel and the opening formed by the acoustic cap channel may be aligned.

A cross-sectional area of the acoustic die channel and/or a cross-sectional area of the acoustic cap channel may be constant along a length of the respective acoustic channel. In one embodiment, a cross-sectional area of the first acoustic channel and/or a cross-sectional area of the second acoustic channel varies along a length of the respective acoustic channel.

In one embodiment, at a plane where the acoustic die channel and the acoustic cap channel meet: a cross-sectional area of the acoustic die channel is the same as the cross-sectional area of the acoustic cap channel; or a cross-sectional area of the acoustic die channel is larger than the cross-sectional area of the acoustic cap channel; or a cross-sectional area of the acoustic die channel is smaller than the cross-sectional area of the acoustic cap channel.

The acoustic die channel and/or the acoustic cap channel may comprise a cross-sectional area of at least 10,000 $\mu m^2$.

The cap portion may comprises a die attach film.

The acoustic die channel may comprise a first portion that extends through the thickness of the semiconductor die portion to provide an acoustic path between the first surface and the second surface of the semiconductor die portion, and a second portion which extends parallel to the first surface of the semiconductor die portion. In one embodiment, the first portion and the second portion cooperate to provide an acoustic path between a first opening and a second opening, the first opening formed by the first portion in the second surface of the semiconductor die portion, and the second opening formed by the second portion in a side surface of the semiconductor die portion.

The second portion of the acoustic die channel may form an opening in the first surface of the semiconductor die portion.

In one embodiment, the MEMS transducer package comprises a cap portion comprising a thickness bounded by a first surface and an opposite second surface, wherein the second surface of the cap portion abuts the first surface of the semiconductor die portion. The cap portion may comprise an acoustic cap channel. In such an embodiment, the acoustic cap channel may extend parallel to the second surface of the cap portion. The acoustic cap channel may interface with the acoustic die channel to provide an acoustic path between a first opening formed in the second surface of the semiconductor die portion and a second opening formed in a side surface of the transducer package.

The second opening may be partly formed in a side surface of the semiconductor die portion and partly formed in a side surface of the cap portion. A side surface of the semiconductor die portion and/or cap portion may be orthogonal to the first surface of the semiconductor die portion.

In one embodiment the MEMS transducer package comprise a cap portion, the cap portion comprising: a thickness bounded by a first surface and an opposite second surface; and an acoustic cap channel configured to provide an acoustic path between a first opening in the second surface of the cap portion and a second opening in a side surface of the cap portion.

In such an embodiment, the acoustic cap channel may extend parallel to the second surface of the cap portion. The side surface may be orthogonal to the first surface of the cap portion.

The acoustic cap channel may interface with the acoustic die channel to provide an acoustic path between a first opening formed by the acoustic die channel in the second surface of the semiconductor die portion and a second opening formed by the acoustic cap channel in a side surface of the cap portion.

In one embodiment the acoustic die channel comprises: a first acoustic channel, and a second acoustic channel. The first acoustic channel may be configured to provide an acoustic path between a first opening in the second surface of the semiconductor die portion and a second opening in a side surface of the transducer package, the side surface being orthogonal to the second surface of the semiconductor die portion, and wherein the second acoustic channel is configured to provide an acoustic path between a third opening in the second surface of the semiconductor die portion and a fourth opening that is in acoustic connection with the die back volume.

The first acoustic channel may comprise at least a first portion which extends between the first surface and the second surface of the semiconductor die portion.

The first acoustic channel may further comprise a second portion which extends orthogonal to the first portion, and wherein the first portion and the second portion cooperate to provide an acoustic path between the first opening in the second surface of the semiconductor die portion and the second opening in the side surface of the semiconductor die portion.

In one embodiment, the second acoustic channel comprises at least a first portion which extends between the first surface and the second surface of the semiconductor die portion. The second acoustic channel may further comprise a second portion which extends orthogonal to the first portion, and wherein the first portion and the second portion cooperate to provide an acoustic path between the third opening in the second surface of the semiconductor die portion and the fourth opening that is in acoustic connection with the die back volume.

The second opening may be formed entirely in a side surface of the semiconductor die portion.

The MEMS transducer package may further comprise a cap portion, the cap portion comprising a thickness bounded by a first surface and an opposite second surface. The cap portion may comprise an acoustic cap channel.

The acoustic cap channel may comprise a first acoustic channel which extends orthogonal to the second surface of the cap portion, and wherein the first acoustic channel of the acoustic cap channel and the first acoustic channel of the acoustic die channel cooperate to provide an acoustic path between a first opening in the second surface of the semiconductor die portion and a second opening in the side surface of the transducer package.

The second opening may be formed either entirely in a side surface of the cap portion, or partly in a side surface of the cap portion and partly in a side surface of the semiconductor die portion.

The cap portion may further comprise a cap back volume, and wherein the acoustic cap channel comprises: a second acoustic channel which extends orthogonal to the second surface of the cap portion; and wherein the second acoustic channel of the acoustic cap channel and the second acoustic channel of the acoustic die channel cooperate to provide an acoustic path between a third opening in the second surface of the semiconductor die portion and a fourth opening in acoustic connection with the cap back volume.

The fourth opening may be formed either entirely in direct acoustic connection with the cap back volume of the cap portion, or partly in direct acoustic connection with the cap back volume of the cap portion and partly in direct acoustic connection with the die back volume of the semiconductor die portion.

The second portion of the first and/or second acoustic channel of the acoustic die channel breaches the first surface of the semiconductor die portion.

The transducer element may comprise a microphone, or multiple microphones, or where the transducer element comprises a membrane and back-plate, or multiple membranes and back-plates.

A cap portion may comprises a cap back volume, the cap back volume extending from the second surface of the cap portion partially into the thickness of the cap portion.

A footprint of a cap portion may be the same size as the footprint of the semiconductor die portion.

A die back volume may comprises a stepped back volume. The stepped back volume may comprise at least one discontinuity along a sidewall of the die back volume, between the first surface and the second surface of the semiconductor die portion. The stepped back volume may comprise a first sub-volume adjacent to the first surface of the semiconductor die portion and a second sub-volume adjacent to the second surface of the semiconductor die portion.

A lateral dimension of the first sub-volume may be greater that the lateral dimension of the second sub-volume. A lateral dimension of the die back volume and a lateral dimension of the cap back volume may be the same size at a plane where they meet.

A cap back volume may comprise a stepped back volume.

A semiconductor die portion may further comprise integrated electronic circuitry for operating the MEMS transducer element. At least part of the integrated electronic circuitry may be positioned in a thickness of the semiconductor die portion that is bounded by at least part of a first sub-volume of a stepped die back volume and a second surface of the semiconductor die portion.

In one embodiment a MEMS transducer package comprises an acoustic seal. The acoustic seal may be configured to surround an opening of the acoustic die channel and an opening of die back volume, or surround an opening of the die back volume.

An acoustic seal may comprise one or more of the following features or properties: a solder ring, for coupling with a corresponding solder ring on a substrate onto which the MEMS transducer package is to be mounted during use; a conductive material; a non-conductive material; a resilient material; a flexible material; or a stress relieving material.

In one embodiment there is provided a semiconductor die portion for use in a MEMS transducer package. The semiconductor die portion comprises a thickness bounded by a first surface and an opposite second surface, wherein the second surface incorporates a transducer element; a die back volume that extends through the thickness of the semiconductor die portion between the first surface and the transducer element, and an acoustic die channel that extends through the thickness of the semiconductor die portion between the first surface and the second surface.

In such an embodiment, the acoustic die channel may comprises a first portion that extends between the first surface and the second surface, and a second portion that extends parallel to the first surface, the first and second portions configured to provide an acoustic path between a first opening in the second surface and a second opening in a side surface of the semiconductor die portion.

According to another embodiment there is provided a semiconductor cap portion for use in a MEMS transducer package, the semiconductor cap portion comprising a thickness bounded by a first surface and an opposite second surface; and an acoustic cap channel that extends at least partially into the thickness of the semiconductor cap portion.

The acoustic cap channel may extend through the thickness of the semiconductor cap portion between the first surface and the second surface.

The acoustic cap channel may extend to a side of the semiconductor cap portion.

According to another aspect, there is provided a MEMS transducer package comprising: a semiconductor die element; and a cap element; wherein the semiconductor die element and cap element have mating surfaces, wherein the semiconductor die element and cap element are configured such that when the semiconductor die element and cap element are conjoined: a first volume is formed through the semiconductor die element and into the semiconductor cap element; and an acoustic channel is formed to provide an opening between a non-mating surface of the semiconductor die element and either a side surface of the transducer package or a non-mating surface of the cap element.

According to another aspect, there is provided a MEMS transducer package comprising: a semiconductor die portion having a thickness wherein the thickness spans a first surface and a second surface, and wherein the second surface incorporates a transducer element; an aperture that extends through the thickness of the semiconductor die portion; and an acoustic channel that is separate from the aperture and that extends through the thickness of the semiconductor die portion.

According to another aspect, there is provided a wafer level package comprising: a semiconductor substrate comprising a MEMS microphone; and a cap portion; wherein an acoustic channel extends through at least said substrate.

According to another aspect, there is provided a wafer level package comprising: a semiconductor die portion comprising a MEMS microphone transducer element and back volume; and a cap portion attached to said substrate; wherein an acoustic channel is separate from said back volume extends through said at least substrate.

According to another aspect, there is provided a wafer level package comprising: a semiconductor die portion comprising a MEMS microphone transducer element and back volume; and a cap portion attached to said substrate;

wherein an acoustic channel separate from said back volume extends through said at least substrate and said cap portion.

According to another aspect, there is provided a wafer level package comprising: a semiconductor die portion comprising a MEMS microphone transducer element and back volume; and a cap portion attached to said substrate; wherein an acoustic channel separate from said back volume extends through said at least substrate and said cap portion.

According to another aspect, there is provided a MEMS transducer package comprising: a semiconductor die portion having a thickness bounded by a first surface and an opposite second surface; a transducer element incorporated in the second surface; a die back volume that extends through the thickness of the semiconductor die portion between the first surface and the transducer element; and an acoustic die channel that extends between one surface of the semiconductor die channel and another surface of the semiconductor die channel. The one surface may be the second surface of the semiconductor die portion, and the another surface the first surface of the semiconductor die portion. In another embodiment, the one surface may be the second surface of the semiconductor die portion, and the another surface a side surface of the semiconductor die portion. The MEMS transducer package may further comprising a cap portion.

Lower Side Port

According to a first aspect of the present invention, there is provided a MEMS transducer package comprising a semiconductor die portion having a thickness bounded by a first surface and an opposite second surface, and a transducer element incorporated in the second surface. A die back volume extends through the thickness of the semiconductor die portion between the first surface and the transducer element. An acoustic die channel extends into the semiconductor die portion between the second surface and a side surface of the semiconductor die portion.

In one embodiment the acoustic die channel forms a channel in the second surface of the semiconductor die portion, wherein the channel extends inwardly from an opening formed by the channel in the side surface of the semiconductor die portion.

In one embodiment, the acoustic die channel breaches the second surface and the side surface of the semiconductor die portion to form openings therein.

An opening formed in the second surface and an opening formed in the side surface may combine to form an opening which spans an intersection of the second surface and side surface.

In one embodiment a MEMS transducer package further comprises an acoustic seal formed on the second surface of the semiconductor die portion.

The acoustic seal may be configured to channel acoustic signals, during use, from an opening in the side surface of the MEMS transducer package to the transducer element.

The acoustic seal may be configured to surround an opening of the die back volume, and partially surround the acoustic die channel.

In one embodiment, the acoustic seal comprises an interruption therein, the interruption corresponding to a region comprising an opening formed by the acoustic die channel in the second surface of the semiconductor die portion.

In one embodiment, the acoustic seal comprises an interruption therein, the interruption abutting an opening formed by the acoustic die channel in the second surface of the semiconductor die portion.

The acoustic seal may comprise one or more of the following features or properties: a solder ring, for coupling with a corresponding solder ring on a substrate onto which the MEMS transducer package is to be mounted during use; a conductive material; a non-conductive material; a resilient material; a flexible material; or a stress relieving material.

A MEMS transducer package may further comprise a cap portion that abuts the semiconductor die portion.

The cap portion may comprises a thin film, or a die adhesive film.

In another embodiment the cap portion comprises a thickness bounded by a first surface and a second surface, and wherein the cap portion comprises a cap back volume, the cap back volume extending from the second surface of the cap portion partially into the thickness of the cap portion.

A footprint of a cap portion may be the same size as the footprint of the semiconductor die portion.

The cap portion may comprise a semiconductor layer, a silicon layer, a molded plastic layer.

In one embodiment the die back volume comprises a stepped back volume. The stepped back volume may comprise at least one discontinuity along a sidewall of the die back volume, between the first surface and the second surface of the semiconductor die portion.

The stepped back volume may comprise a first sub-volume adjacent to the first surface of the semiconductor die portion and a second sub-volume adjacent to the second surface of the semiconductor die portion. A lateral dimension of the first sub-volume may be greater that the lateral dimension of the second sub-volume. A lateral dimension of the die back volume and a lateral dimension of the cap back volume may be the same size at a plane where they meet.

A cap back volume may comprise a stepped back volume.

According to another aspect, the semiconductor die portion may further comprise integrated electronic circuitry for operating the MEMS transducer element. At least part of the integrated electronic circuitry may be positioned in a thickness of the semiconductor die portion that is bounded by at least part of a first sub-volume of a stepped die back volume and a second surface of the semiconductor die portion.

In one embodiment, a second acoustic channel may be provided. The second acoustic channel may be configured to provide an acoustic path between a third opening in the second surface of the semiconductor die portion and a fourth opening that is in acoustic connection with the die back volume. The second acoustic channel may comprise a first portion which extends between the first surface and the second surface of the semiconductor die portion, and a second portion which extends orthogonal to the first portion, and wherein the first portion and the second portion cooperate to provide an acoustic path between the third opening in the second surface of the semiconductor die portion and the fourth opening that is acoustically coupled to the die back volume.

The fourth opening may be formed either entirely in direct acoustic connection with the cap back volume of the cap portion, or partly in direct acoustic connection with the cap back volume of the cap portion and partly in direct acoustic connection with the die back volume of the semiconductor die portion, or entirely in direct acoustic connection with the die back volume of the semiconductor die portion.

The transducer element may comprise a microphone, or multiple microphones, or where the transducer element comprises a membrane and back-plate, or multiple membranes and back-plates.

According to another embodiment, there is provided a MEMS transducer package comprising: a semiconductor die element; and a cap element; wherein the semiconductor die element and cap element have mating surfaces, wherein the semiconductor die element and cap element are configured such that when the semiconductor die element and cap element are conjoined: a first volume is formed through the semiconductor die element and into the semiconductor cap element; and an acoustic channel is formed to provide an opening between a non-mating surface of the semiconductor die element and a side surface of the semiconductor die element.

According to another embodiment, there is provided a MEMS transducer package comprising: a semiconductor die portion having a thickness bounded by a first surface and an opposite second surface; a transducer element incorporated in the second surface; a die back volume that extends through the thickness of the semiconductor die portion between the first surface and the transducer element; wherein an acoustic die channel is formed in the second surface of the semiconductor die portion, wherein the acoustic die channel forms an opening in the second surface which runs from a boundary of the second surface to within the boundary of the second surface.

According to another embodiment, there is provided a method of fabricating a MEMS transducer package comprising a semiconductor die portion having a thickness bounded by a first surface and an opposite second surface. The method comprises forming a transducer element in the second surface; etching from the side of the first surface a die back volume that extends through the thickness of the semiconductor die portion between the first surface and the transducer element; and etching from the second surface an acoustic die channel that extends into the thickness of the semiconductor die portion to form a channel that extends from a side surface of the semiconductor die portion into the body of the semiconductor die portion.

X2 ICP Bottom Port.

According to a first aspect of the present invention, there is provided a MEMS transducer package comprising a semiconductor die portion having a thickness bounded by a first surface and an opposite second surface, a transducer element incorporated in the second surface, and a die back volume that extends through the thickness of the semiconductor die portion between the first surface and the transducer element. The MEMS transducer package further comprises a cap portion that abuts the semiconductor die portion at the first surface.

In one embodiment, the cap portion may comprise a thickness bounded by a first surface and an opposite second surface.

The first surface of the semiconductor die portion and the second surface of the cap portion may equal in size.

In one embodiment, the second surface of the cap portion comprises a cap back volume, the cap back volume extending from the second surface of the cap portion partially into the thickness of the cap portion. The die back volume and the cap back volume may acoustically connect.

In one embodiment, a MEMS transducer package comprises a circuitry portion with a circuit thickness allocated in the semiconductor die portion in proximity of the transducer element. The circuitry portion may comprise an integrated electronic circuitry for operating the MEMS transducer element.

In one embodiment the die back volume comprises a first sub-volume with a first cross-section in a plane transverse to the thickness of the semiconductor die portion, and a second sub-volume with a second cross-section in a plane transverse to the thickness of the semiconductor die portion, wherein the first cross-section is larger than the second cross-section, and wherein a thickness of the second sub-volume is equal or larger than the circuit thickness.

The first cross-section of the first sub-volume may extend over the transducer element and the circuit portion.

According to another aspect, the die back volume may comprises a stepped back volume. The stepped back volume may comprise at least one discontinuity along a sidewall of the die back volume, between the first surface and the second surface of the semiconductor die portion.

The stepped back volume may comprises a first sub-volume adjacent to the first surface of the semiconductor die portion and a second sub-volume adjacent to the second surface of the semiconductor die portion. A lateral dimension of the first sub-volume may be greater that the lateral dimension of the second sub-volume.

In one embodiment, the circuit thickness may be bounded by at least part of a first sub-volume of a stepped die back volume and the second surface of the semiconductor die portion.

A lateral dimension of the die back volume and a lateral dimension of the cap back volume may be the same size at a plane where they meet.

According to another aspect of the present invention, there is provided a MEMS transducer device comprising: a MEMS transducer package as described above, and comprising a substrate comprising a bottom port, wherein the MEMS transducer package is mounted on the substrate and acoustically connected to the bottom port.

According to another aspect of the present invention, there is provided a wafer level package comprising: a semiconductor substrate comprising a MEMS microphone and a circuitry portion in proximity of the transducer element; and a cap portion; wherein the circuitry portion comprises an integrated electronic circuitry for operating the MEMS transducer element.

According to another aspect of the present invention, there is provided a wafer level package comprising: a semiconductor die substrate comprising a MEMS microphone transducer element, a back volume and integrated electronic circuitry for operating the MEMS transducer element; and a cap portion attached to said substrate; wherein the back volume has a first sub-volume with a cross-section that in a lateral dimension covers the transducer element and at least partially covers the integrated electronic circuitry.

BRIEF DESCRIPTION OF DRAWINGS

For a better understanding of the present invention, and to show more clearly how it may be put into effect, reference will now be made, by way of example, to the accompanying drawings, in which:

FIG. 3b illustrates a three dimensional view of the example of FIG. 3a;

FIG. 9 illustrates an example of a MEMS transducer package according to an embodiment of the present disclosure;

FIGS. 27 to 31 also relate to other options and configurations available according to embodiments disclosed herein;

FIG. 33b illustrates a cross-sectional plan view of the MEMS transducer package according to the example of FIG. 33a;

DETAILED DESCRIPTION

Figure 1A:
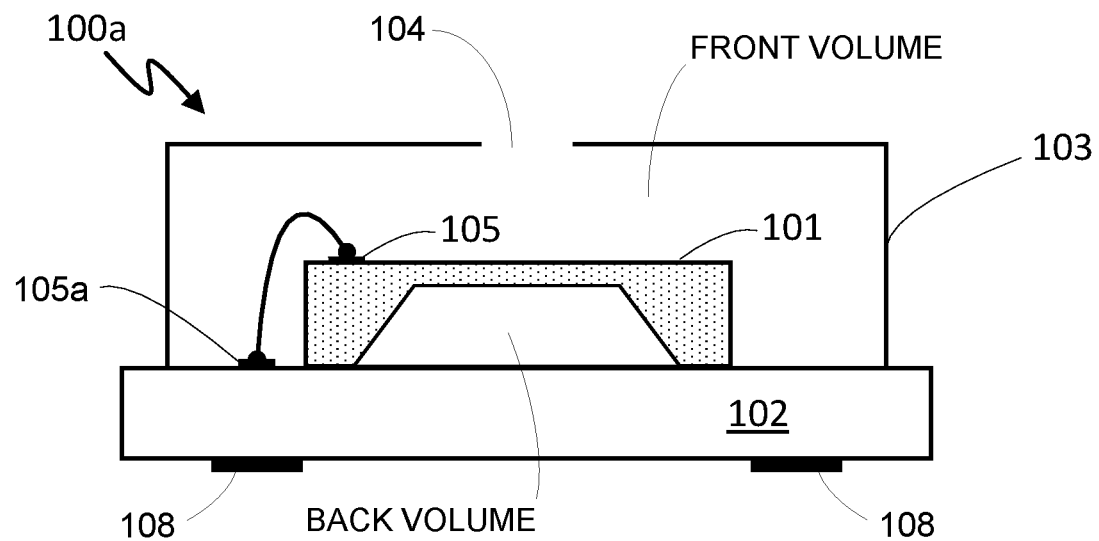
FIGS. 1a and 1b illustrate prior art MEMS transducer packages.
Figure 1B:
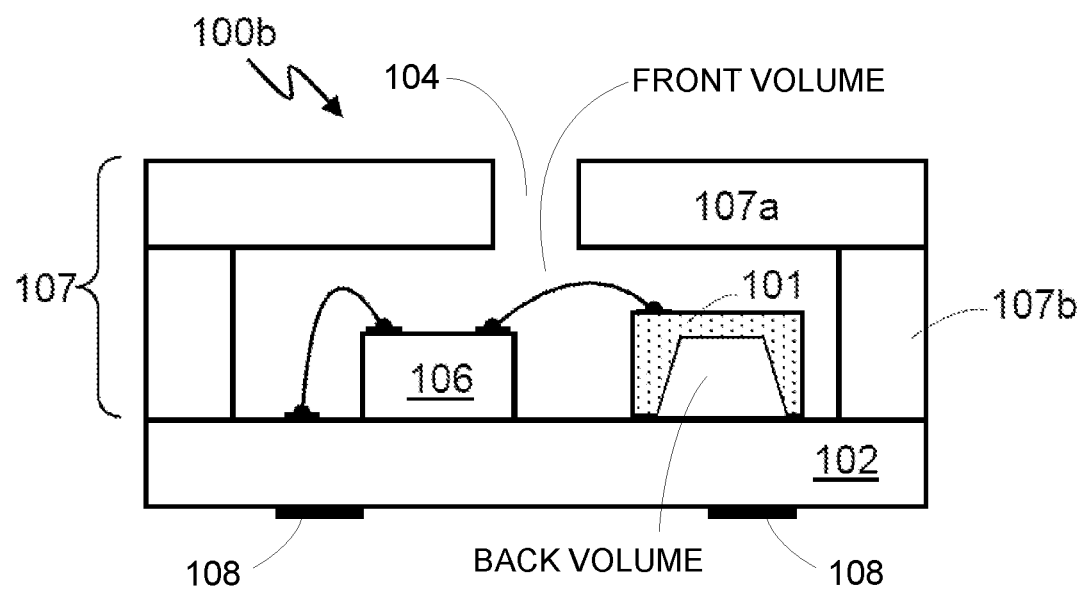

Embodiments of the present disclosure provide improved MEMS transducer packages wherein a die portion comprising a MEMS transducer, and in some embodiments a cap portion, comprise one or more acoustic channels and thus enable a MEMS transducer to be packaged more efficiently. In some embodiments, the die portion may comprise co-integrated electronic circuitry for operation of the MEMS transducer. In some embodiments, the size of a MEMS transducer package may be relatively small and/or reduced as compared to conventional packages and in some embodiments the footprint of the package may be substantially the same size as the footprint of the die portion comprising the MEMS transducer rather than being increased by some surrounding structure.

Throughout this description any features which are similar to features in other figures have been given the same reference numerals.

Top Port Embodiments

Figure 2:
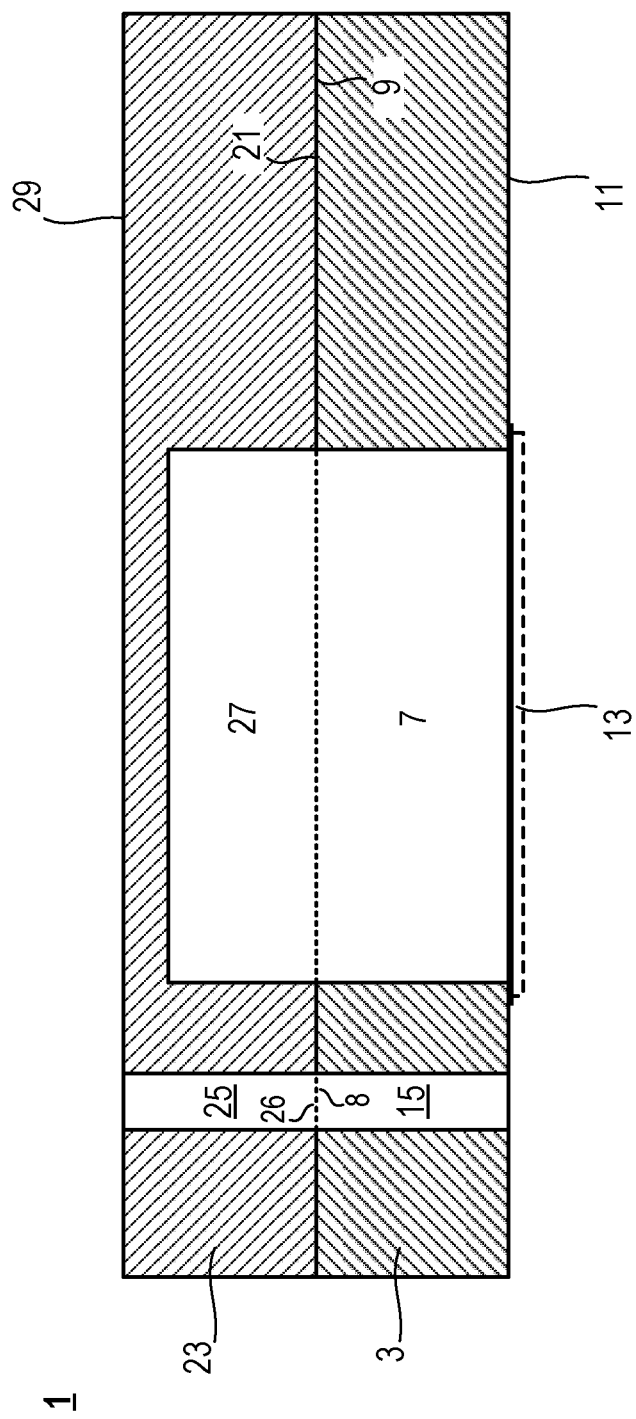
FIG. 2 illustrates an example of a MEMS transducer package according to an embodiment of the present disclosure.

FIG. 2 shows a cross-section view of an example of a MEMS transducer package 1 according to an embodiment of the present disclosure. In particular, FIG. 2 shows an example of a semiconductor die portion 3 that may be used in conjunction with a cap portion 23 to provide a MEMS transducer package 1. The semiconductor die portion 3 comprises a thickness bounded by a first surface 9 and an opposite second surface 11. The second surface 11 of the semiconductor die portion 3 incorporates a transducer element 13 (for example a microphone comprising a membrane and a back-plate). A die back volume 7 extends through the thickness of the semiconductor die portion 3 between the first surface 9 and the transducer element 13. An acoustic die channel 15 extends through the thickness of the semiconductor die portion 3 between the first surface 9 and the second surface 11. The acoustic die channel 15 provides an acoustic path between the first and second surfaces 9, 11 of the semiconductor die portion 3.

In one embodiment, the MEMS transducer package 1 comprises a cap portion 23 as shown in FIG. 2, wherein the cap portion 23 abuts the semiconductor die portion 3. The cap portion 23 comprises a thickness bounded by a first surface 29 and an opposite second surface 21. The cap portion 23 comprises an acoustic cap channel 25 that extends through the thickness of the cap portion 23 between the first surface 29 and the second surface 21. The acoustic cap channel 25 provides an acoustic path between the first surface 29 and the second surface 21 of the cap portion 23.

The second surface 21 of the cap portion 23 interfaces with the first surface 9 of the semiconductor die portion 3. Although not shown, the semiconductor die portion 3 and the cap portion 23 may be bonded together, for example using an adhesive or other techniques as generally known in the art of wafer-to-wafer bonding.

The acoustic die channel 15 and acoustic cap channel 25 have the advantage of enabling acoustic signals from a top side of the MEMS transducer package, i.e. corresponding to the surface 29, to reach the transducer element 13, for example when the MEMS transducer package 1 is used in different assembly or mounting configurations of the MEMS transducer package, examples of which will be described later.

It is noted that in the example of FIG. 2, and the other examples described herein, the semiconductor die portion 3 incorporates a transducer element 13 that may be formed using silicon processing techniques, possibly in conjunction with additional processes such as the deposition of piezoelectric or piezo-resistive thin films. Preferably any such transducer processing techniques are compatible in terms of processing temperature and suchlike with providing active circuitry in the same silicon die.

In addition, it is noted that in the example of FIG. 2, and the other examples described herein, the footprint of the cap portion 23 may be the same size as the footprint of the semiconductor die portion 3, or substantially the same size as the semiconductor die portion 3 (for example within 10% of the size of the semiconductor die portion 3).

In the example of FIG. 2, the cap portion 23 is shown as comprising a cap back volume 27, which cooperates with the die back volume 7 to advantageously increase the overall back volume. This can be advantageous in certain embodiments where a greater back volume is desired. It is noted, however, that the cap back volume may be dispensed with in some embodiments.

An opening 8 formed by the acoustic die channel 15 in the first surface 9 of the semiconductor die portion 3 at least partially overlaps with an opening 26 formed by the acoustic cap channel 25 in the cap portion 23, to provide an acoustic path through the transducer package. In the example of FIG. 2, the opening 8 formed by the acoustic die channel 15 and the opening 26 formed by the acoustic cap channel 25 are of the same width, and are substantially aligned, for example within manufacturing tolerances. In this way, the acoustic die channel 15 and acoustic cap channel 25, which are separate to the back volume 7, 27, enable acoustic signals to pass from a first side of the MEMS transducer package to a second, opposite, side of the MEMS transducer package and thence pass to the surface of a MEMS transducer element which is positioned nearby on that second side of the package. As mentioned above, this has the advantage of enabling the MEMS transducer package to be mounted in advantageous ways.

Figure 3A:
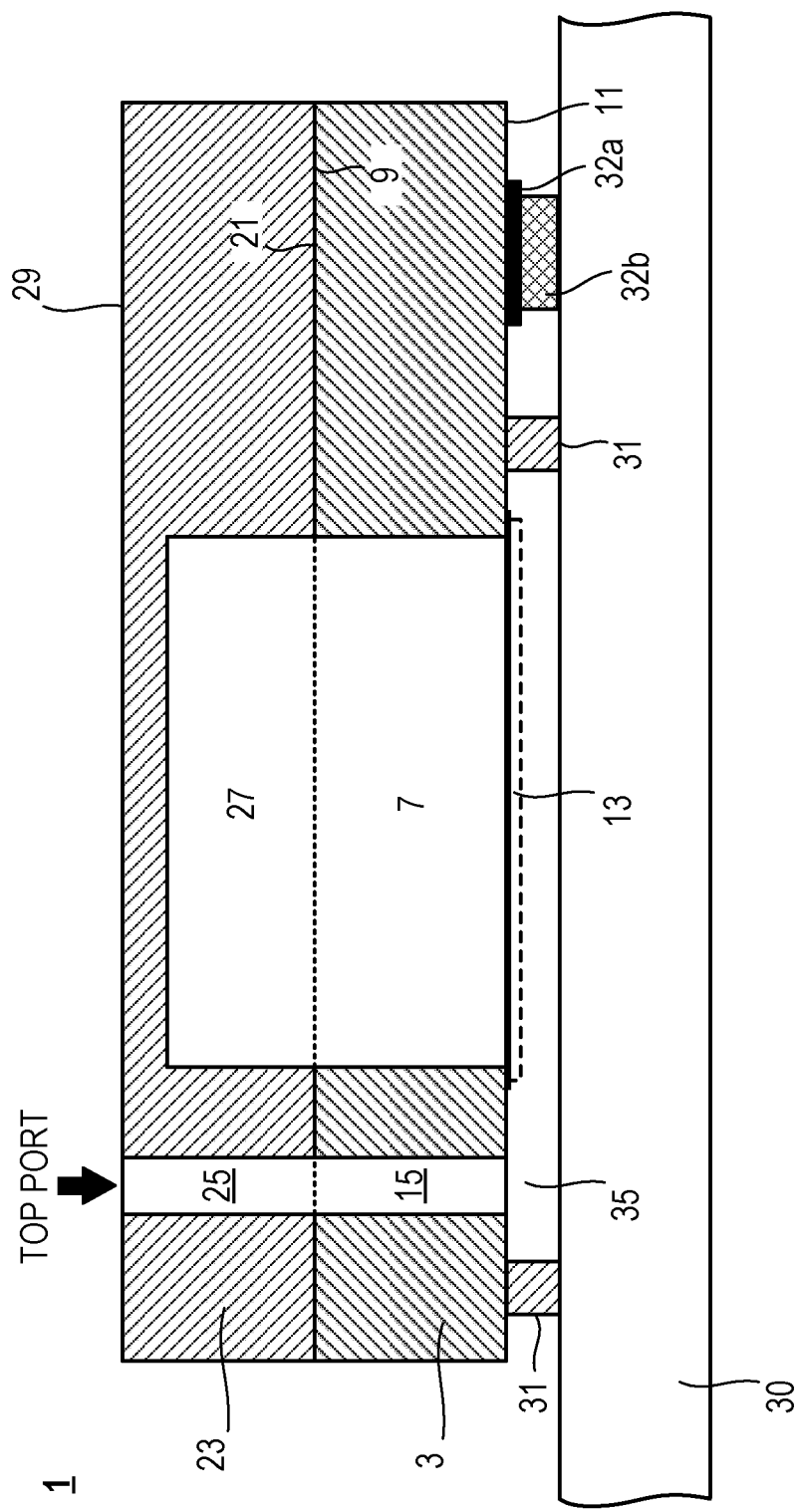
FIG. 3a illustrates an example of the MEMS transducer package of FIG. 2 mounted in one configuration example, referred to as a top-port configuration.

FIG. 3a shows a cross-section view of an example of the MEMS transducer package 1 mounted onto a host substrate 30, for example a printed circuit board (PCB) onto which the MEMS transducer package 1 is mounted during use (for example, a PCB within a mobile phone or other device). The semiconductor die portion 3 and cap portion 23 form a MEMS transducer package 1, wherein the cap portion 23 acts to protect the semiconductor die portion 3 (and in particular the MEMS transducer element 13).

The embodiment of FIG. 3a may be referred to as a top port mounted configuration, whereby sound is received from a top side of the MEMS transducer package, with a bottom side of the MEMS transducer package being the side which faces the host substrate 30, and which may comprise lead, i.e. solder, pads 32a for electrical connection to electrical conductors on the host substrate 30 via solder 32b for example. Respective solder pads 32a may be connected via electrical pathways, such as vias and conductive traces (not illustrated), so as to provide power (V+ and ground potentials) to the transducer and to output a signal from the transducer for example: other solder pads and operative connections may be required as needed and as would be understood by those skilled in the art. Advantageously, the solder pads 32a may be formed from the metal layers associated with the formation of the MEMS back-plate and membrane metal electrodes or some other MEMS metal processing layer as opposed to the metal layers associated with the processing of the integrated electronic circuitry. Therefore, the solder pads 32b and associated metal, i.e. conductive, traces to/from the transducer, including any electronic circuitry if present, may be considered a re-distribution layer. Therefore a MEMS package as herein described with a metal layer for solder pads 32a formed during the MEMS transducer metal formation is advantageous in re-distributing the solder pads to various areas of the MEMS transducer which may be over the area where the circuitry is formed, if present.

In this example, the MEMS transducer package 1 is shown as comprising an acoustic seal 31. Some or all of the acoustic seal 31 may be formed during fabrication of the semiconductor die portion 3, as will be described later in the application in FIG. 3e.

The acoustic seal 31 may serve one or more functions. For example, the acoustic seal 31 can function to channel acoustic signals that travel through the acoustic cap channel 25 and acoustic die channel 15 towards the surface of the transducer element 13 via a volume 35 which it seals to prevent leakage of sound pressure laterally between the package 1 and the host substrate 30, to prevent leakage away from the transducer element of any sound pressure incident though the acoustic channel, or ingress of any sound from other sources. In this manner acoustic signals are channeled to what may be referred to as a front volume, relating to an area between the transducer element 13 and the host substrate 30 (with the back volume being the volume on the other side of the transducer, i.e. formed by the die back volume 7, and an optional cap back volume 27 of the cap portion 23).

The acoustic seal 31 may also function to attach the MEMS transducer package 1 to the host substrate 30. If made from conductive material, it may also provide a ground connection between metal connections on the package and metal connections on the host substrate 30. The package 1 may provide a metal pattern, for example a metal ring, to enable such a connection to be made onto the user substrate, The acoustic seal 31 may comprise a compliant, i.e. flexible, conductive or non-conductive, material and/or structure to reduce mechanical coupling of stress between the host substrate 30 and the package 1 and the transducer 13. The seal 31 may comprise a polymer such as silicone or some other type of flexible, i.e. compliant, material such as adhesive rubber etc.

Although not shown in all the diagrams throughout, it is noted that the semiconductor die portion 3 may also comprise integrated electronic circuitry 14.

In the embodiment of FIG. 3a, the acoustic die channel 15 and the acoustic cap channel 25, together with the sealed volume 35 between the MEMS transducer package 1 and the host substrate 30 onto which the MEMS transducer package is mounted, cooperate to provide an acoustic path through which sound or pressure waves can travel from a top surface of the MEMS transducer package to the transducer element 13 (i.e. from the top surface 29 of the cap portion 23, through the acoustic cap channel 25, the acoustic die channel 15 and the volume 35 to the surface (or front volume) of the MEMS transducer element 13).

The embodiment of FIG. 3a has an advantage of providing a compact MEMS transducer package which can be entirely formed by wafer-level processing techniques, for example wherein a first semiconductor wafer is used to fabricate a plurality of semiconductor die portions 3, and a second wafer used to fabricate a plurality of cap portions 23, with the wafers bonded together to form a plurality of MEMS transducer packages, which may then be singulated to form a plurality of MEMS transducer packages. The footprint or lateral external dimensions of the package will then just be that of the semiconductor die portion 3 rather than increased by any surrounding structure. The cap portion 23 may naturally be the same footprint as the die portion 3, since the two portions may be singulated together. Alternatively at least some of the height of some of the perimeter of cap portion 23 may comprise side faces inset from the underlying semiconductor die edges by incorporating trenches etched pre-singulation in a similar way to acoustic die channel 25 to aid the singulation process. The configuration of an "inverted top port", i.e. whereby the MEMS transducer is inverted for a top port entry, can use a larger back volume compared to a traditional top port configuration, and therefore can have an improved frequency and signal-to-noise ratio compared to a traditional top port.

In the example of the top port mounted configuration of FIG. 3a, the acoustic seal 31 comprises a ring structure that encloses or surrounds the transducer element 13 and an opening of the acoustic die channel 15.

Further details of a MEMS transducer package 1 mounted in a top port configuration, and having an acoustic seal 31 as described above, are illustrated in the example of FIG. 3b. In this example the acoustic seal 31 is octagonal in outline, but in other examples it might be other shapes, for example square, circular or some more irregular polygon depending on the layout of other structures on the die. Also shown are pre-soldered lead pads 32a and 32b for connection of the co-integrated amplifier circuitry illustrated thereunder.

Figure 3B:
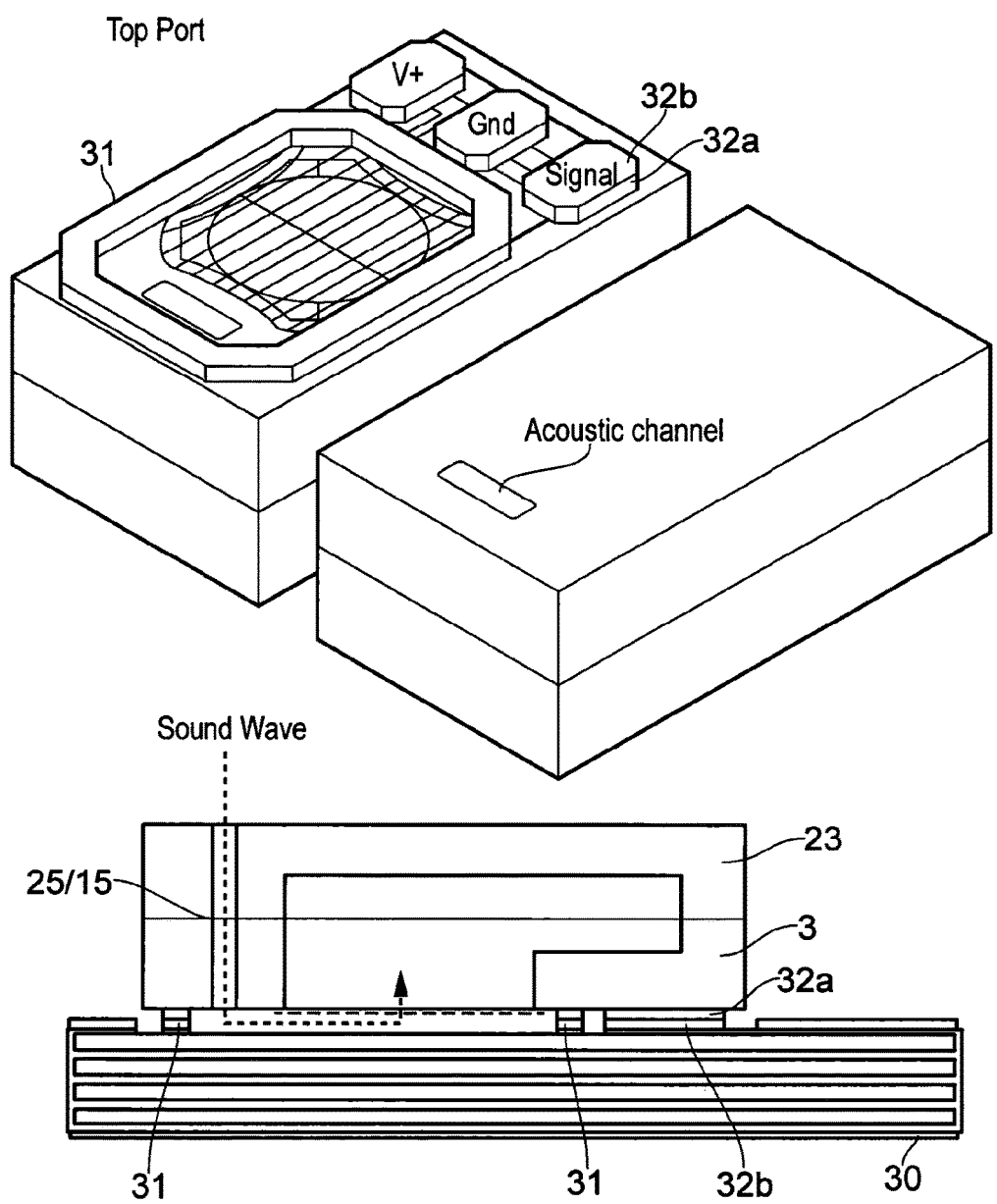
Figure 3C:
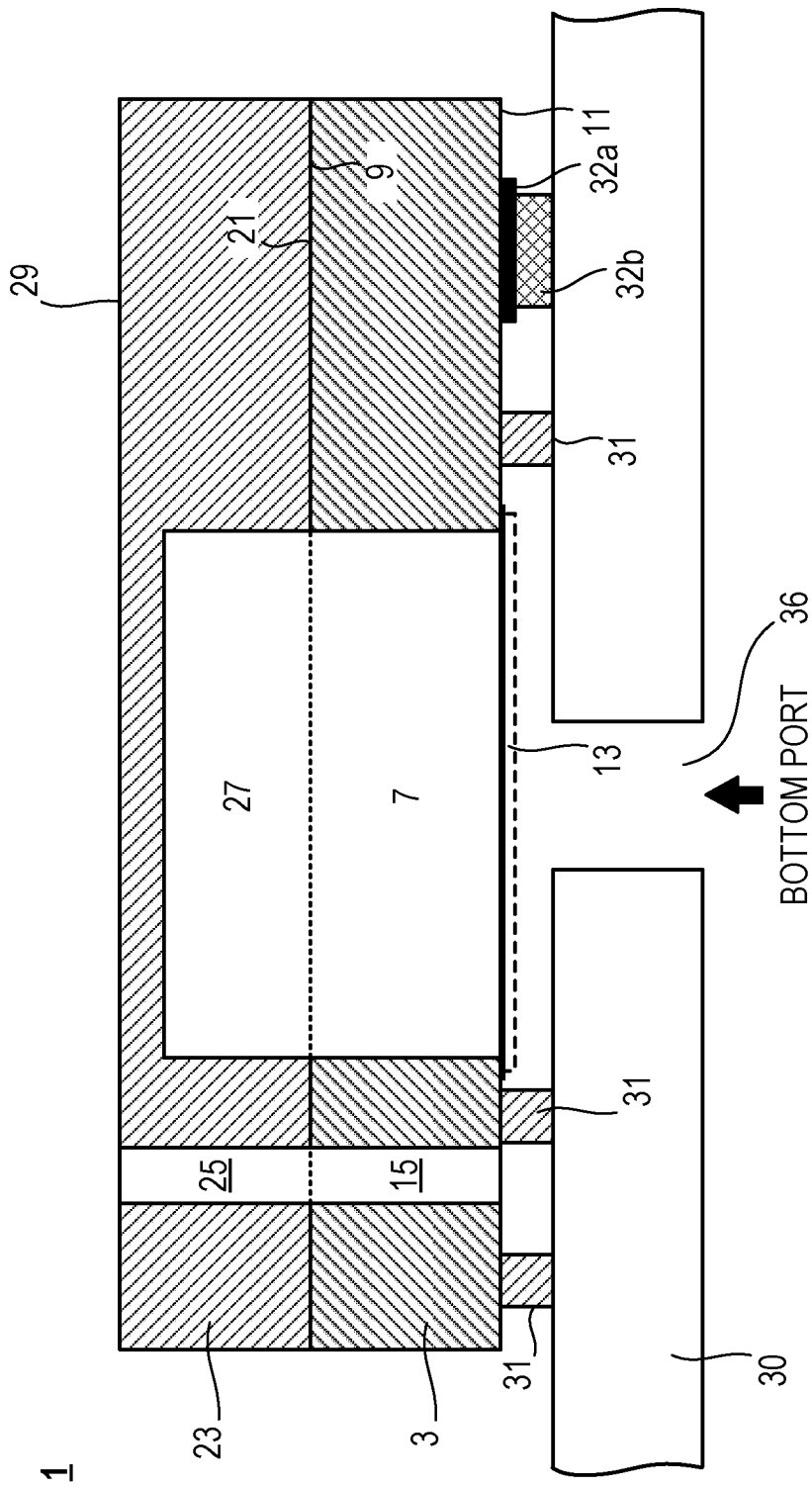
FIG. 3c illustrates an example of the MEMS transducer package of FIG. 2 mounted in another configuration example, referred to as a bottom-port configuration.

FIG. 3c shows an example of a MEMS transducer package 1 which is mounted in what may be referred to as a bottom port mounted configuration, whereby sound is received from a bottom side of the MEMS transducer package, the bottom side of the MEMS transducer package being the side which faces the host substrate 30, and which may comprise solder pads 32a and solder 32b for electrical connection to electrical conductors on the host substrate 30. In the bottom port mounted configuration, the MEMS transducer package 1 is for use with a host substrate 30 that comprises an opening 36 for allowing acoustic signals to reach the transducer element 13.

In the example of FIG. 3c, the MEMS transducer package 1 comprises an acoustic seal ring 31 which is structured to provide a seal between an opening in the acoustic die channel 15 and the transducer element 13. As may be seen more clearly in the perspective view of FIG. 3d, the acoustic seal 31, in this example, encloses the transducer element 13 separately from the opening of the acoustic die channel 15. As such, the transducer element 13 is configured to receive acoustic signals via the aperture 36 in the host substrate 30 and to be acoustically isolated from any acoustic signal in the acoustic channel.

Figure 3D:
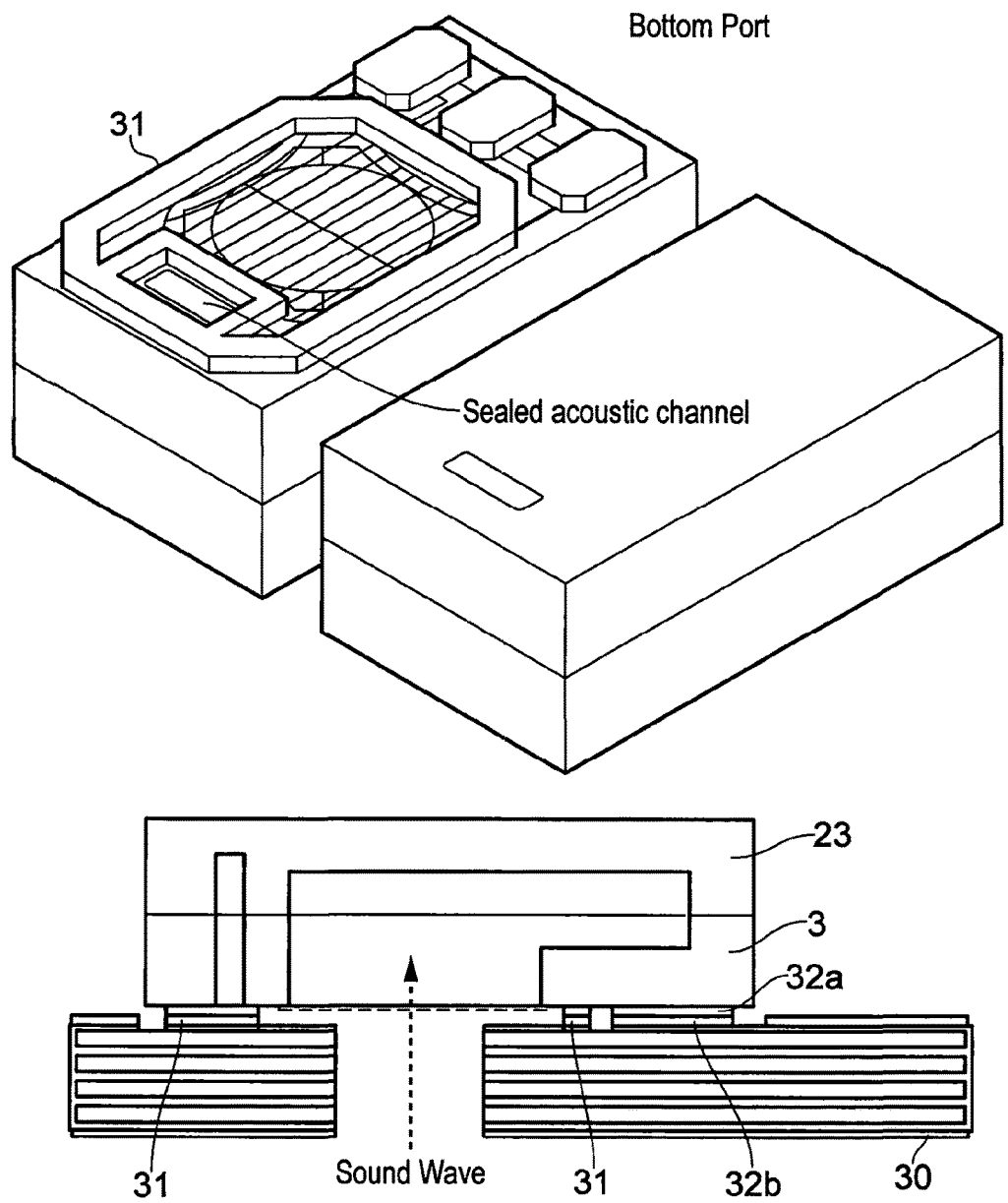
FIG. 3d illustrates a three dimensional view of the example of FIG. 3c.

In another example, the acoustic seal 31 of FIGS. 3c and 3d may be structured such that there is no seal between the acoustic channel and transducer element 13 (i.e. such that the acoustic seal 31 is similar to that of FIGS. 3a and 3b). In such an example, the transducer element receives acoustic signals via the opening 36 in the host substrate 30, and via the acoustic channel (i.e. via the acoustic cap channel 25 and acoustic die channel 15). Such an embodiment provides for the acoustic addition of the two acoustic signals and may be used for a directional microphone.

Thus, it can be seen from the above the same transducer package 1 may be used in a number of different configurations, including a top port configuration such as that illustrated in FIGS. 3a and 3b or in bottom port configuration as illustrated in FIGS. 3c and 3d.

Figure 3E:
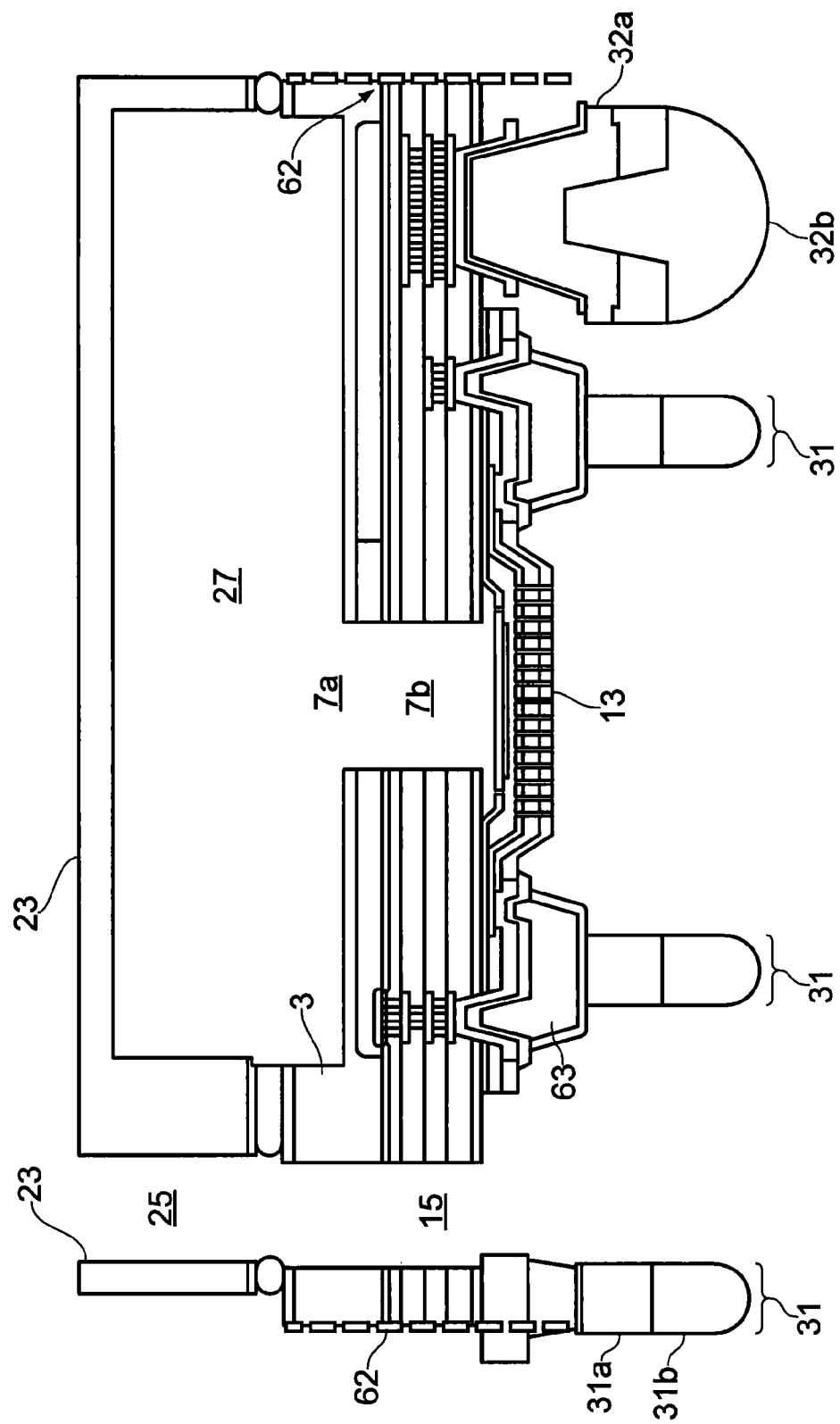
FIG. 3e is a more detailed illustration of a MEMS transducer package of the type shown in FIG. 3d, for mounting in a bottom-port configuration.

FIG. 3e provides a more detailed view of a MEMS transducer package of the type shown in FIGS. 3c and 3d, for mounting in a bottom port configuration. The MEMS transducer package comprises a semiconductor die portion 3 and a cap portion 23. The semiconductor die portion 3 comprises a transducer element 13. A die back volume comprises a first sub-volume 7a and a second sub-volume 7b, and the cap portion comprises a cap back volume 27. The semiconductor die portion 3 comprises an acoustic die channel 15, and the cap portion 23 comprises an acoustic cap channel 25. FIG. 3e also shows in greater detail an example of the acoustic seal ring 31, and the solder pad 32a. In this example the acoustic ring 31 is of the type shown in FIGS. 3c and 3d, such that the acoustic seal 31 encloses the transducer element 13 separately from the opening of the acoustic die channel 15. Therefore, when the MEMS transducer package of FIG. 3e is mounted on a host substrate (not shown), acoustic signals reach the transducer element 13 via an aperture in the host substrate.

It is noted that the MEMS transducer package of FIG. 3e, when adapted for a top port mounting configuration, would not comprise an acoustic seal element between the acoustic channel 15 and transducer element 13.

As can be seen from the example of FIG. 3e, the seal 31 comprises a conductive portion 31b, for example made of solder, which can function to both connect the MEMS transducer package to a substrate, for example using a solder reflow process, and to provide an electrical connection, for example a ground connection, between the MEMS transducer package 1 and a substrate. The acoustic seal 31 may also comprise a resilient material 31a, for example made from a rubber or silicon material, or some other flexible or compliant material, which can help provide mechanical stress relief between the MEMS transducer package 1 and a substrate onto which the package is mounted. In the example of FIG. 3e, the acoustic seal 31 is also shown as being mounted on a structure 63 which contains a buried layer of flexible material, for providing further stress relief.

An example of a lead pad 32 comprising for example a solder pad 32a and solder 32b is also shown in FIG. 3e. The dotted lines 62 in FIG. 3e represent singulation or dicing lines. The die portion 3 may be partially etched in the region of these lines 62 so as to create a stress region which will aid singulation of one transducer package from others on a silicon wafer.

In the examples described above in FIGS. 2, and 3a to 3e, a cross-sectional area of the acoustic die channel 15 and/or a cross-sectional area of the acoustic cap channel 25 is substantially constant along a length of the respective acoustic channel. By substantially constant, it is noted that this may include the cross-sectional area narrowing slightly due to non-uniformity in etching processes.

It is noted, however, that the shapes or profiles of the acoustic die or cap channels 15, 25 may be deliberately changed or varied to suit a particular application, for example to provide a desired acoustic property, or a particular acoustic impedance or filtering characteristic. The shapes may be formed, for example, by profiling an edge of a photo resist layer through photolithography and thermal exposure.

Figure 3F:
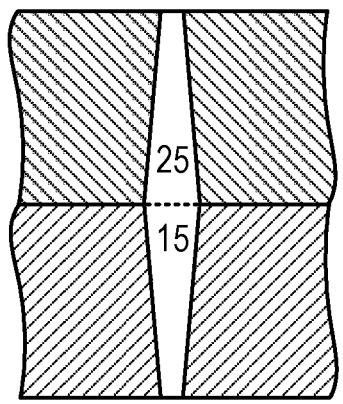
FIGS. 3f to 3i illustrate examples of acoustic channels that may be used in embodiments of the present disclosure.
Figure 3G:
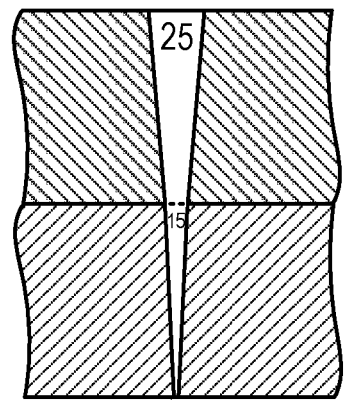
Figure 3H:
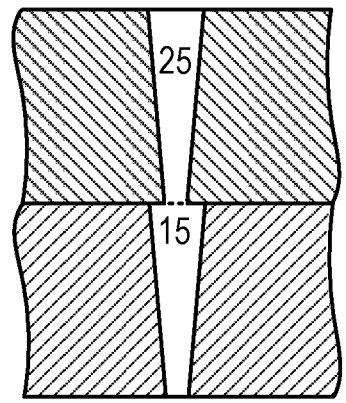
Figure 3I:
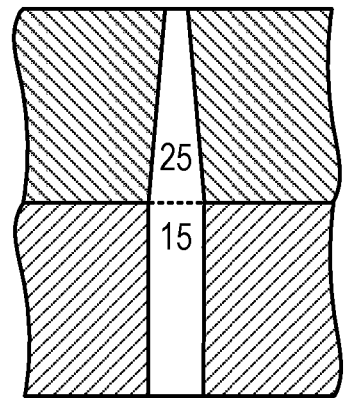

Some examples are shown in FIGS. 3f to 3i. In one embodiment a cross-sectional area of the acoustic die channel 15 and/or a cross-sectional area of the acoustic cap channel 25 vary along a length of the respective acoustic channel. These variations may be formed, for example, using an anisotropic etch. At a boundary where the acoustic die channel 15 and the acoustic cap channel 25 interface, a cross-sectional area of the acoustic die channel 15 may be substantially the same as the cross-sectional area of the acoustic cap channel 25, as shown in FIG. 3f or 3g. In another example, a cross-sectional area of the acoustic die channel 15 may be larger than the cross-sectional area of the acoustic cap channel 25 at a boundary where the two meet, for example as shown in FIG. 3h. In yet another example, a cross-sectional area of the acoustic die channel 15 may be substantially constant along its length, while the cross-sectional area of the acoustic cap channel 25 varies along its length, as shown in FIG. 3i, or vice versa. It is noted that any shape or combination of shapes may be used.

If the acoustic channel is narrow, it will present a high acoustic resistance or acoustic inductance. Thus the channel may be tens of microns in lateral dimensions, and may be at least 100 um in one direction (for example 250 um), or more than 10000 square microns in cross-sectional area orthogonal to the direction of air flow.

It is noted that in the examples described herein, the semiconductor die portion 3 may comprise, for example, a silicon die portion.

It is also noted that in the examples described herein, the cap portion 23 may comprise, for example, a semiconductor or silicon cap portion, or a non-silicon laminated wafer, or a moulded cap wafer, or a plastic cap portion, or a film layer, or any other form of material. A cap portion made from semiconductor or silicon has an advantage of allowing the cap portion to be formed using wafer-level processing techniques similar to those used for manufacturing the semiconductor die portion, which means that the entire MEMS transducer package can be manufactured and assembled at the same processing site, with the cost advantages of wafer-level batch processing and other advantages such as matching the coefficients of thermal expansion to avoid thermally induced stresses.

Figure 4:
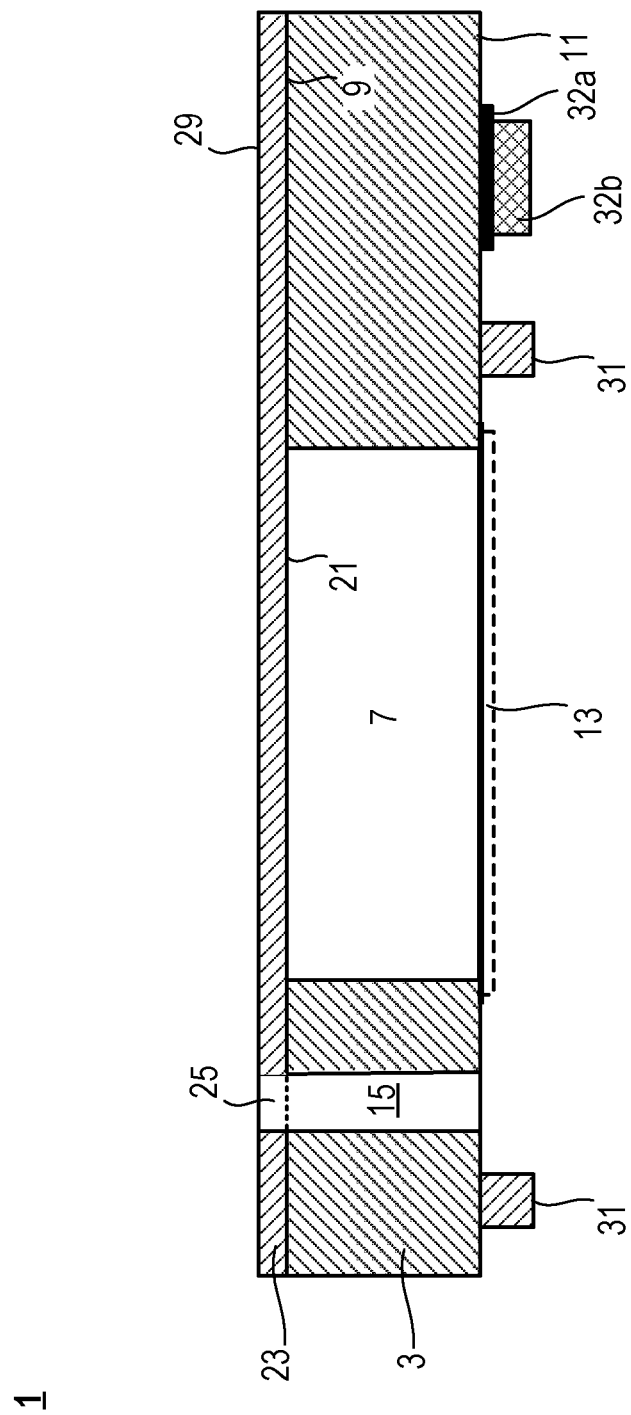
FIG. 4 illustrates an example of a MEMS transducer package according to an embodiment of the present disclosure.

Referring to FIG. 4, according to one embodiment, the cap portion 23 comprises a thin film. This film may be a die attach film, DAF, which may be elastic and may be stretched during the package singulation process to assist the separation of the structures. Alternatively it may be some other suitable film material. The film 23 comprises an aperture 25 which forms an acoustic cap channel. This embodiment, although not having a cap back volume, has the advantage of providing a low cost MEMS transducer package. Such an embodiment may be used, for example, where low cost microphone devices are required, or where the size of a back volume is not a significant factor on the operation of the MEMS transducer, or for space-sensitive applications where the reduced overall height is important.

Figure 5:
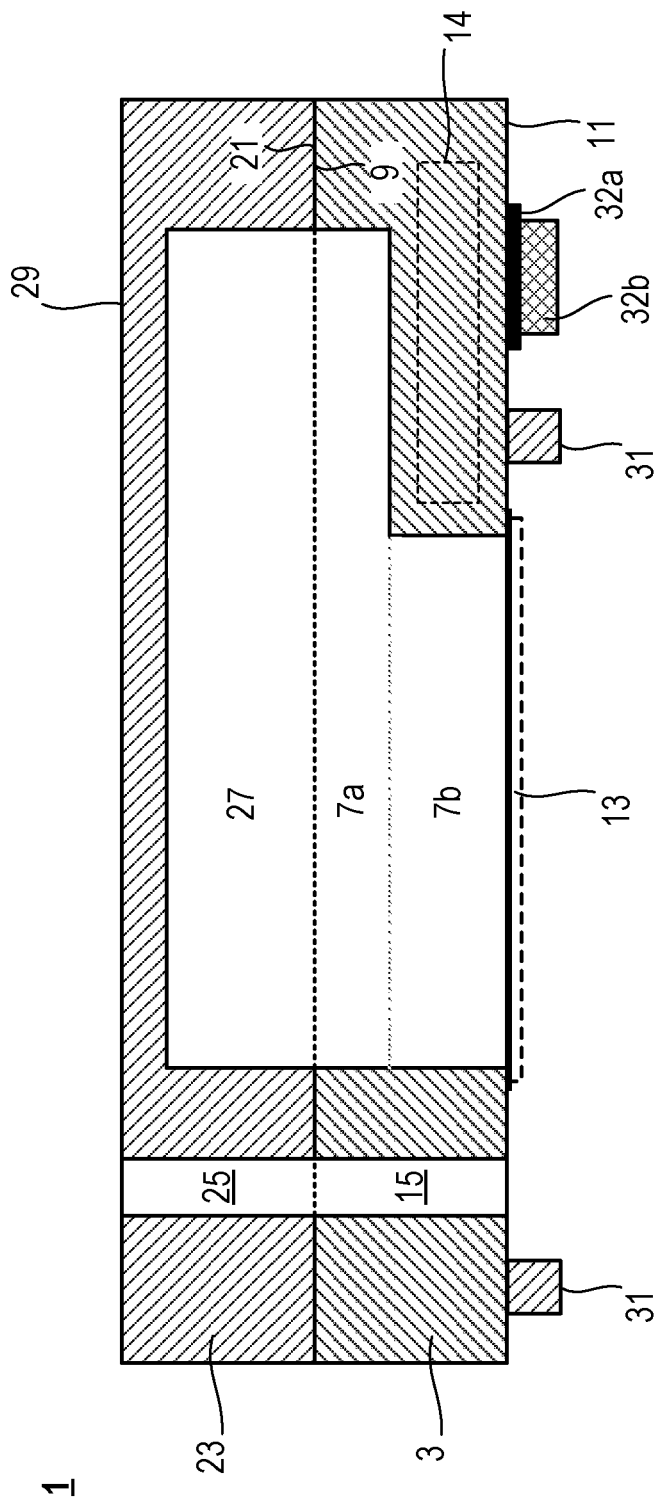
FIG. 5 illustrates an example of a MEMS transducer package according to an embodiment of the present disclosure.

Referring to FIG. 5, according to one embodiment, a die back volume 7 comprises a stepped back volume. For example, the stepped back volume may comprise at least one discontinuity along a sidewall of the back volume, between the first surface 9 and the second surface 11 of the semiconductor die portion 3.

In one example, the stepped back volume comprises a first sub-volume 7a adjacent to the first surface 9 of the semiconductor die portion 3 and a second sub-volume 7b adjacent to the transducer 13. The first and second sub-volumes 7a, 7b may abut as shown. A lateral dimension of the first sub-volume 7a may be greater than a corresponding lateral dimension of the second sub-volume 7b. The lateral dimension of the second sub-volume may correspond to that of the transducer 13, whereas the lateral dimension of the first sub-volume is not so constrained.

Although the embodiment of FIG. 5 shows the stepped sidewall extending in one lateral direction, it is noted that the stepped sidewall may also extend in another lateral direction.

Furthermore, although the respective sub-volumes are shown as comprising sidewalls that are substantially orthogonal to the first surface 9 of the semiconductor die portion 3, it is noted that the sidewalls of any sub-volume portion may be sloped with respect to the first surface 9 of the semiconductor die portion 3.

The use of a stepped back volume thus has an advantage of enabling the overall volume of the back volume to be increased for a given thickness between the first surface 9 and second surface 11 for a given size of transducer. It is noted that one or more further stepped portions may be provided.

In some embodiments, the semiconductor die portion 3 may comprise integrated electronic circuitry 14 for operating the MEMS transducer element 13. In one example, at least part of the integrated electronic circuitry 14 (indicated by the dotted rectangle) may be positioned in a thickness of the semiconductor die portion 3 bounded by at least part of a first sub-volume 7a of the stepped die back volume and the second surface 11 of the semiconductor die portion 3. In an embodiment comprising integrated electronic circuitry, the semiconductor die portion 3 may further comprise one or more lead pads 32a and solder 32b, for providing electrical connection between the integrated electronic circuitry and other electronic circuitry external to the MEMS transducer package.

Figure 6:
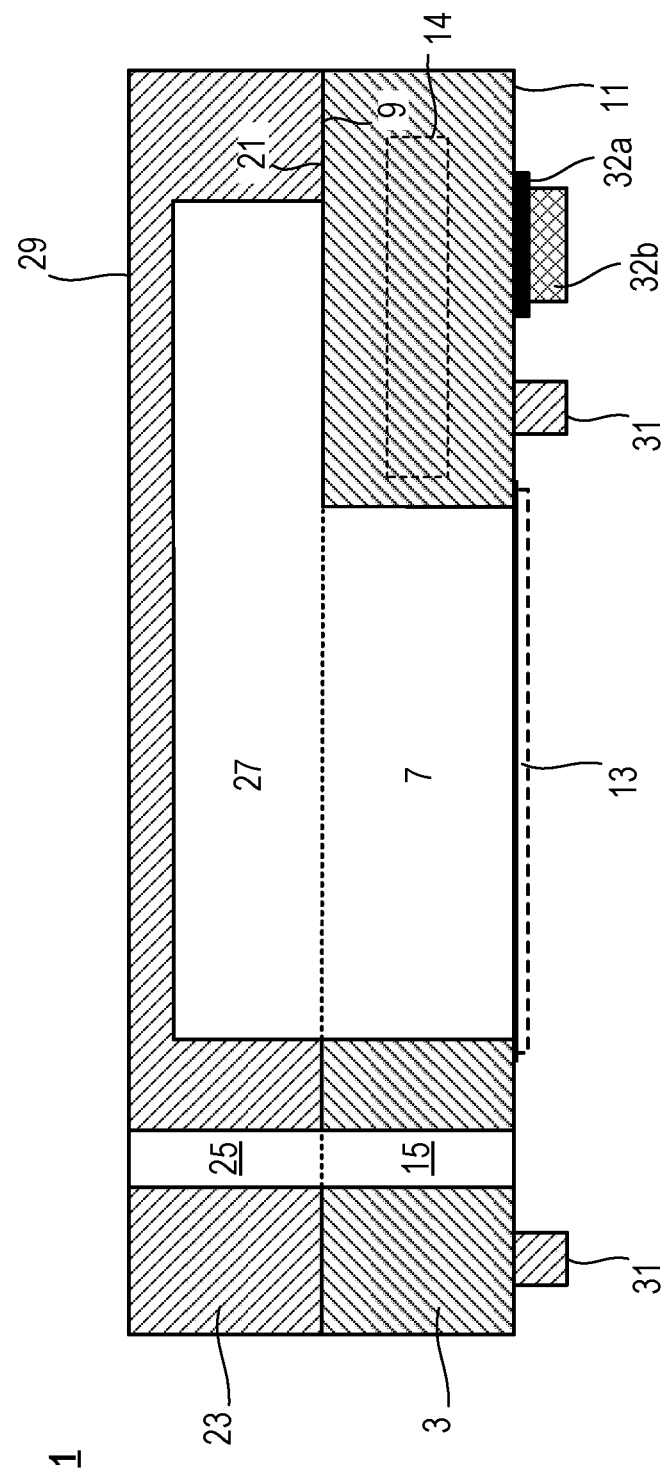
FIG. 6 illustrates an example of a MEMS transducer package according to an embodiment of the present disclosure.
Figure 7:
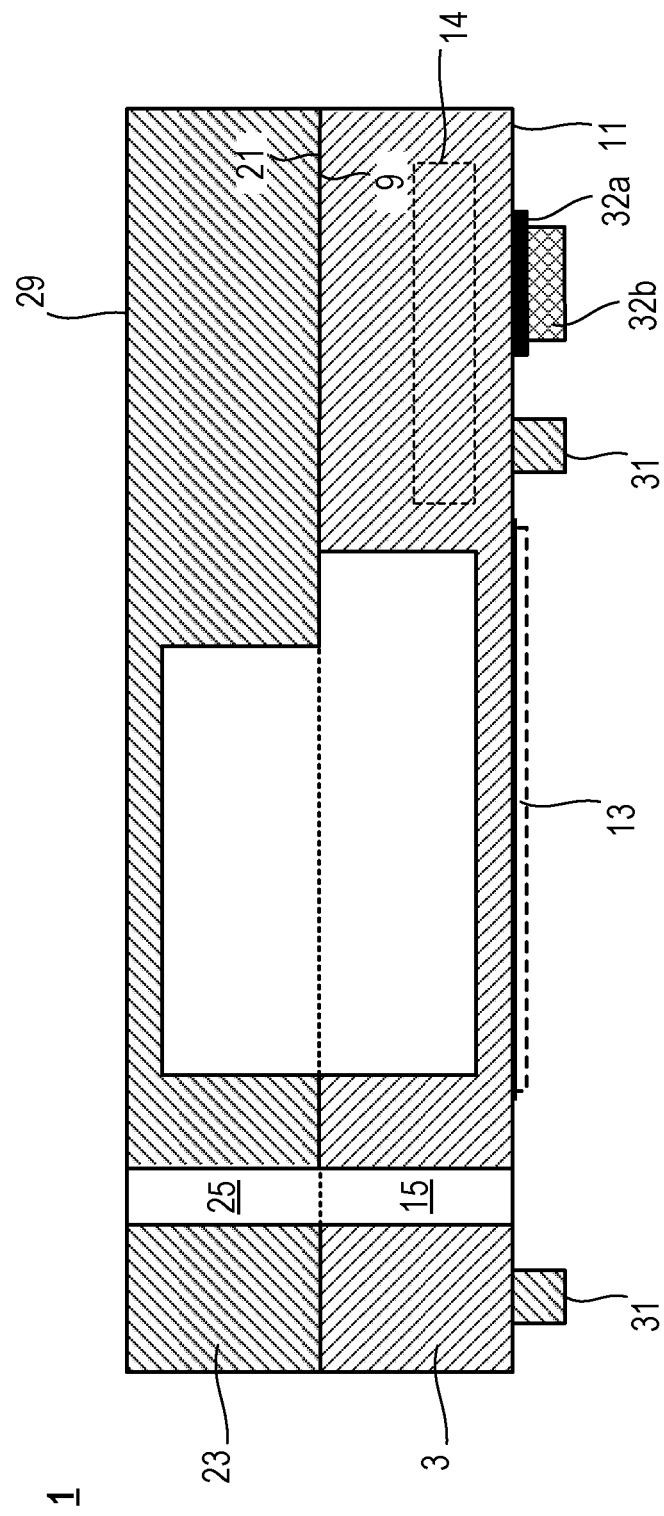
FIG. 7 illustrates an example of a MEMS transducer package according to an embodiment of the present disclosure.

In one example, a cross-sectional area of the die back volume 7 and a cross-sectional area of the cap back volume 27 are substantially the same at a plane where they meet. In other examples, a cross-sectional area of the die back volume 7 is smaller than the cross-sectional area of the cap back volume 27 at a plane where they meet, for example as shown in FIG. 6. In other examples a cross-sectional area of the die back volume 7 is greater than the cross-sectional area of the cap back volume 27 at a plane where they meet, for example as shown in FIG. 7.

It is noted that a cap portion 23 may also comprise a stepped cap back volume 27. The stepped cap back volume 27 of the cap portion 23 may comprise any of the characteristics noted above relating to the sub-volumes 7a and 7b of the stepped die back volume 7. In an embodiment having a moulded cap portion, this may provide a greater design freedom compared to a silicon cap portion.

It is noted that a stepped die back volume and stepped cap back volume may be used in any of the embodiments, and in any combination of respective structures, described herein that comprise a back volume.

Figure 8:
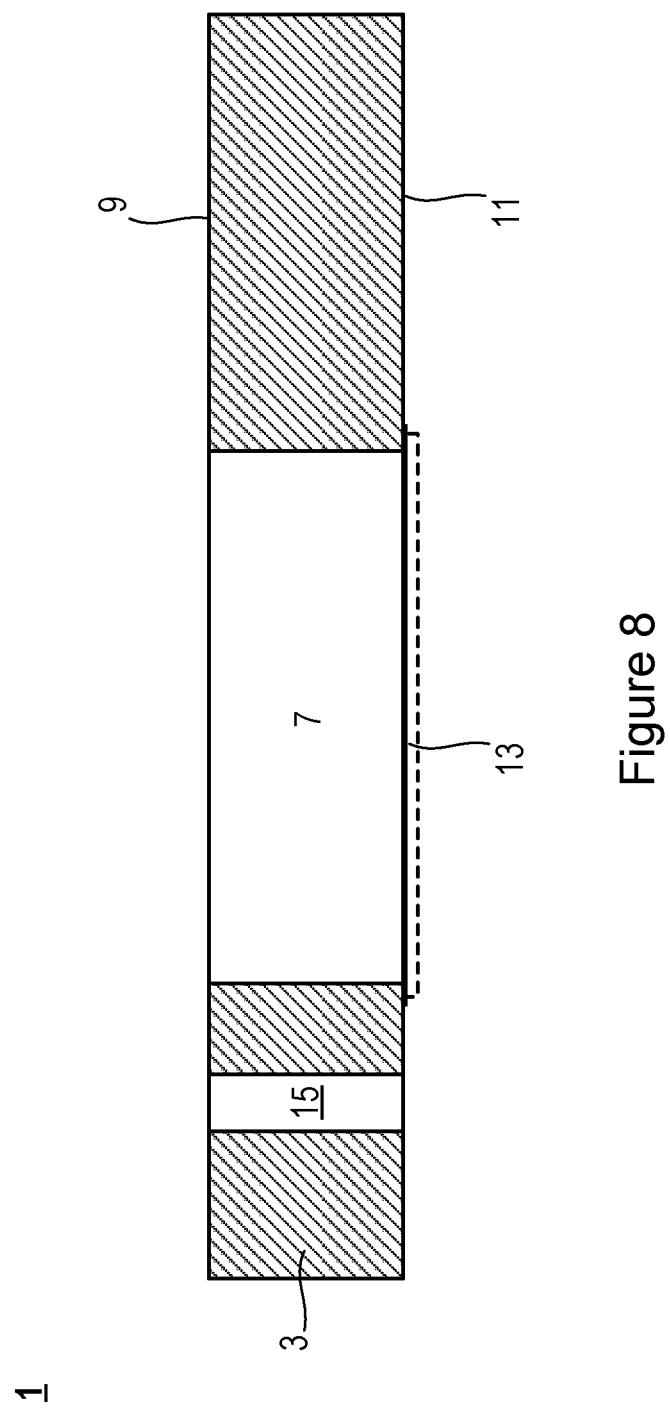
FIG. 8 illustrates an example of a semiconductor die portion according to an embodiment of the present disclosure, for use in a MEMS transducer package.

FIG. 8 shows a cross section view of an example of a semiconductor die portion 3 according to an embodiment in this disclosure, for use in a MEMS transducer package 1. In particular, FIG. 8 shows an example of a semiconductor die portion 3 that may be used in conjunction with a cap portion 23 to provide a MEMS transducer package 1. The semiconductor die portion 3 comprises a thickness bounded by a first surface 9 and an opposite second surface 11. The second surface 11 incorporates a transducer element 13 (for example a microphone comprising a membrane and a back-plate). A die back volume 7 extends through the thickness of the semiconductor die portion 3 between the first surface 9 and the transducer element 13. An acoustic die channel 15 extends through the thickness of the semiconductor die portion 3 between the first surface 9 and the second surface 11. The acoustic die channel 15 provides an acoustic path between the first and second surfaces 9, 11 of the semiconductor die portion 3.

In the examples described above sound or pressure waves enter through a top surface of the MEMS transducer package (i.e. through an opening in the first surface 29 of the cap portion 23), and exit a bottom surface of the MEMS transducer package (i.e. through an opening in the second surface 11 of the semiconductor die portion 3).

In other embodiments which will be described below, sound or pressure waves enter through a side surface of the MEMS transducer package (for example through a side surface which is substantially orthogonal to the first surface 9 of the semiconductor die portion 3, and/or first surface 29 of the cap portion 23), and exit a bottom surface of the MEMS transducer package (i.e. through an opening in the second surface 11 of the semiconductor die portion 3). It is noted that the side surface may also be non-orthogonal to the first surface 9.

As will be described below, the side acoustic channel may be wholly formed in the semiconductor die portion 3, partly formed in the semiconductor die portion 3 and partly formed in the cap portion 23, or wholly formed in the cap portion 23.

Side Port Embodiments

FIG. 9 shows a cross section view of an example of a MEMS transducer package 1 according to another embodiment. In particular, FIG. 9 shows an example of a semiconductor die portion 3 that may be used in conjunction with a cap portion 23 to provide a MEMS transducer package having a side port. The semiconductor die portion 3 comprises a thickness bounded by a first surface 9 and an opposite second surface 11. The second surface 11 of the semiconductor die portion 3 incorporates a transducer element 13 (for example a microphone comprising a membrane and back-plate). A die back volume 7 extends through the thickness of the semiconductor die portion 3 between the first surface 9 and the transducer element 13. An acoustic die channel 15 extends through the thickness of the semiconductor die portion 3 between the first surface 9 and the second surface 11. The acoustic die channel 15 provides an acoustic path between the first and second surfaces 9, 11 of the semiconductor die portion 3.

The acoustic die channel 15 comprises a first portion 15a that extends through the thickness of the semiconductor die portion 3 to provide an acoustic path between the first surface 9 and the second surface 11 of the semiconductor die portion 3, and a second portion 15b which extends substantially parallel to the first surface 9 of the semiconductor die portion 3.

The first portion 15a and the second portion 15b cooperate to provide an acoustic path between a first opening 6 and a second opening 8, the first opening 6 formed by the first portion 15a in the second surface 11 of the semiconductor die portion 3, and the second opening 8 formed by the second portion 15b in a side surface 10 of the semiconductor die portion 3.

In the example of FIG. 9, the second portion 15b of the acoustic die channel 15 breaches the first surface 9 to form an opening in the first surface 9 of the semiconductor die portion 3. The second portion 15b may be formed, for example, by etching from the first surface 9 into the thickness of the semiconductor die portion 3.

The MEMS transducer package of FIG. 9 further comprises a cap portion 23 comprising a thickness bounded by a first surface 29 and an opposite second surface 21, wherein the second surface 21 of the cap portion 23 abuts with the first surface 9 of the semiconductor die portion 3. Although not shown, the semiconductor die portion 3 and the cap portion 23 may be bonded together, for example using an adhesive or other techniques as generally known in the art of wafer-to-wafer bonding.

In the example of FIG. 9, no acoustic cap channel is provided in the cap portion 23. Instead, this embodiment relies on the semiconductor die portion 3 to provide the side port entry.

The example of FIG. 9 shows the cap portion 23 comprising a cap back volume 27, although it is noted that the cap back volume 27 may be omitted if desired. As mentioned above, the example of FIG. 9 may comprise a stepped die back volume and/or a stepped cap back volume, and/or integrated electronic circuitry, if required by a particular application.

Figure 10A:
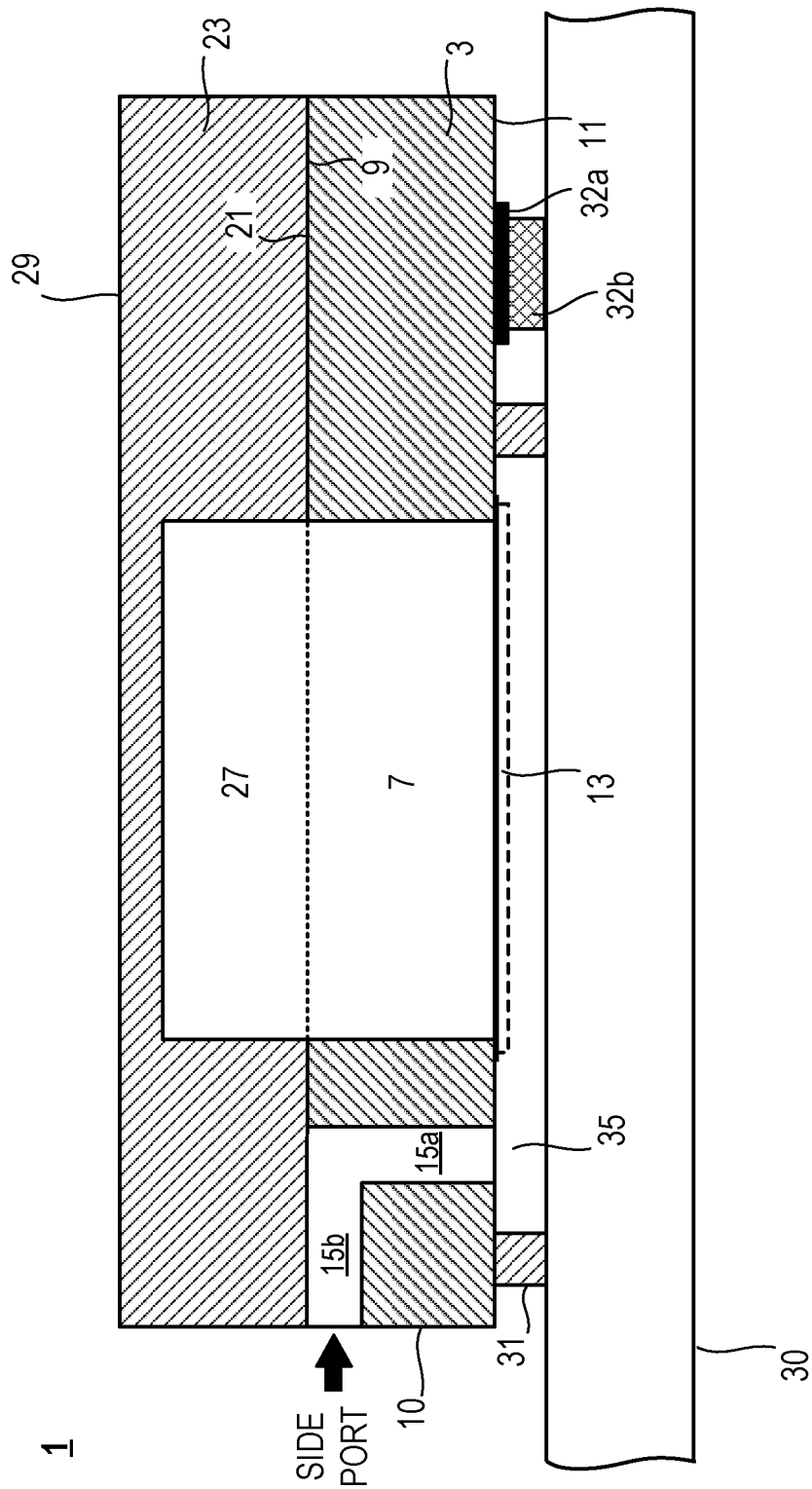
FIG. 10a illustrates an example of the MEMS transducer package of FIG. 9 mounted in one configuration example.

FIG. 10a shows an example of a MEMS transducer package 1 of the type shown in FIG. 9 mounted onto a host substrate 30, for example a printed circuit board (PCB) onto which the MEMS transducer package 1 is mounted during use (for example a PCB within a mobile phone or other device). This example is similar to that of FIG. 3a, but whereby the MEMS transducer package 1 comprises a side port rather than a top port. The MEMS transducer package 1 is shown as comprising an acoustic seal 31.

The embodiment of FIG. 10a is mounted to a host substrate 30 such that a top side of the MEMS transducer package (i.e. the first surface 29 of the cap portion 23) faces away from the host substrate 30, while a bottom side of the MEMS transducer package (i.e. the second surface 11 of the semiconductor die portion) faces the host substrate 30, and may comprise solder pads 32a and solder 32b for electrical connection to electrical conductors on the host substrate 30. The configuration of FIG. 10a may be referred to as a side port embodiment, since acoustic signals enter the MEMS transducer package through a side surface 10 of the MEMS transducer package. It will be appreciated by those skilled in the art that the host substrate 30 may have the same or substantially the same footprint, i.e. area, as the package 1 and may itself be mounted on a second host substrate (not illustrated) by suitable connections. This second host substrate may comprise a PCB, whether rigid or flexible, for example.

In the embodiment of FIG. 10a the acoustic die channel 15, together with a volume 35 between the MEMS transducer package 1 and the host substrate 30 onto which the MEMS transducer package is mounted, cooperate to provide an acoustic path through which sound or pressure waves can travel from a side surface of the MEMS transducer package to the transducer element 13 (i.e. from the side surface 10 of the semiconductor die portion 3, through the acoustic die channel 15 and the volume 35 to the surface of the MEMS transducer element 13).

In the example of the side port configuration of FIG. 10a, an acoustic seal 31 is structured such that the seal encloses the transducer element 13 and an opening of the acoustic die channel 15 (similar to that shown in the perspective view of FIG. 3b). Acoustic signals travel through the semiconductor die channel 15 towards the surface of the transducer element 13 via a volume 35 which the acoustic seal 31 seals to prevent leakage of sound pressure laterally between the package 1 and the host substrate 30, to prevent leakage away from the transducer element of any sound pressure incident though the acoustic channel, or ingress of any sound from other sources. The acoustic seal 31 may have other properties as noted above.

The embodiment of FIG. 10a has an advantage of providing a compact MEMS transducer package which can be entirely formed from wafer scale monolithic processing techniques, for example wherein a first semiconductor wafer is used to fabricate a plurality of semiconductor die portions 3, and a second wafer used to fabricate a plurality of cap portions 23, with the wafers bonded together to form a plurality of MEMS transducer packages, which may then be singulated to form a plurality of MEMS transducer packages.

Figure 10B:
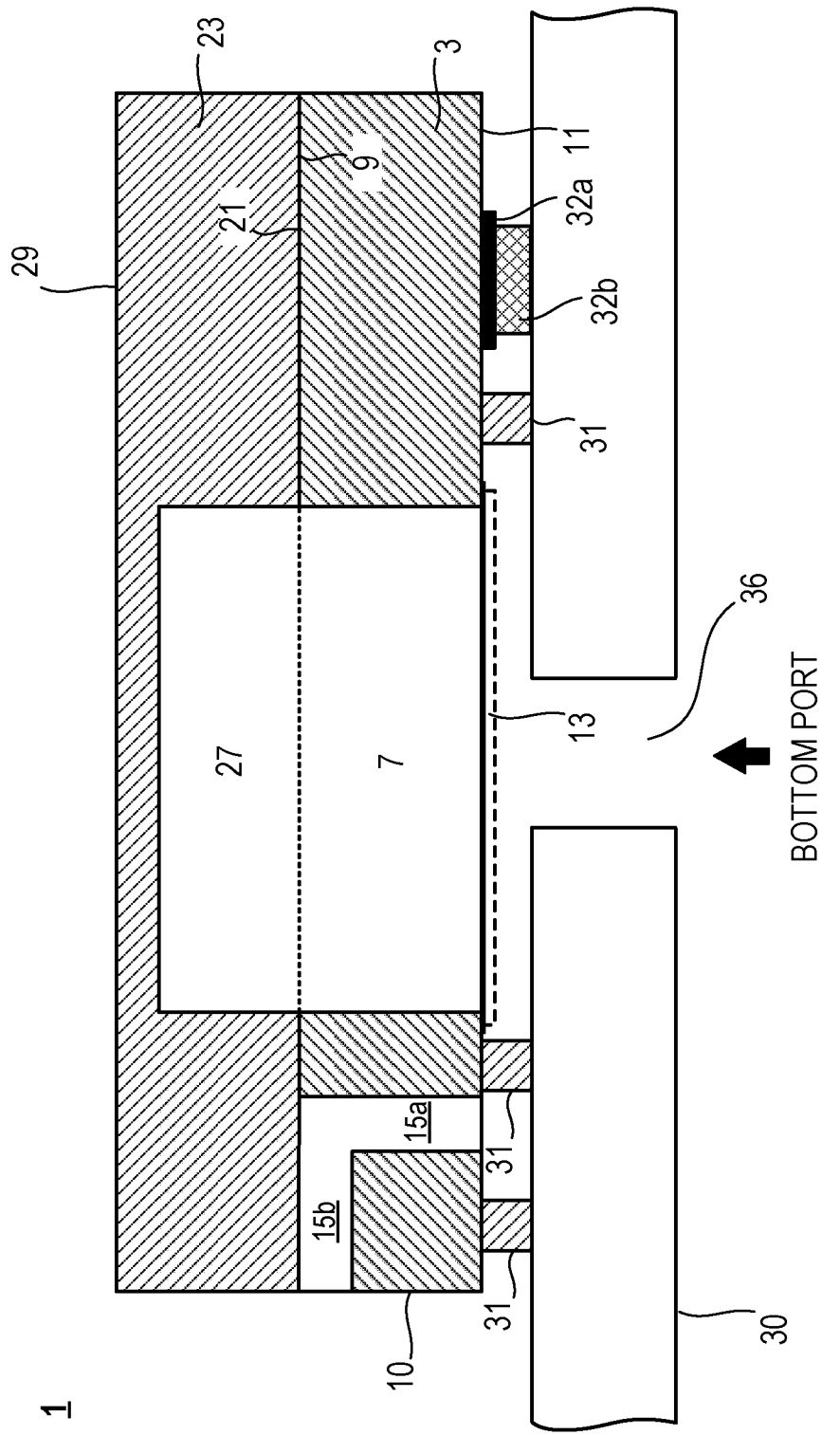
FIG. 10b illustrates an example of the MEMS transducer package of FIG. 9 mounted in another configuration example.

FIG. 10b shows an example of a MEMS transducer package 1 similar to that of FIG. 10a, but whereby the MEMS transducer package is mounted in a bottom port mounted configuration, whereby sound is received from a bottom side of the MEMS transducer package (the bottom side of the MEMS transducer package being the side which faces the host substrate 30, and which may comprise solder pads 32a and solder 32b for electrical connection to electrical conductors on the host substrate 30). In the bottom port mounted configuration, the MEMS transducer package 1 is for use with a host substrate 30 that comprises an opening 36 for allowing sound or pressure waves to reach the transducer element 13.

In the example of FIG. 10b, the MEMS transducer package 1 comprises an acoustic seal 31 which is structured to provide a seal between an opening in the acoustic die channel 15 and transducer element. As seen more clearly in the perspective view of FIG. 3d above, the acoustic seal 31, in this example, encloses the transducer element 13 separately from the opening of the acoustic die channel 15. As such, the transducer element 13 is configured to receive acoustic signals via the aperture 36 in the host substrate 30 and to be acoustically isolated from any acoustic signal in the acoustic channel. An acoustic seal 31 of this nature can be used if a common semiconductor die portion 3 is to be advantageously used in different mounting configurations.

As a further alternative, a seal structure similar to that of FIG. 10a can be used in a bottom port configuration, but wherein the opening in the acoustic die channel is sealed, for example, by sealing the opening in the second surface 11 prior to mounting the MEMS transducer package onto the host substrate 30, or sealing the side port opening either prior to mounting the MEMS transducer package, or after the MEMS transducer package has been mounted (i.e. because this side opening is still accessible afterwards).

In another example, an acoustic seal between the acoustic die channel 15 and the transducer 13 may be omitted, and without providing any other form of sealing to the acoustic die channel 25 as mentioned in the paragraph above, in which case the transducer element receives acoustic signals via the opening 36 in the host substrate 30, and via the acoustic channel (i.e. via the side port formed by the acoustic die channel 15). Such an embodiment provides for the acoustic addition of the two acoustic signals and may be used for a directional microphone.

Thus the same transducer package 1 may be used in either the top port configuration such as illustrated in FIG. 10a or in bottom port configuration as illustrated in FIG. 10b.

In the examples of FIGS. 10a and 10b, a cross-sectional area of the acoustic die channel 15 is substantially constant along a length of the acoustic channel. By substantially constant, it is noted that this may include the cross-sectional area narrowing slightly due to non-uniform etching processes. It is noted, however, that the shape or profile of the acoustic die channel 15 may be changed or varied to suit a particular application.

Figure 11:
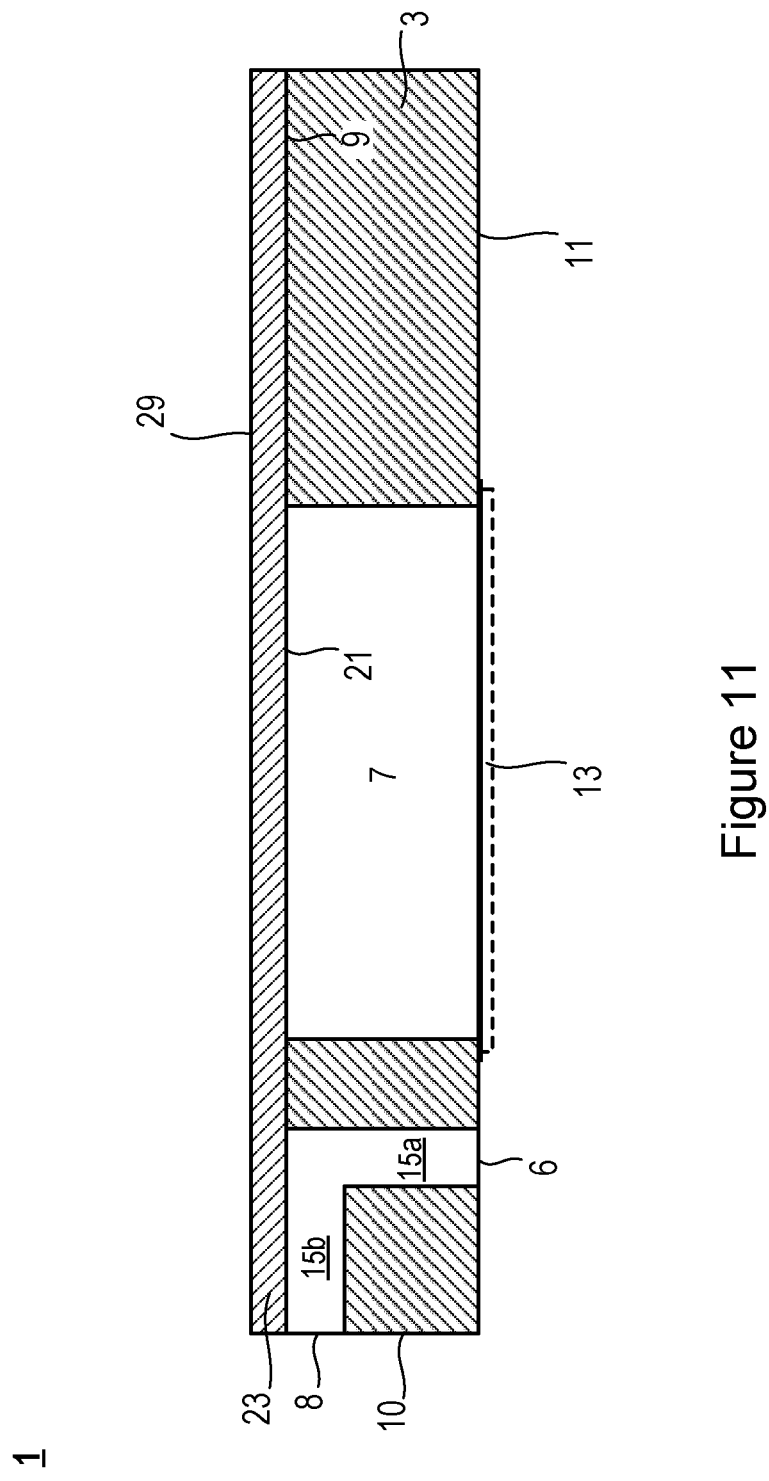
FIG. 11 illustrates an example of a MEMS transducer package according to an embodiment of the present disclosure.

FIG. 11 shows an example of a MEMS transducer package comprising a semiconductor die portion 3 as described above in FIGS. 9, 10a and 10b, but whereby the cap portion 23 comprises a thin film. This thin film may be a die attach film, DAF, which may be elastic and may be stretched during the package singulation process to assist the separation of the structures. Alternatively it may be some other suitable film material. This embodiment, although not having a cap back volume, has the advantage of providing a low cost MEMS transducer package. Such an embodiment may be used, for example, where low cost microphone devices are required, or where the size of a back volume is not a significant factor on the operation of the MEMS transducer, or for space-sensitive applications where the reduced overall height is important.

Figure 12:
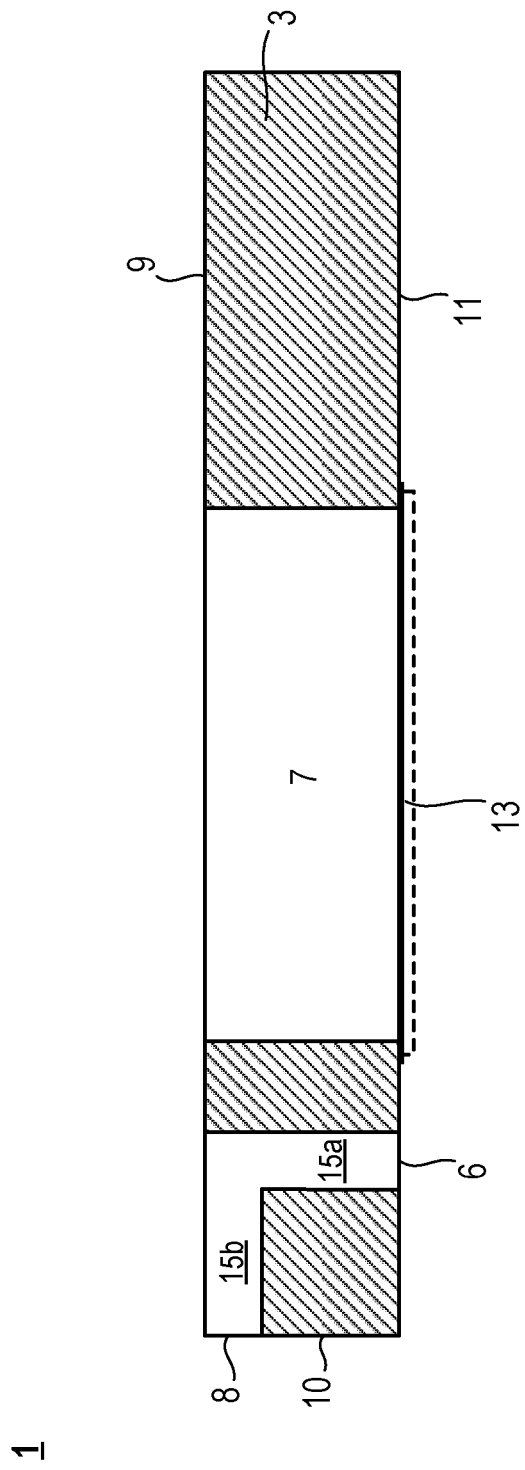
FIG. 12 illustrates an example of a semiconductor die portion according to an embodiment of the present disclosure, for use in a MEMS transducer package.

FIG. 12 shows an example of a semiconductor die portion 3 according to an embodiment disclosed herein, for use in a MEMS transducer package 1, for example as shown above in FIGS. 9 to 11. The semiconductor die portion 3 comprises a thickness bounded by a first surface 9 and an opposite second surface 11. The second surface 11 of the semiconductor die portion 3 incorporates a transducer element 13 (for example a microphone comprising a membrane and back-plate). A die back volume 7 extends through the thickness of the semiconductor die portion 3 between the first surface 9 and the transducer element. An acoustic die channel 15 comprises a first portion 15a that extends through the thickness of the semiconductor die portion 3 to provide an acoustic path between the first surface 9 and the second surface 11 of the semiconductor die portion 3, and a second portion 15b which extends substantially parallel to the first surface 9 of the semiconductor die portion 3. The first portion 15a and the second portion 15b cooperate to provide an acoustic path between a first opening 6 and a second opening 8, the first opening 6 formed by the first portion 15a in the second surface 11 of the semiconductor die portion 3, and the second opening 8 formed by the second portion 15b in a side surface 10 of the semiconductor die portion 3.

Figure 13:
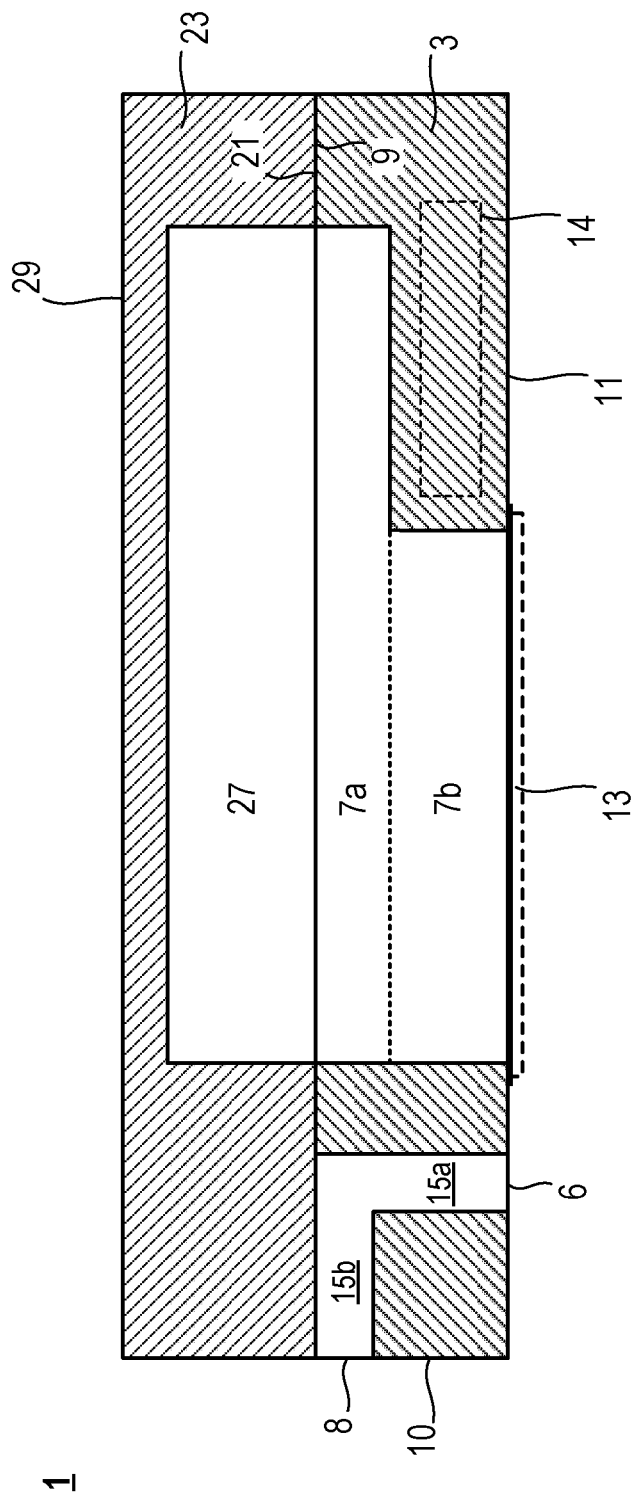
FIG. 13 illustrates an example of a MEMS transducer package according to an embodiment of the present disclosure.

Referring to FIG. 13, according to one embodiment, a die back volume 7 of a side port embodiment may comprise a stepped back volume as described in some of the top port embodiments. For example, the stepped back volume may comprise at least one discontinuity along a sidewall of the die back volume, between the first surface 9 and the second surface 11 of the semiconductor die portion 3.

As before, the stepped back volume may comprise a first sub-volume 7a adjacent to the first surface 9 of the semiconductor die portion 3 and a second sub-volume 7b adjacent to the transducer element 13. The two sub-volumes 7a, 7b may abut as shown. A lateral dimension of the first sub-volume 7a may be greater than a corresponding lateral dimension of the second sub-volume 7b. The lateral dimension of the second sub-volume may correspond to that of the transducer 13, whereas the lateral dimension of the first sub-volume is not so constrained.

In some side port embodiments, the semiconductor die portion 3 may comprise integrated electronic circuitry 14 for operating the MEMS transducer element 13. In one example, at least part of the integrated electronic circuitry 14 may be positioned in a thickness of the semiconductor die 3 bounded by at least part of a first sub-volume 7a of the die back volume and the second surface 11 of the semiconductor die portion 3, as illustrated by the dotted lines in FIG. 13.

In one example, a cross-sectional area of the die back volume 7 and a cross-sectional area of the cap back volume 27 are substantially the same at a plane where they meet. In other examples, a cross-sectional area of the die back volume 7 is smaller than the cross-sectional area of the cap back volume 27 at a plane where they meet. In other examples a cross-sectional area of the die back volume 7 is greater than the cross-sectional area of the cap back volume 27 at a boundary where they interface.

It is noted that a cap portion 23 of a side port embodiment may also comprise a stepped cap back volume 27. The stepped cap back volume 27 of the cap portion 23 may comprise any of the characteristics noted above relating to the sub-volumes 7a and 7b of the stepped die back volume 7.

Figure 14:
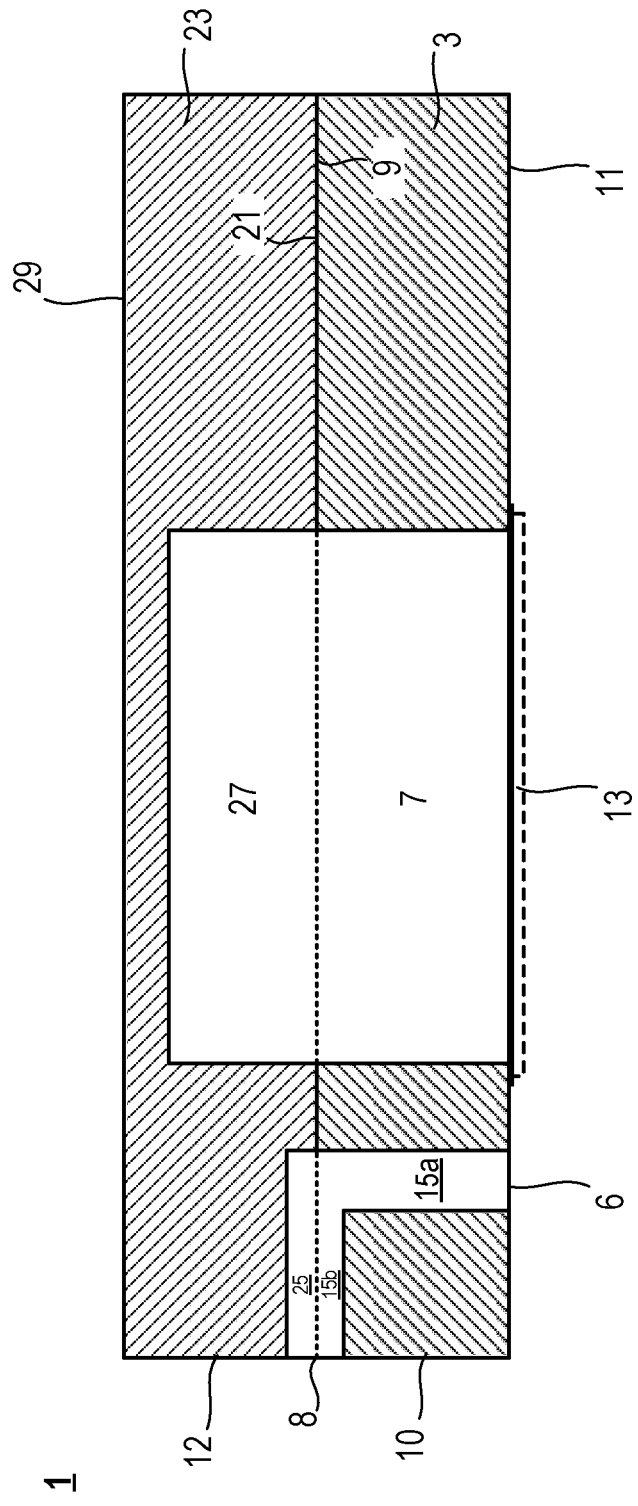
FIG. 14 illustrates an example of a MEMS transducer package according to an embodiment of the present disclosure.

FIG. 14 shows an example of an embodiment wherein the cap portion 23 comprises an acoustic cap channel 25. The acoustic cap channel 25 may extend substantially parallel to the second surface 21 of the cap portion 23. In FIG. 14, the acoustic cap channel 25 interfaces with the second portion 15b of the acoustic die channel 15 to provide an acoustic path between a first opening 6 formed in the second surface of the semiconductor die portion 3 and a second opening 8 formed in a side surface 10, 12 of the transducer package.

Thus, in the embodiment of FIG. 14, the side port is formed partly in the semiconductor die portion 3 and partly in the cap portion 23. Therefore, the second opening 8 is partly formed in a side surface 10 of the semiconductor die portion 3 and partly formed in a side surface 12 of the cap portion 23.

It is noted that although FIG. 14 shows the side port being equally distributed in the semiconductor die portion 3 and the cap portion 23, the side port may be formed to a greater extent in either of the semiconductor die portion 3 or cap portion 23.

Figure 15:
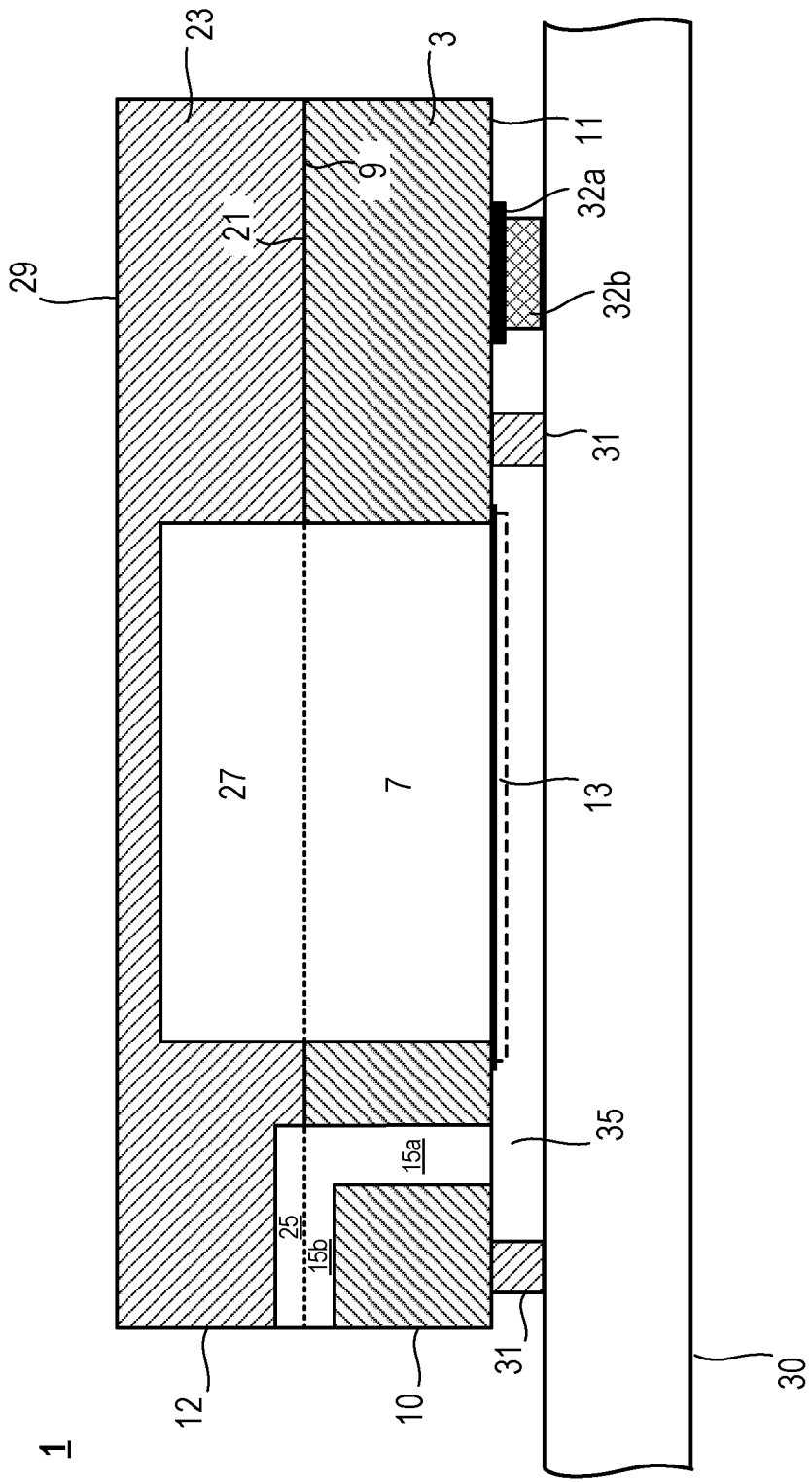
FIG. 15 illustrates an example of the MEMS transducer package of FIG. 14 mounted in one configuration example.

FIG. 15 shows an example of the MEMS transducer package 1 of FIG. 14 being mounted onto a host substrate 30, for example a printed circuit board (PCB) onto which the MEMS transducer package 1 is mounted during use (for example a PCB within a mobile phone or other device). This example is similar to that of FIG. 10a, but whereby the MEMS transducer package 1 comprises a side port that is partly formed in the semiconductor die portion 3 and partly formed in the cap portion 23. The acoustic channel, comprising the acoustic cap channel 25 and the acoustic die channel 15 (which in turn comprises the first portion 15a and second portion 15b), together with volume 35 between the MEMS transducer package 1 and the host substrate 30 onto which the MEMS transducer package is mounted, cooperate to provide an acoustic path through which sound or pressure waves can travel from a side surface of the MEMS transducer package to the transducer element 13, via the volume 35. The embodiment of FIG. 14 may also be used with a bottom port mounting configuration, similar to that of FIG. 10b above.

Figure 16:
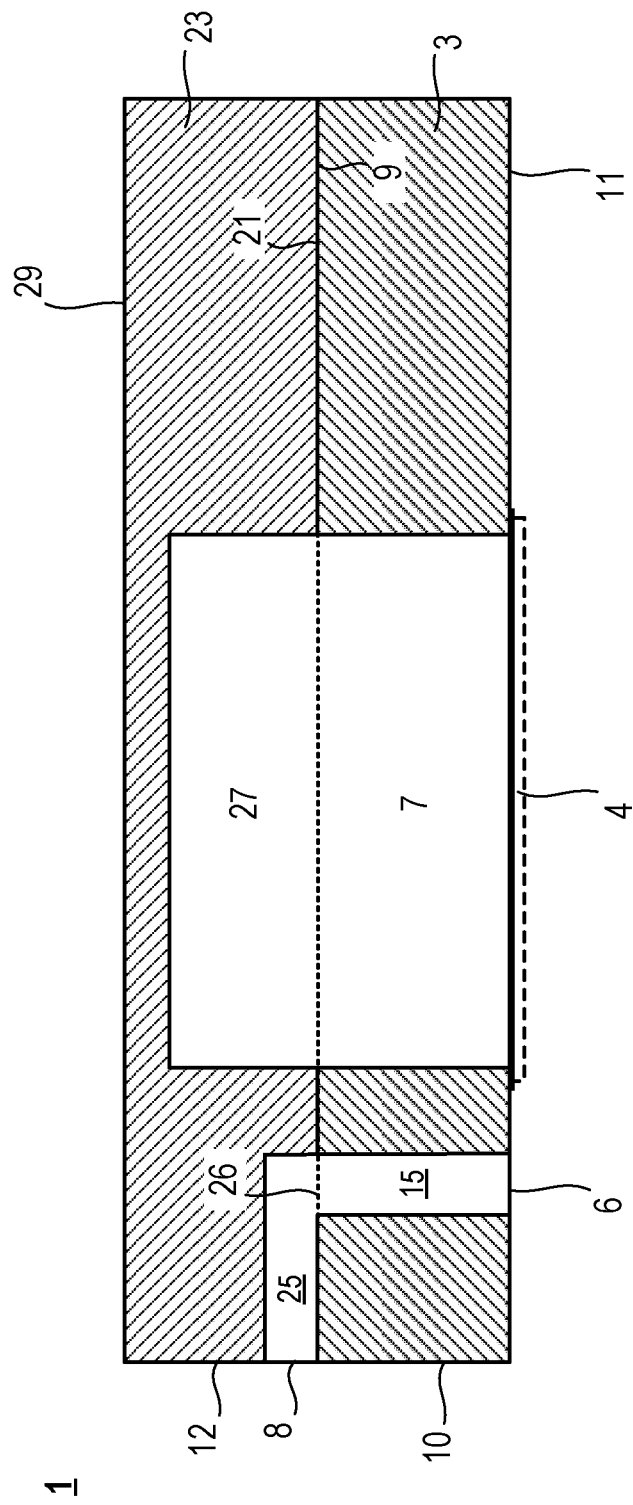
FIG. 16 illustrates an example of a MEMS transducer package according to an embodiment of the present disclosure.

According to another embodiment as shown in FIG. 16, the side port aspect is formed within the cap portion 23, which cooperates with the acoustic die channel 15 to provide an acoustic path. The MEMS transducer package of FIG. 16 comprises a semiconductor die portion 3 and a cap portion 23. The semiconductor die portion 3 comprises a thickness bounded by a first surface 9 and an opposite second surface 11. The second surface 11 of the semiconductor die portion 3 incorporates a transducer element 13 (for example a microphone comprising a membrane and back-plate). A die back volume 7 extends through the thickness of the semiconductor die portion 3 between the first surface 9 and the transducer element 13. An acoustic die channel 15 extends through the thickness of the semiconductor die portion 3 between the first surface 9 and the second surface 11. The acoustic die channel 15 provides an acoustic path between the first and second surfaces 9, 11 of the semiconductor die 3.

In the embodiment of FIG. 16, the cap portion 23 comprises a thickness bounded by a first surface 29 and an opposite second surface 21, and an acoustic cap channel 25 configured to provide an acoustic path between a first opening 26 in the second surface 21 of the cap portion 23 and a second opening 8 in a side surface 12 of the cap portion 23. The acoustic cap channel 25 may extend substantially parallel to the second surface 21 of the cap portion 23. The side surface 12 may be substantially orthogonal to the first surface 29 of the cap portion 3.

In the example of FIG. 16, the acoustic cap channel 25 interfaces with the acoustic die channel 15 to provide an acoustic path between a first opening 6 formed by the acoustic die channel 15 in the second surface 11 of the semiconductor die portion 3 and a second opening 8 formed by the acoustic cap channel 25 in a side surface 12 of the cap portion 23.

Figure 17:
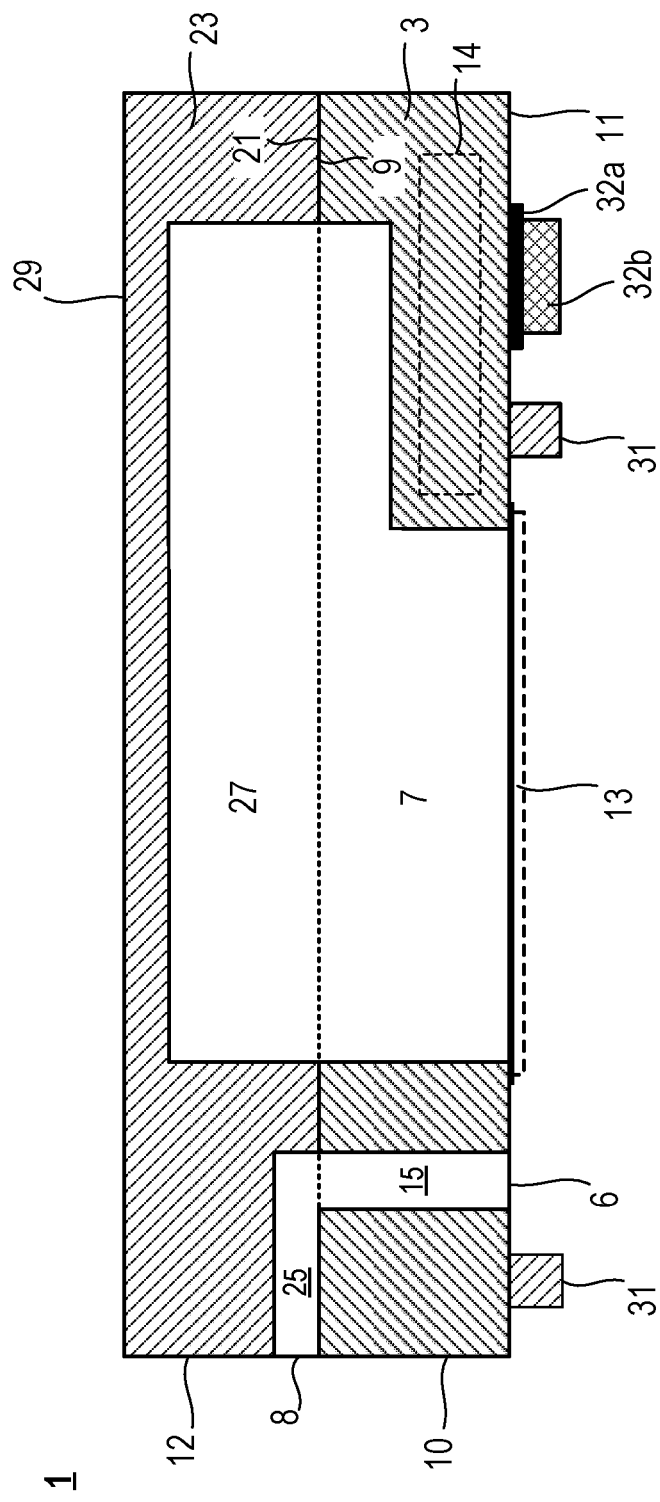
FIG. 17 illustrates an example of a MEMS transducer package according to an embodiment of the present disclosure.

Referring to FIG. 17, according to one embodiment, a die back volume 7 of a side port embodiment may comprise a stepped back volume as described in some of the top port embodiments. For example, the stepped back volume may comprise at least one discontinuity along a sidewall of the die back volume, between the first surface 9 and the second surface 11 of the semiconductor die portion 3. The cap back volume may also comprise a stepped back volume. The stepped die back volume and/or cap back volume may comprise any of the features noted earlier. A side port embodiment may also comprise integrated electronic circuitry 14 as described earlier.

Figure 18:
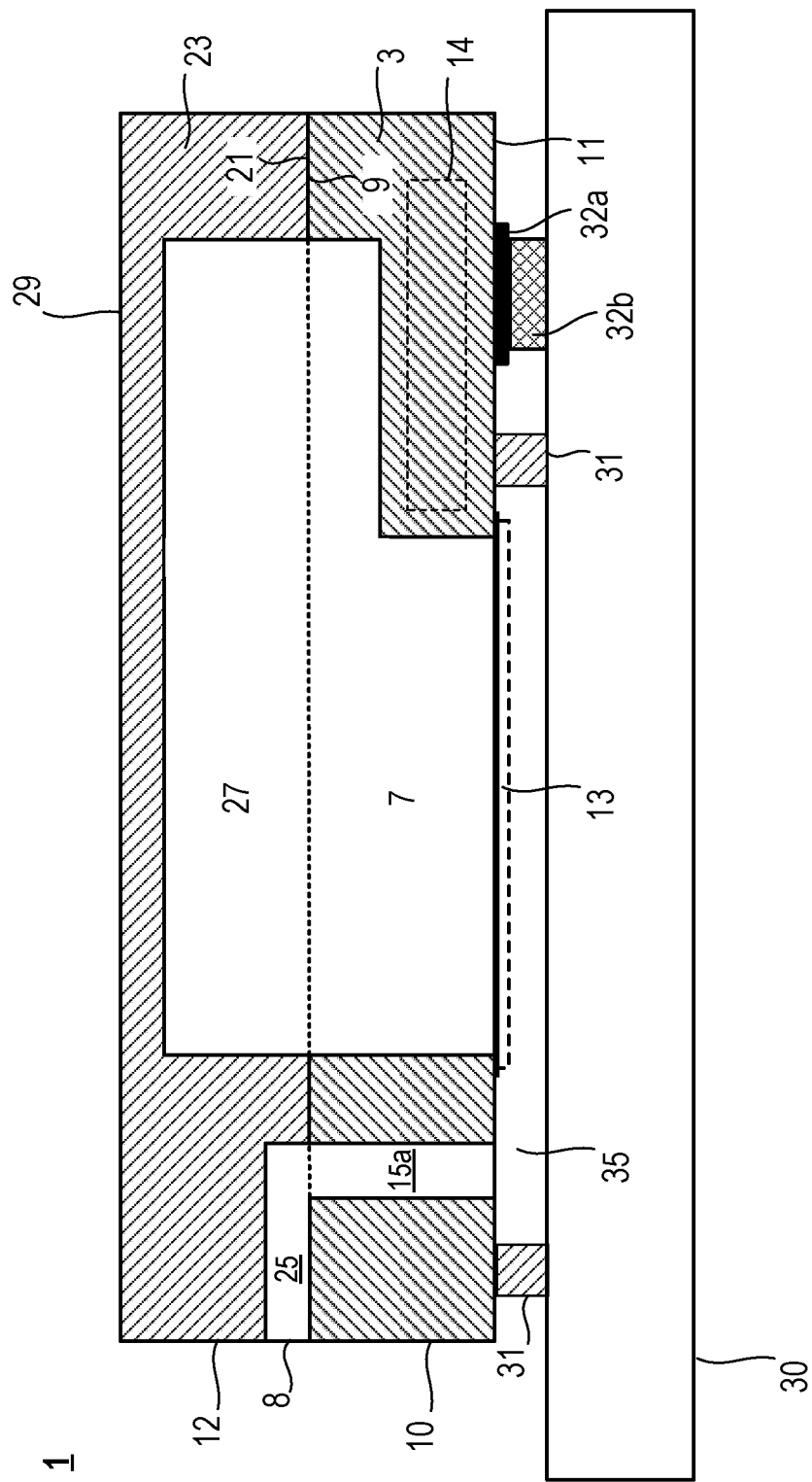
FIG. 18 illustrates an example of the MEMS transducer package of FIG. 17 mounted in one configuration example.

FIG. 18 shows an example of the MEMS transducer package 1 of FIG. 17 being mounted onto a host substrate 30. This example comprises an acoustic channel that is partly formed in the cap portion 23 and partly in the semiconductor die portion 3. The acoustic channel, comprising the acoustic cap channel 25 and the acoustic die channel 15, together with area volume 35 between the MEMS transducer package 1 and the host substrate 30 onto which the MEMS transducer package is mounted, cooperate to provide an acoustic path through which acoustic signals, or sound or pressure waves, can travel from a side surface of the MEMS transducer package to the transducer element 13, via the volume 35.

According to another aspect, the provision of an acoustic channel in a MEMS transducer package may be used to provide a MEMS transducer having directivity, as will be described further in the embodiments below.

Labyrinth Embodiments

Figure 19:
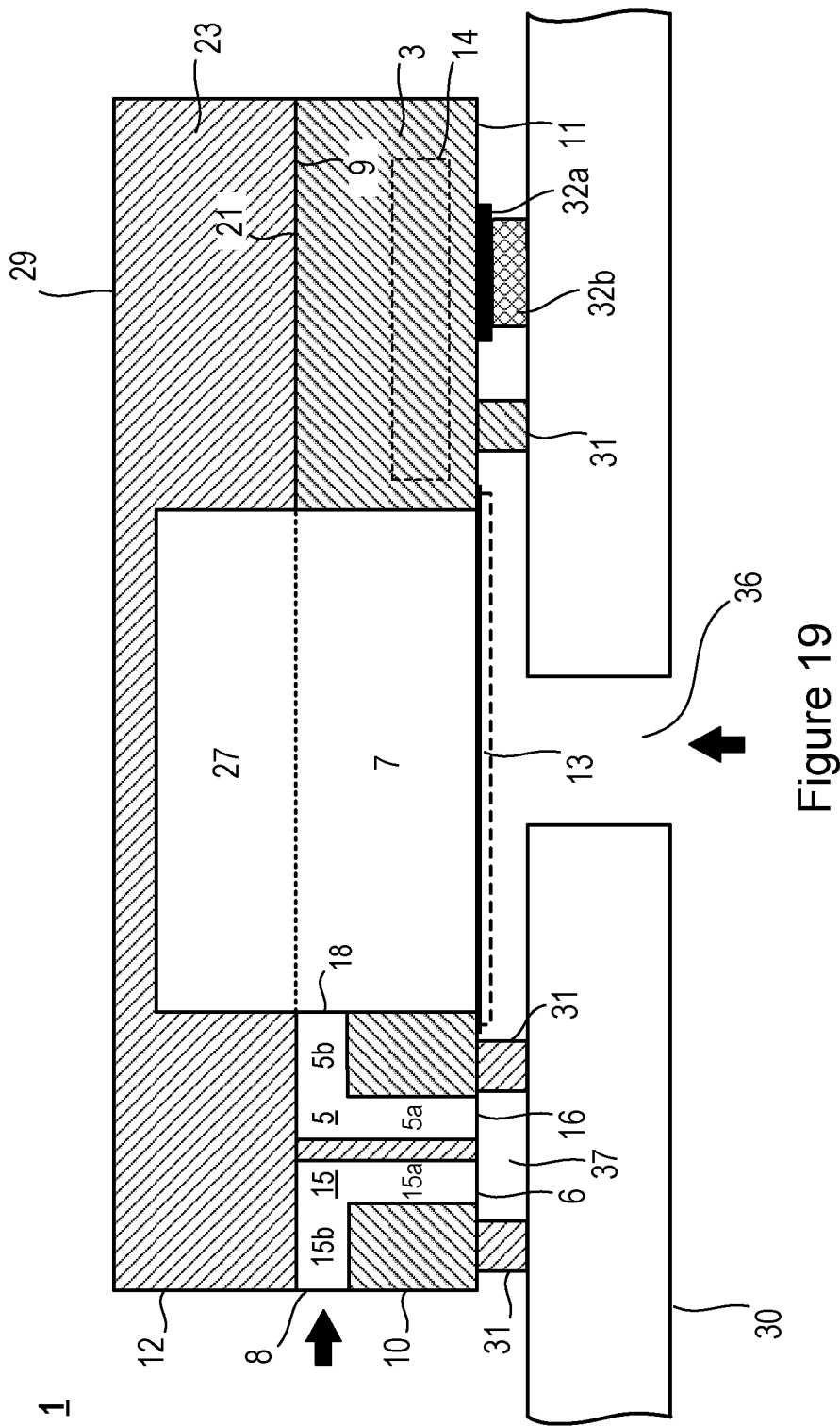
FIG. 19 illustrates an example of the MEMS transducer package according to an embodiment of the present disclosure mounted in one configuration example.

FIG. 19 shows an example of a MEMS transducer package 1 according to another embodiment of the present disclosure. The example of FIG. 19 is similar to that of FIG. 9, in so far as a semiconductor die portion 3 comprises a thickness bounded by a first surface 9 and an opposite second surface 11, the second surface 11 incorporating a transducer element 13 (for example a microphone comprising a membrane and back-plate). A die back volume 7 extends through the thickness of the semiconductor die portion 3 between the first surface 9 and the transducer element 13. An acoustic die channel extends through the thickness of the semiconductor die portion 3 between the first surface 9 and the second surface 11. The acoustic die channel provides an acoustic path between the first and second surfaces 9, 11 of the semiconductor die 3.

In the example of FIG. 19 the acoustic die channel comprises a first acoustic channel 15 and a second acoustic channel 5.

The first acoustic channel 15 is configured to provide an acoustic path between a first opening 6 in the second surface 11 of the semiconductor die portion 3 and a second opening 8 in a side surface 10 of the transducer package, the side surface 10 being substantially orthogonal to the second surface 11 of the semiconductor die portion 3.

The second acoustic channel 5 is configured to provide an acoustic path between a third opening 16 in the second surface 11 of the semiconductor die portion 3 and a fourth opening 18 that is in acoustic connection with the die back volume 7.

The MEMS transducer package 1 may be mounted on a host substrate 30 comprising an aperture 36, which functions as a bottom port to allow sound or pressure waves to be received by the transducer element 13. The transducer package may further comprise an acoustic seal structure 31 for coupling the MEMS transducer package 1 to the host substrate 30. In the example of FIG. 19 the acoustic seal structure 31 is configured similar to that of FIGS. 3d and 10b above, such that the first opening 6 and third opening 16 lie between a first seal boundary, and the transducer element 13a second seal boundary. Therefore, in use, the transducer element 13 will receive first acoustic signals on its front side via the bottom port 36 of the host substrate 30, and second acoustic signals via the fourth opening 18 (i.e. via the side port formed from the second opening 8 to the fourth opening 18 via the first acoustic channel 15 and second acoustic channel 5 and the sealed volume 37). The first and second acoustic channels 15, 5 act to delay the second acoustic signals compared to the first acoustic signals, thereby enabling the MEMS transducer package 1 to provide directivity to a received acoustic signal. The labyrinth acoustic channel (i.e. acoustic path provided via the first and second acoustic channels 15, 5) may also be used to tune the resonance of the channel acoustic impedance with the acoustic capacitance of the back volume. Another possible use is that of a low-frequency cut-off function of the labyrinth acoustic channel, possibly coupled directly to the back-volume 36, for preventing low frequencies, for example wind noise, into the back volume thereby providing some passive wind noise rejection.

In the example of FIG. 19, the first acoustic channel 15 comprises at least a first portion 15a which extends between the first surface 9 and the second surface 11 of the semiconductor die portion 3. In the example of FIG. 19, the first acoustic channel 15 further comprises a second portion 15b which extends substantially orthogonal to the first portion 15a, such that the first portion 15a and the second portion 15b cooperate to provide an acoustic path between the first opening 6 in the second surface 11 of the semiconductor die portion 3 and the second opening 8 in the side surface 10 of the semiconductor die portion 3.

In this example, the second acoustic channel 5 comprises at least a first portion 5a which extends between the first surface 9 and the second surface 11 of the semiconductor die portion 3. The second acoustic channel 5 further comprises a second portion 5b which extends substantially orthogonal to the first portion 5a, such that the first portion 5a and the second portion 5b cooperate to provide an acoustic path between the third opening 16 in the second surface 11 of the semiconductor die portion 3 and the fourth opening 18 that is in acoustic connection with the die back volume 7.

As an alternative to the labyrinth acoustic channel shown in embodiment of FIG. 19, it is noted that the labyrinth acoustic channel may be formed in a plane of the first surface 9, or in a plane parallel to this surface. For example, the first portion 15a of the first acoustic channel and the first portion 5a of the second acoustic channel could extend out of the page in FIG. 19 (or in another direction within that plane), with first ends of the respective first portions 15a, 5a coupled to the respective second portions 15b, 5b, and second ends of the first portions 15a, 5a coupled by an acoustic channel.

The MEMS transducer package further comprises a cap portion 23, the cap portion 23 comprising a thickness bounded by a first surface 29 and an opposite second surface 21.

In the example of FIG. 19, it can be seen that the acoustic channels are provided entirely within the semiconductor die portion 3. In particular, the second opening 8 is formed entirely in a side surface 10 of the semiconductor die portion 3. The fourth opening 18 is formed such that the second acoustic channel 5 is acoustically coupled directly to the die back volume 7.

Figure 20:
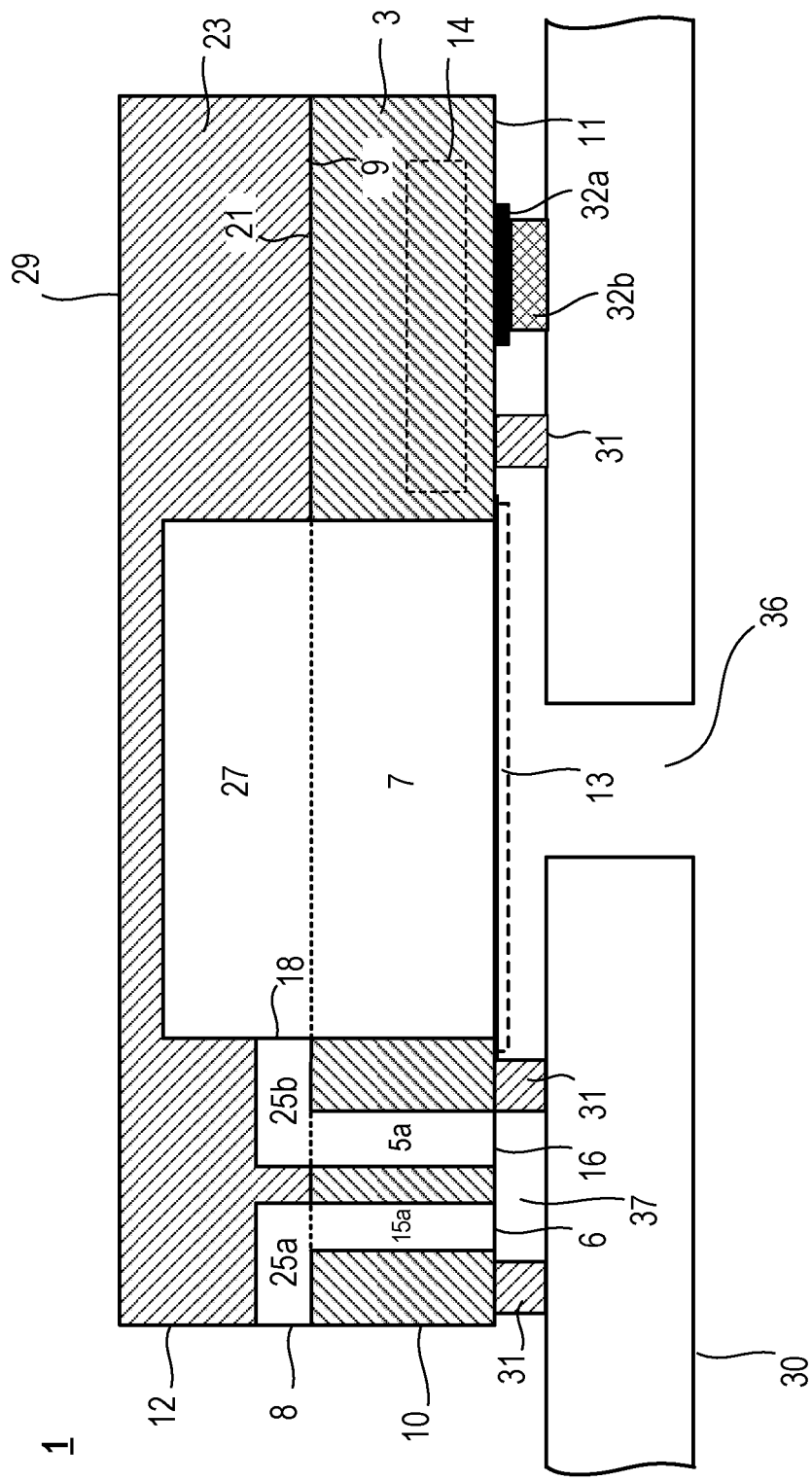
FIG. 20 illustrates an example of the MEMS transducer package according to an embodiment of the present disclosure mounted in one configuration example.

It is noted that the acoustic channels for providing the second acoustic signals may be formed in other ways. For example, FIG. 20 shows an example similar to FIG. 19, but wherein the semiconductor die portion 3 comprises an acoustic die channel comprising first and second channels 15, 5, but wherein the cap portion 23 comprises an acoustic cap channel 25, comprising first and second acoustic channels 25a, 25b.

The first acoustic channel 25a of the acoustic cap channel 25 extends substantially orthogonal to the second surface 21 of the cap portion 23. The first acoustic channel 25a of the acoustic cap channel 25 and the first acoustic channel 15 of the acoustic die channel 15 cooperate to provide an acoustic path between a first opening 6 in the second surface 11 of the semiconductor die portion 3 and a second opening 8 in the side surface of the transducer package. In this example, the second opening 8 is provided entirely in a side surface 12 of the cap portion 23.

The second acoustic channel 25b of the acoustic cap channel 25 extends substantially orthogonal to the second surface 21 of the cap portion 23. The second acoustic channel 25b of the acoustic cap channel 25 and the second acoustic channel 5 of the acoustic die channel 15 cooperate to provide an acoustic path between a third opening 16 in the second surface 11 of the semiconductor die portion 3 and a fourth opening 18 that is in acoustic connection with a cap back volume 27.

Therefore, in use, as with the embodiment of FIG. 19, the transducer element 13 will receive first acoustic signals on its front side via the bottom port 36 of the host substrate 30, and second acoustic signals via the fourth opening 18 (i.e. via the side port formed from the second opening 8 to the fourth opening 18 via the first acoustic channel 15 and second acoustic channel 5. The first and second acoustic channels act to delay the second acoustic channel compared to the first acoustic channel, thereby enabling the MEMS transducer package to provide directivity to a received acoustic signal, or for other functions such a frequency filtering or acoustic impedance/capacitance tuning.

As mentioned above, in the example of FIG. 20, the second opening 8 is formed entirely in a side surface 12 of the cap portion 23, with the fourth opening 18 being formed such that it acoustically couples directly to the cap back volume 27 (and thus indirectly to the die back volume 7).

As an alternative to FIG. 20, the labyrinth acoustic channel may be formed within the cap portion 23, whereby the labyrinth acoustic channel may be formed in a plane of the second surface 21, or in a plane parallel to this second surface 21. For example, the first portion 15a of the first acoustic channel and the first portion 5a of the second acoustic channel may be formed in the cap portion 23 rather than the semiconductor die portion 3, such that they extend from the cap portion 23 out of the page in FIG. 20, with first ends of the respective first portions 15a, 5a coupled to the second portions 25b, 5b, and the other ends of the respective first portions 15a, 5a coupled by an aperture.

Figure 21:
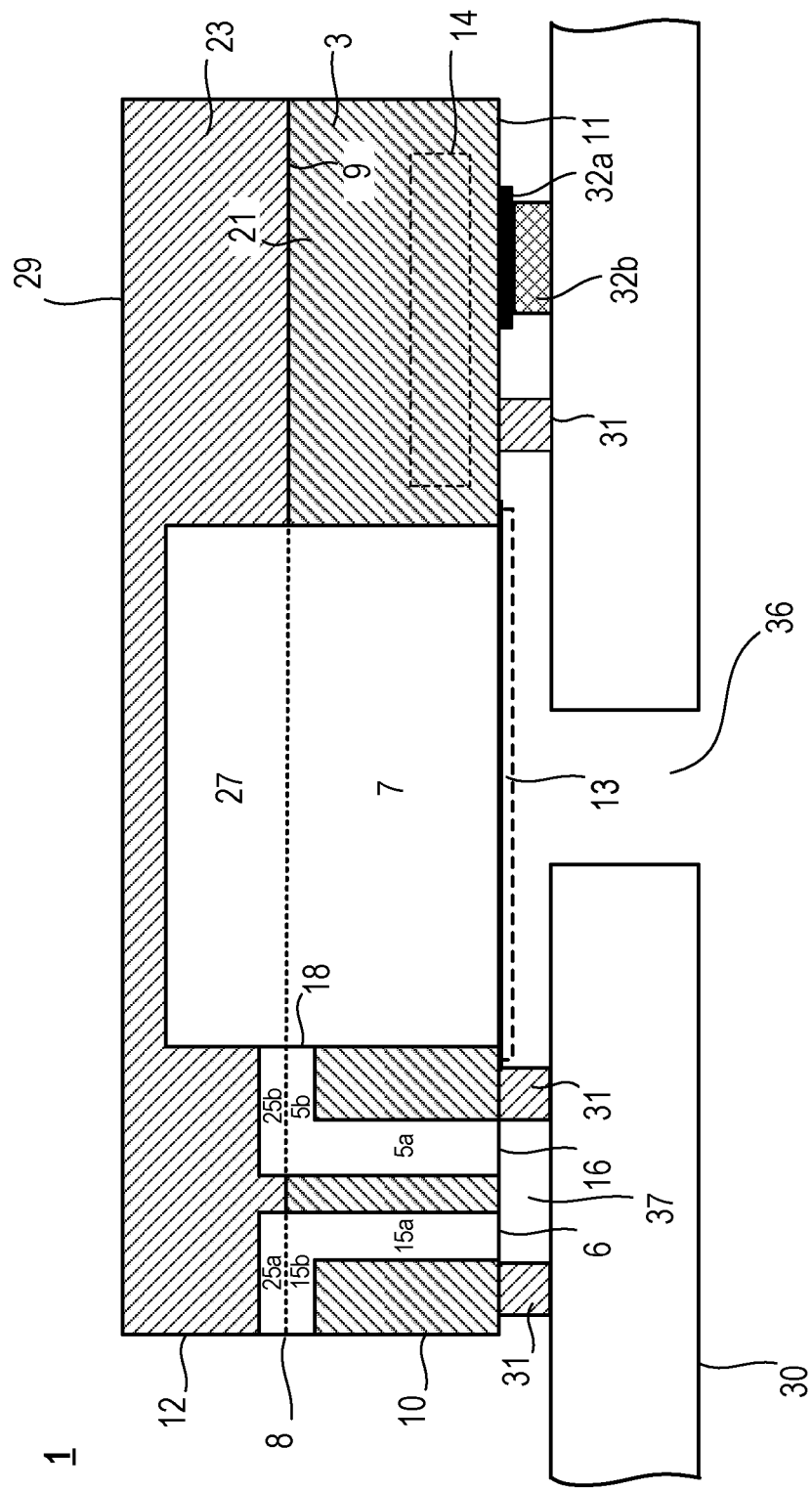
FIG. 21 illustrates an example of the MEMS transducer package according to an embodiment of the present disclosure mounted in one configuration example.

FIG. 21 shows an example of another embodiment in which the second opening 8 is formed partly in a side surface 12 of the cap portion 23 and partly in a side surface 10 of the semiconductor die portion 3. In the example of FIG. 21, the fourth opening 18 is acoustically coupled directly to part of the cap back volume 27 and part of the die back volume 27. In this example, the second opening 8 and fourth opening 18 are formed substantially equally between the respective semiconductor die portion 3 and the cap portion 23. As an alternative to FIG. 21, the labyrinth acoustic channel may be formed partly within the semiconductor die portion and partly within the cap portion 23, but whereby the first portions 15a, 5a of the labyrinth acoustic channel are formed partly in a plane of the first surface 9 and partly in a plane of the second surface 21, or partly in planes parallel to these surfaces.

Figure 22:
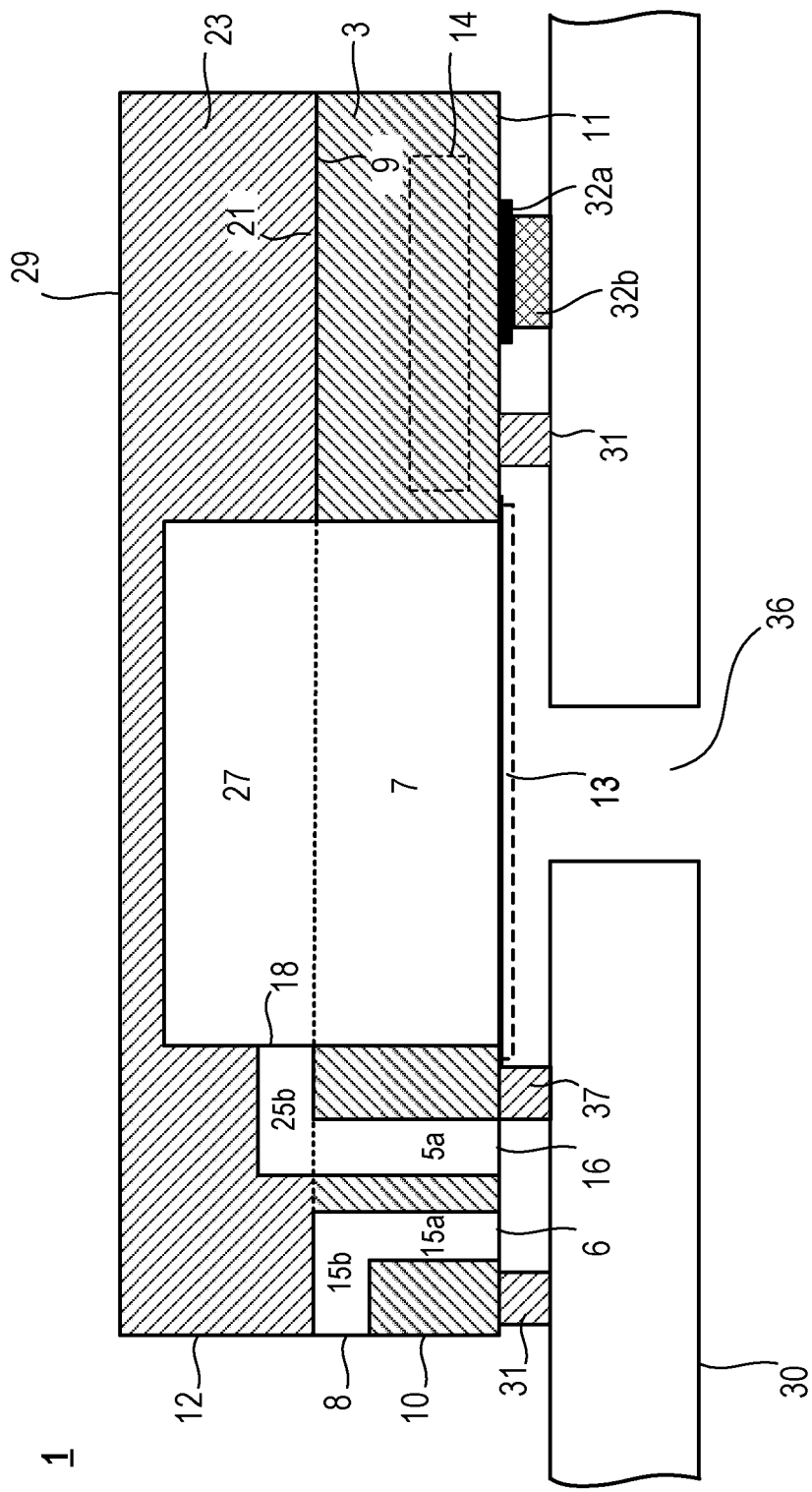
FIG. 22 illustrates an example of the MEMS transducer package according to an embodiment of the present disclosure mounted in one configuration example.

FIG. 22 shows another example in which the second opening 8 is formed entirely in a side surface 10 of the semiconductor die portion 3, with the fourth opening 18 being acoustically coupled directly to the cap back volume 27. As an alternative to FIG. 22, the first portions 15a, 5a of the labyrinth acoustic channel may be formed partly in a plane of the first surface 9 and partly in a plane of the second surface 21, or partly in planes parallel to these surfaces.

Figure 23:
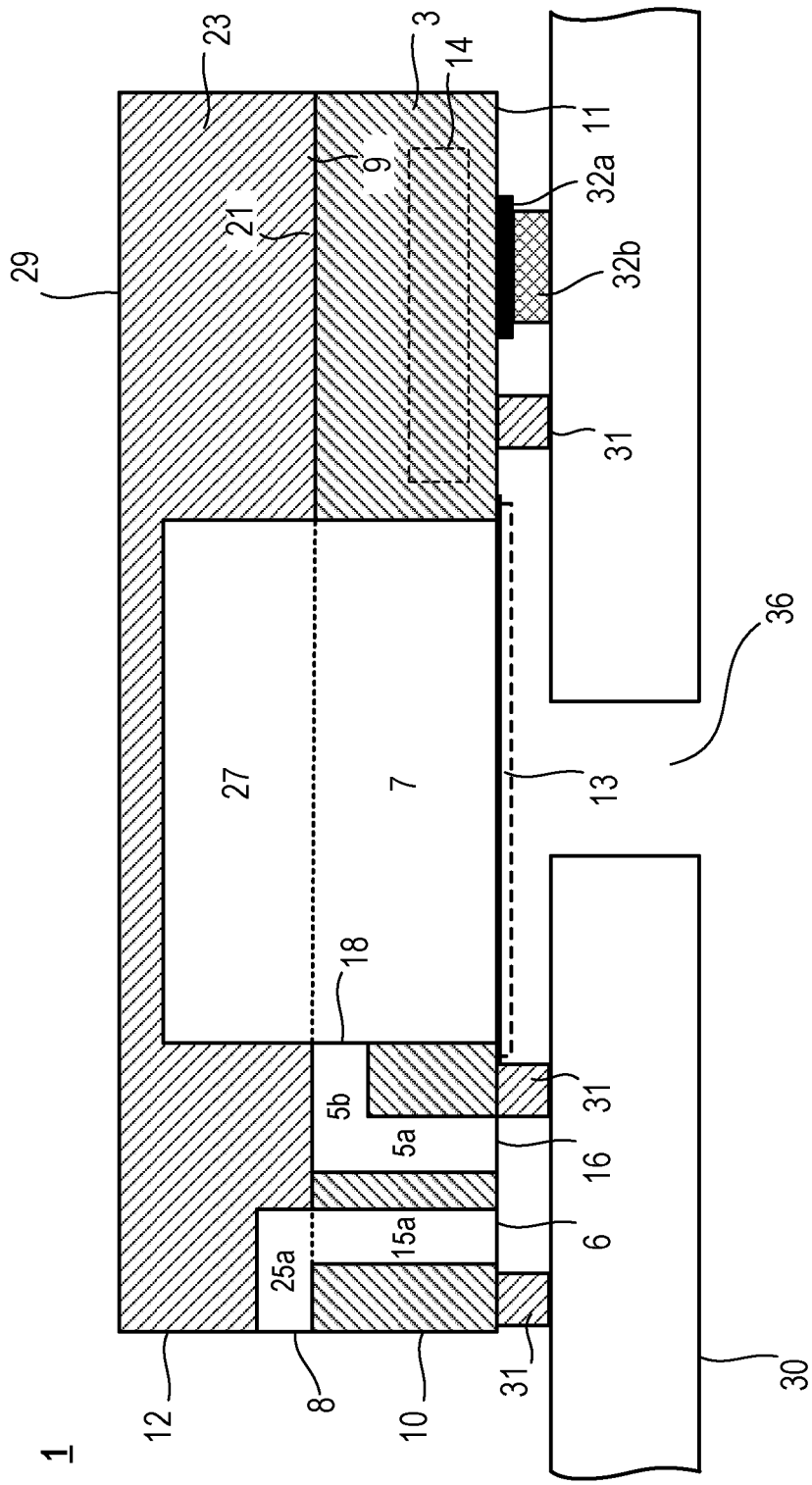
FIG. 23 illustrates an example of the MEMS transducer package according to an embodiment of the present disclosure mounted in one configuration example.

FIG. 23 shows yet another example in which the second opening 8 is formed entirely in a side surface 12 of the cap portion 23, with the fourth opening 18 being acoustically coupled directly to the die back volume 7. As an alternative to FIG. 23, the first portions 15a, 5a of the labyrinth acoustic channel may be formed partly in a plane of the first surface 9 and partly in a plane of the second surface 21, or partly in planes parallel to these surfaces.

Figure 24:
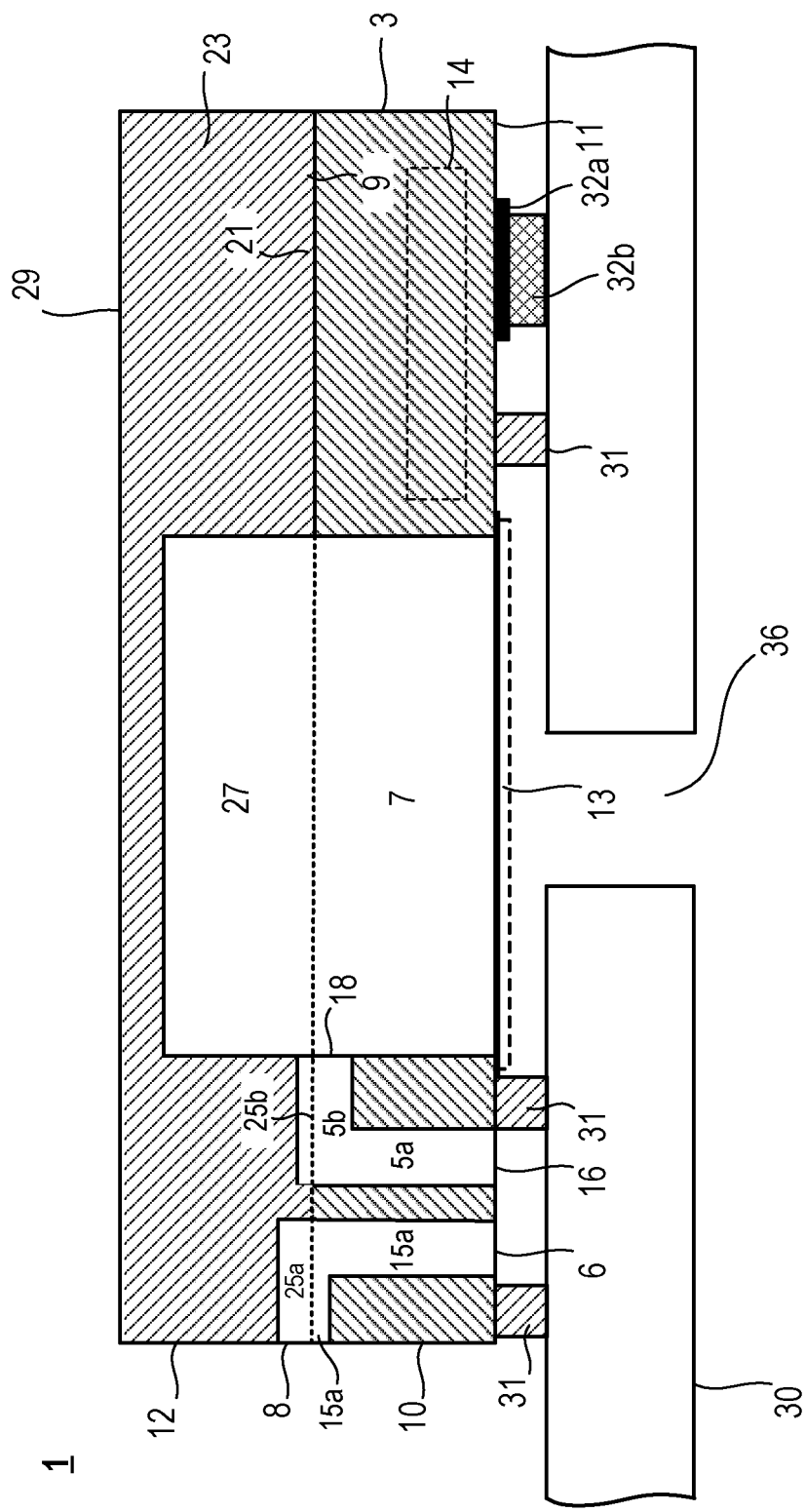
FIG. 24 illustrates an example of the MEMS transducer package according to an embodiment of the present disclosure mounted in one configuration example.

FIG. 24 shows an example that is similar to that of FIG. 21, wherein the second opening 8 is formed partly in a side surface 12 of the cap portion 23 and partly in a side surface 10 of the semiconductor die portion 3, with the fourth opening 18 being acoustically coupled directly to part of the cap back volume 27 and directly to part of the die back volume 27. However, in FIG. 24, the second opening 8 and fourth opening 18 are not formed substantially equally between the respective semiconductor die portion 3 and the cap portion 23.

Instead, in FIG. 24, one acoustic channel is predominantly formed in the cap portion 23, while the other acoustic channel is formed predominantly in the semiconductor die portion 3. Again, as an alternative to FIG. 24, the first portions 15a, 5a of the labyrinth acoustic channel may be formed partly in a plane of the first surface 9 and partly in a plane of the second surface 21, or partly in planes parallel to these surfaces.

Figure 25:
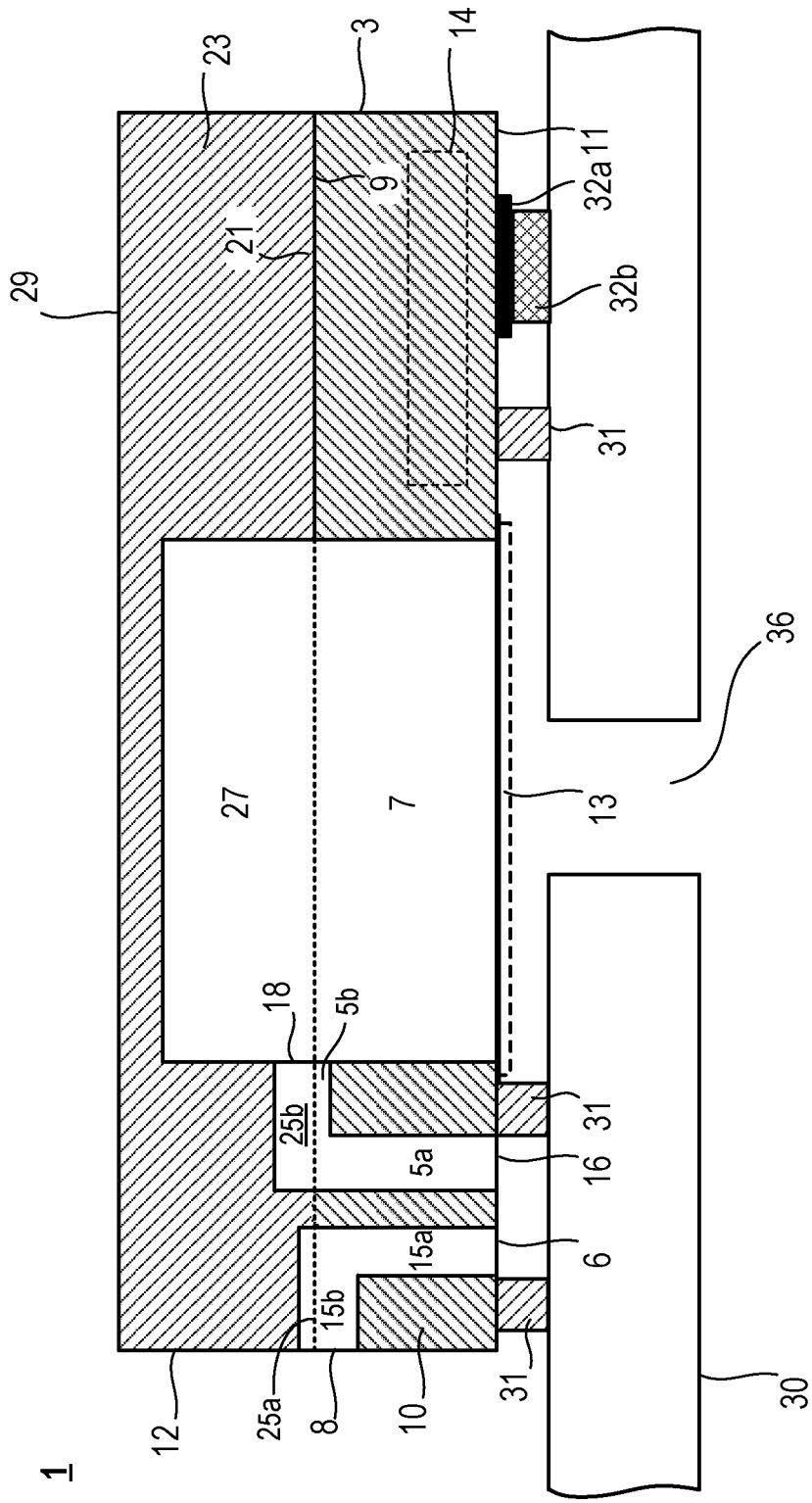
FIG. 25 illustrates an example of the MEMS transducer package according to an embodiment of the present disclosure mounted in one configuration example.

FIG. 25 shows an embodiment similar to FIG. 24, but in reverse in terms of which portions are formed predominantly in which section. Again, as an alternative to FIG. 25, the first portions 15a, 5a of the labyrinth acoustic channel may be formed partly in a plane of the first surface 9 and partly in a plane of the second surface 21, or partly in planes parallel to these surfaces.

The embodiments described above have the advantage of enabling a fully integrated MEMS transducer package to be mounted to a substrate, such that an integrated MEMS transducer element is protected, yet still allow acoustic signals to reach the transducer element. Embodiments comprising integrated electronic circuitry also have the advantage of not requiring through-vias to be provided between one side of a die and the other, for example as would be required if a MEMS transducer element was mounted with its back volume facing the substrate.

It is noted that features from any one of the embodiments above may be combined with features from any one or more of the other embodiments.

Furthermore, it is noted that where a reference is made in an embodiment to a single acoustic channel, it is noted that multiple acoustic channels may be provided to perform a similar function. By way of one example, in the embodiment of FIG. 2, a second acoustic channel 15/25 (or additional acoustic channels) may be provided between the surfaces 11 and 29. In addition, an acoustic channel may be provided on a side of the die that houses electronic circuitry, either as the main or only acoustic channel through the die, or as an additional acoustic channel to another acoustic channel, for example an acoustic channel provided on the other side of the back volume. With such different embodiments, a seal structure may be adapted to seal the respective acoustic channel(s) according to whether a top-port or bottom-port mounting configuration is being provided.

In some of the embodiments described herein, the acoustic channel is provided as the main or primary (or only) acoustic path to the transducer element. In some of the embodiments described herein, the acoustic channel is provided in combination with a back volume which is sealed towards a back side of the transducer element.

Figure 26:
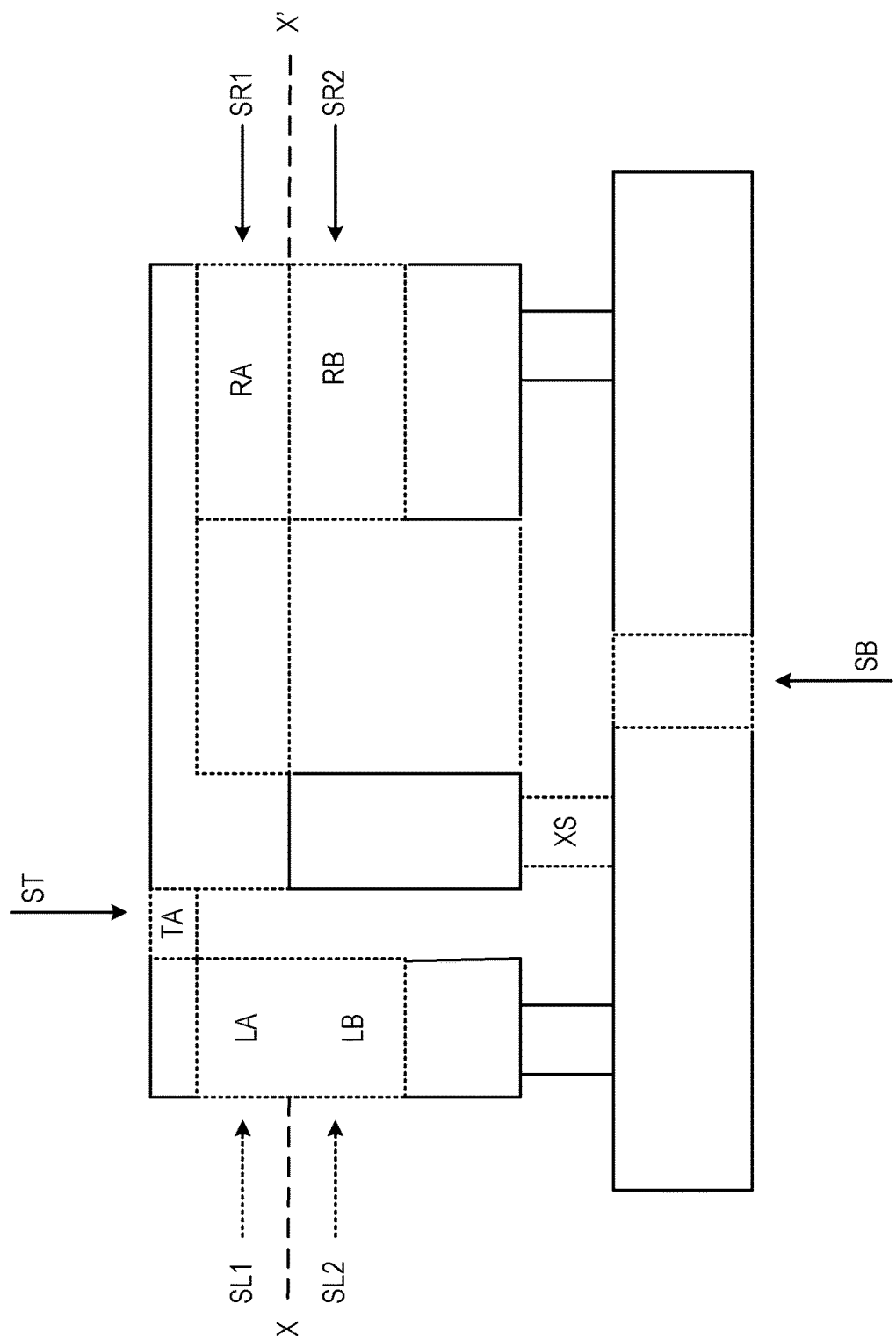
FIG. 26 illustrates some examples of various options and configurations available according to embodiments disclosed herein.
Figure 28:
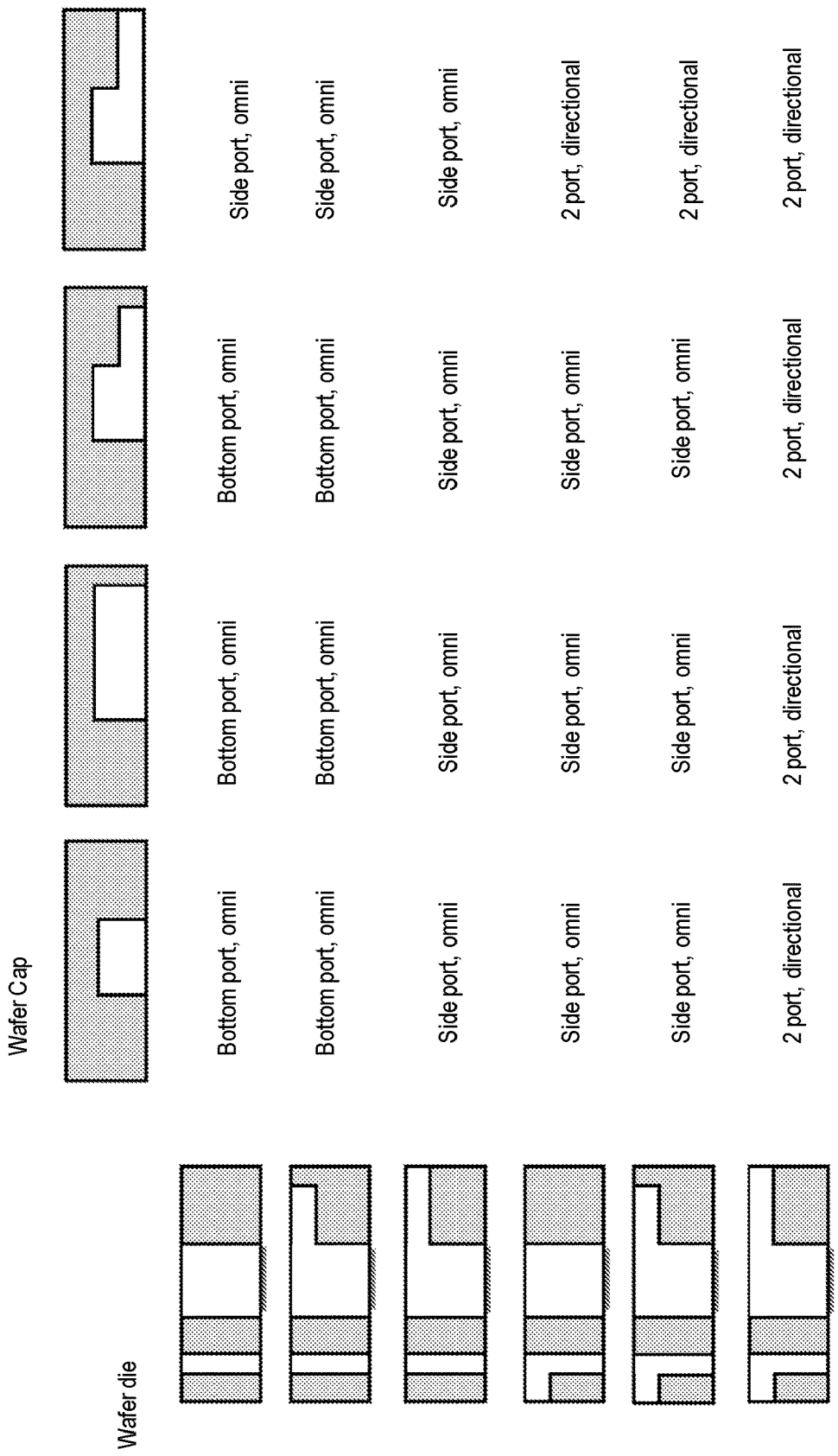
Figure 29:
Figure 30:
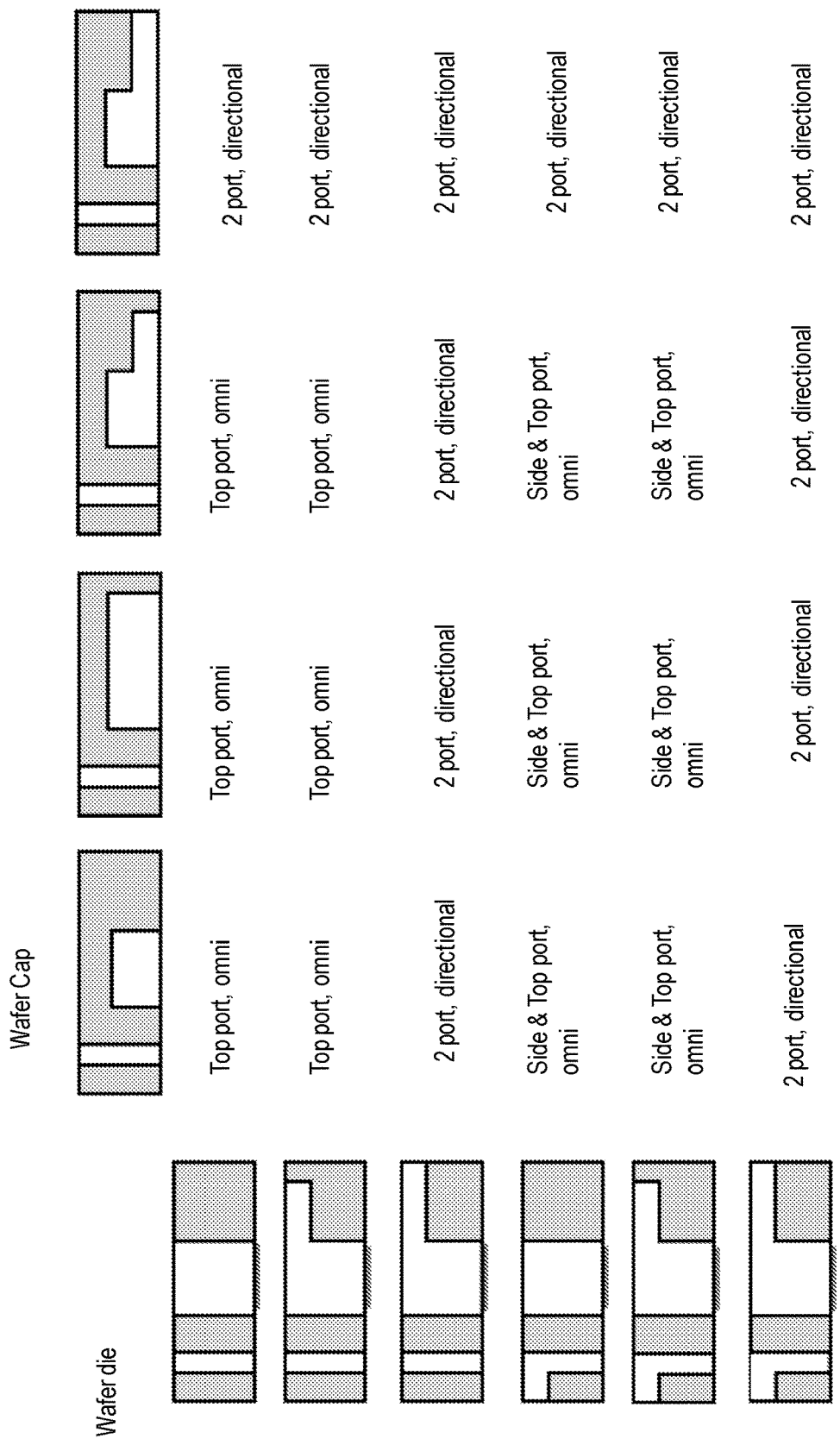
Figure 31:
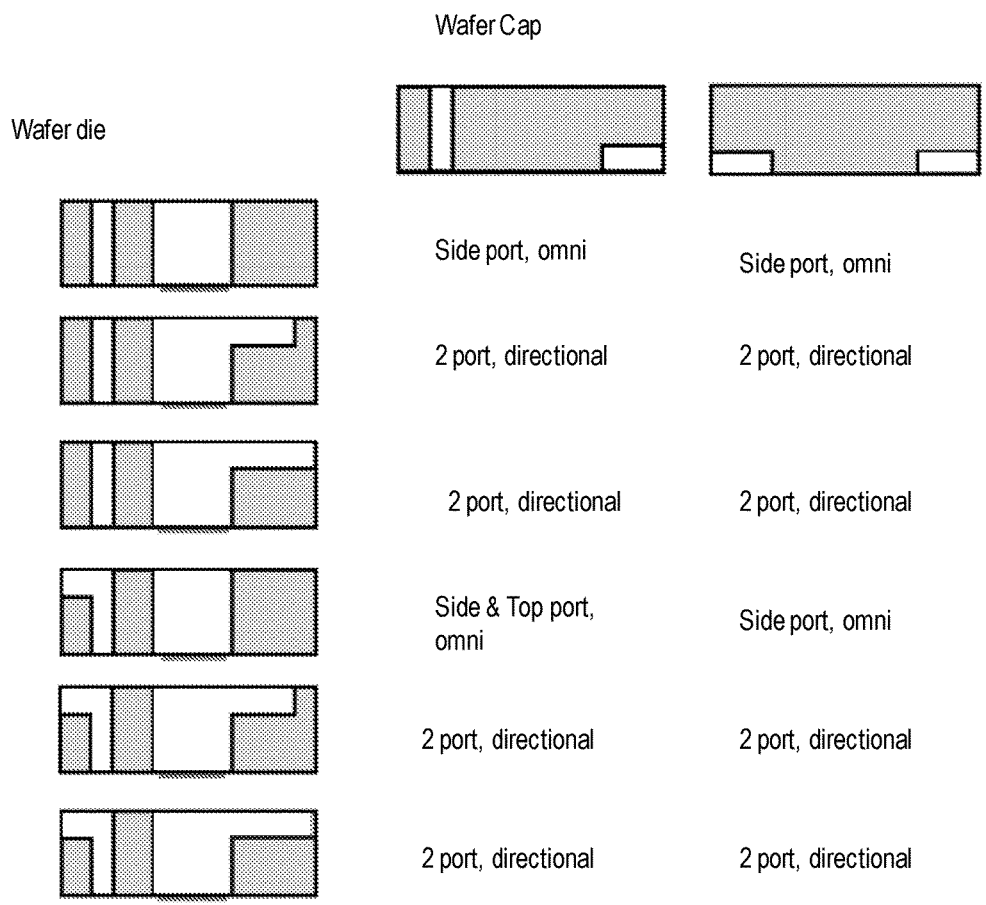

FIG. 26 illustrates the various options for sound to access the microphone transducer according to the chosen structure and dimensions of the acoustic channels and back volumes and underlying substrate. The die wafer acoustic channel may have a lateral extension LB to allow sound SL2 from one side (arbitrarily considered the left side) to pass down the die wafer acoustic channel to the transducer element. Alternatively or additionally the wafer cap acoustic channel may have a lateral extension to allow sound SL1 to enter from the same side. Alternatively or additionally the wafer cap acoustic channel may have an opening to the top of the package to allow sound ST from above to pass down the acoustic channel to the transducer element. There may be a part XS of the sealing structure that unless absent will block any of these sound sources coupling through the acoustic channel.

Similarly the cap and/or die back volumes may have lateral extensions RA and RB to allow sounds SR1, SR2 to enter from the same side. These will access the transducer element from the other, upper, side, giving an inverted signal. Thus if any other sources are coupled to the lower side of the transducer element, the net signal will represent the acoustic subtraction of the sounds.

The host substrate 30 may have an aperture to allow sound from underneath (SB) to access the transducer element. Again this may combine acoustically with any other signal ports enabled by the structure.

Thus, the same or very similar MEMS transducer package structures may be used in a wide variety of configurations.

Various other configurations are illustrated by the examples shown in FIGS. 27 to 31, by selecting different combinations of die portion and cap portion (wafer die and wafer cap) from each Figure.

Lower Side Port Embodiments

Figure 32A:
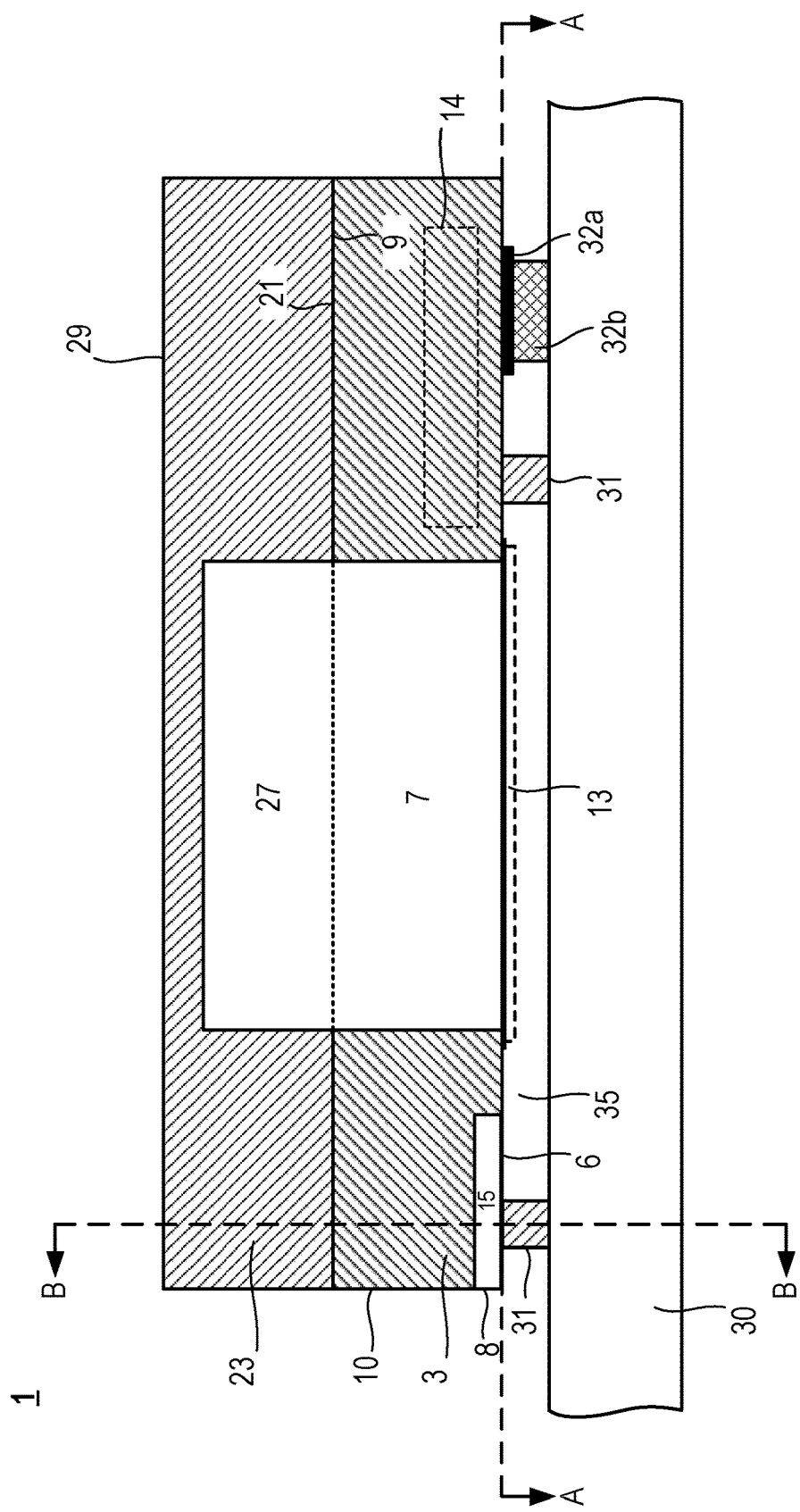
FIG. 32a illustrates a cross-sectional side view of an example of a MEMS transducer package according to an embodiment of the present disclosure.

FIG. 32a shows a cross-sectional side view of an example of a MEMS transducer package 1 according to an embodiment of the present disclosure. The MEMS transducer package 1 is shown as being mounted on a host substrate 30, for example a printed circuit board (PCB) within a device (for example a mobile phone device). In the example of FIG. 32a, the semiconductor die portion 3 is used in conjunction with a cap portion 23 to form the MEMS transducer package 1. The semiconductor die portion 3 comprises a thickness bounded by a first surface 9 and an opposite second surface 11. The second surface 11 of the semiconductor die portion 3 incorporates a transducer element 13 (for example a microphone comprising a membrane and a back-plate). A die back volume 7 extends through the thickness of the semiconductor die portion 3 between the first surface 9 and the transducer element 13. An acoustic die channel 15 extends into the semiconductor die portion 3 between the second surface 11 and a side surface 10 of the semiconductor die portion 3.

In one example the acoustic die channel 15 forms a channel in the second surface 11 of the semiconductor die portion 3, wherein the channel extends inwardly from an opening 8 in the side surface 10 of the semiconductor die portion 3.

In one example the acoustic die channel 15 breaches the second surface 11 and the side surface 10 of the semiconductor die portion 3 to form one or more openings therein.

A first opening 6 formed in the second surface 11 and a second opening 8 formed in the side surface 10 combine to form an opening which spans an intersection of the second surface 11 and side surface 10.

The acoustic die channel 15 may be formed as an etching step on the second surface 11 of the semiconductor die portion, for example when processing the second surface 11 (also referred to as the front side) of the semiconductor die portion 3 when forming the transducer element 13.

In one embodiment, the MEMS transducer package 1 comprises a cap portion 23 as shown in FIG. 32a, wherein the cap portion 23 abuts the semiconductor die portion 3. The cap portion 23 comprises a thickness bounded by a first surface 29 and an opposite second surface 21. The second surface 21 of the cap portion 23 abuts the first surface 9 of the semiconductor die portion 3. Although not shown, the semiconductor die portion 3 and the cap portion 23 may be bonded together, for example using an adhesive or other techniques as generally known in the art of wafer-to-wafer bonding. The semiconductor die portion 3 and cap portion 23 form a MEMS transducer package 1, wherein the cap portion 23 acts to protect the semiconductor die portion 3. Further details of the cap portion 3 will be described later.

The embodiment of FIG. 32a may be referred to as a lower side port configuration, in so far as sound is received from a lower side of the MEMS transducer package 1 when mounted as illustrated. In one example the side 10 of the transducer package, i.e. the side of the die portion 3, is substantially orthogonal to a bottom side of the transducer package 1 (i.e. substantially orthogonal to the bottom side comprising the second surface 11 of the semiconductor die portion 3, which faces the substrate 30). It is noted, however, that the side may also be sloped.

In this example, the MEMS transducer package 1 is shown as comprising an acoustic seal 31. Some or all of the acoustic seal 31 may be formed during fabrication of the semiconductor die portion 3.

The acoustic seal 31 may serve one or more functions. For example, the acoustic seal 31 can function to channel acoustic signals that travel through the acoustic die channel 15 towards the surface of the transducer element 13 via a volume 35 which it seals to prevent leakage of sound pressure laterally between the package 1 and the substrate 30, to prevent leakage away from the transducer element of any sound pressure incident though the acoustic channel, or to prevent the ingress of any sound from other sources.

The acoustic seal 31 may also function to attach the MEMS transducer package 1 to the substrate 30. If made from conductive material, it may also provide a ground connection between metal connections on the package and metal connections on the substrate 30. The package 1 may provide a metal pattern for example a metal ring to enable such a connection to be made onto the user substrate 30. The acoustic seal 31 may comprise a compliant, i.e. flexible, conductive or non-conductive, material and/or structure to reduce mechanical coupling of stress between the substrate 30 and the package 1 and the transducer 13. The seal 31 may comprise a polymer such as silicone or some other type of flexible, i.e. compliant, material such as adhesive rubber etc.

The second surface 11 of the semiconductor die portion may comprise lead, i.e. solder, pads 32a for electrical connection to electrical conductors on the substrate 30 via solder 32b for example. Respective solder pads 32a may be connected via electrical pathways, such as vias and conductive traces (not illustrated), so as to provide power (V+ and ground potentials) to the transducer and to output a signal from the transducer for example: other solder pads and operative connections may be required as needed and as would be understood by those skilled in the art. Advantageously, the solder pads 32a may be formed from the metal layers associated with the formation of the MEMS backplate and membrane metal electrodes or some other MEMS metal processing layer as opposed to the metal layers associated with the processing of the integrated electronic circuitry. Therefore, the solder pads 32b and associated metal, i.e. conductive, traces to/from the transducer, including any electronic circuitry if present, may be considered a re-distribution layer. Therefore a MEMS package as herein described with a metal layer for solder pads 32a formed during the MEMS transducer metal formation is advantageous in re-distributing the solder pads to various areas of the MEMS transducer which may be over the area where the circuitry is formed, if present.

Figure 32B:
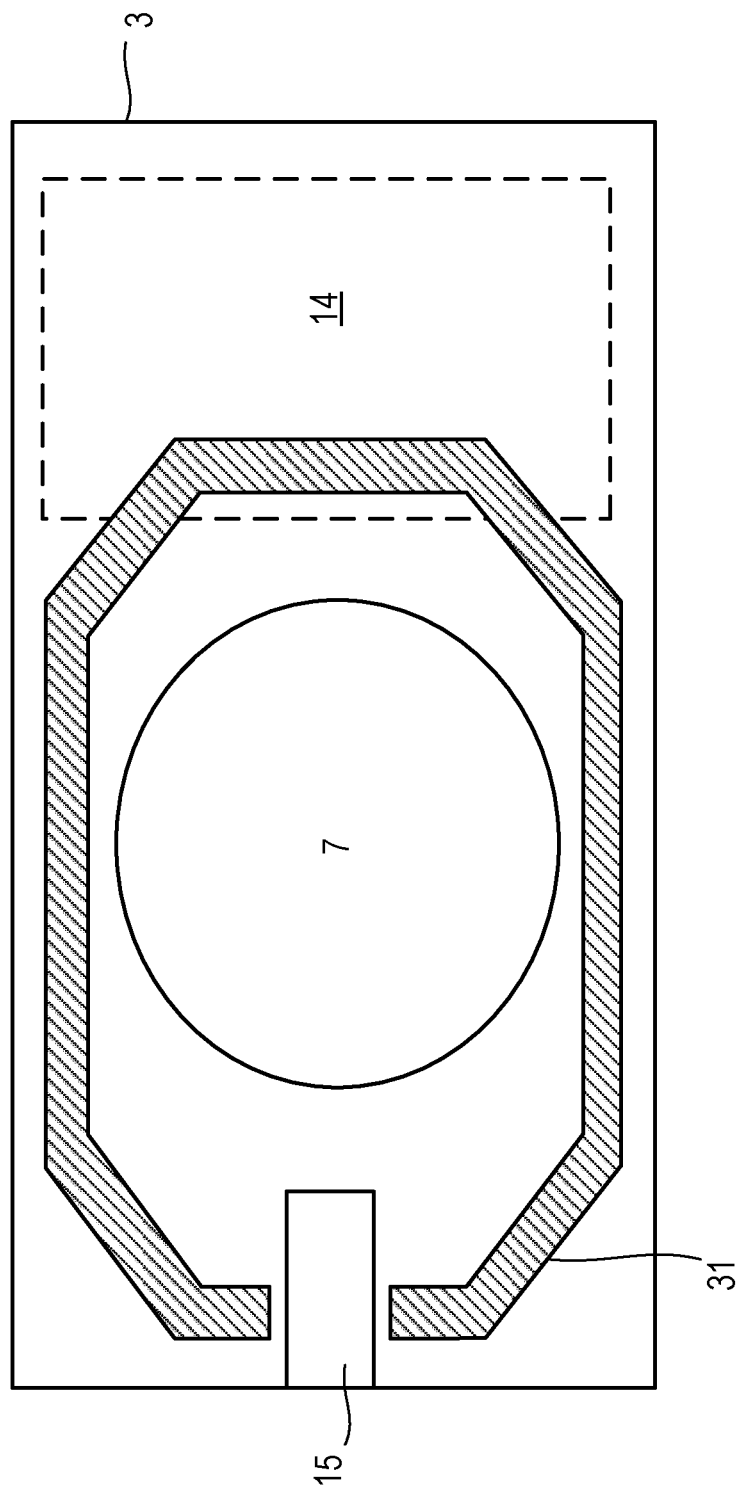
FIG. 32b illustrates a cross-sectional plan view of the MEMS transducer package according to the example of FIG. 32a of the present disclosure.

FIG. 32b is a cross-sectional plan view of the MEMS transducer package of the example of FIG. 32a, the cross section taken through the plane A-A of FIG. 32a (the solder pads 32 having been removed for clarity). In this example the acoustic seal 31 is generally octagonal in outline, but in other examples it might be other shapes, for example square, circular or some more irregular polygon depending on the layout of other structures on the die. In the example of the lower side port configuration of FIG. 32b, the acoustic seal 31 comprises a ring type structure that encloses an opening of the die back volume (and the transducer element 13, and which partially surrounds an opening formed by the acoustic die channel 15 in the second surface 11.

The acoustic seal 31 may be formed on the second surface 11 of the semiconductor die portion 3, for example when forming the transducer element 13.

In one example the acoustic seal 31 is configured to channel acoustic signals, during use, from an opening in the side surface 10 of the MEMS transducer package 1 to the transducer element 13. The acoustic seal 31 may be configured to surround an opening of the die back volume 7, and partially surround the acoustic die channel 15. The acoustic seal 31 may comprise an interruption 31z therein, the interruption 31z corresponding to a region comprising the opening formed by the acoustic die channel 15 in the second surface 11 of the semiconductor die portion 3. In another example, the acoustic seal 31 comprises an interruption 31z therein, the interruption 31z abutting an opening formed by the acoustic die channel 15 in the second surface 11 of the semiconductor die portion 3.

In this way, the acoustic seal 31 acts to channel acoustic signals that travel into the opening formed by the combination of the acoustic die channel 15 and the interruption in the acoustic seal 31, towards the surface of the transducer element 13 via a volume 35 (as shown in FIG. 32a). The acoustic seal 31 seals the volume 35 to the extent that it prevents leakage of sound pressure laterally between the package 1 and the host substrate 30, to prevent leakage away from the transducer element 13 of any sound pressure incident though the acoustic channel 15, and to prevent the ingress of any sound from other sources.

Figure 32C:
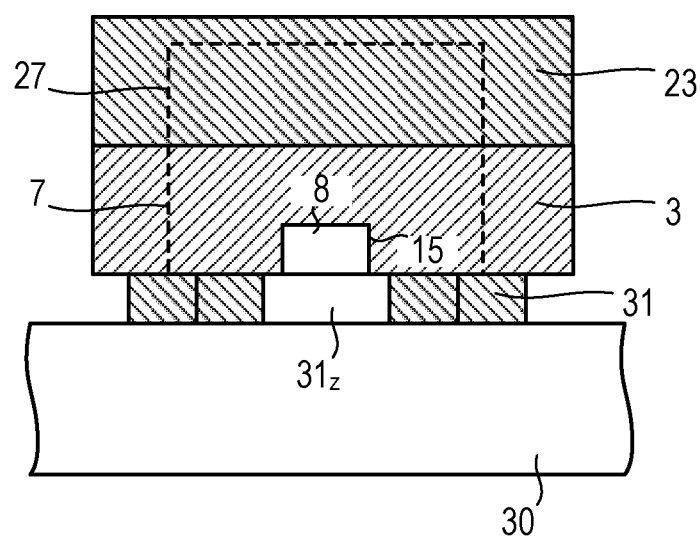
FIG. 32c illustrates a cross-sectional side view of the MEMS transducer package according to the example of FIGS. 32a and 32b of the present disclosure.

FIG. 32c is a cross-sectional side view of the MEMS transducer package of the example of FIG. 32a, the cross section taken through the plane B-B of FIG. 32a.

FIG. 32c shows the opening 8 formed by the acoustic die channel 15 in the side of the semiconductor die portion 3, and the opening 31z formed by the interruption in the acoustic seal 31 near the region of the acoustic die channel 15.

In the example of FIGS. 32a to 32c, the acoustic die channel 15 breaches the second surface 11 and a side surface 10 of the semiconductor die portion 3, to form an opening which spans the intersection of the second surface 11 and side surface 10. The die acoustic channel 15 may be formed, for example, by etching the semiconductor die portion 3 from the second surface 11 into the thickness of the semiconductor die portion 3. Such an etching step may be formed, for example, when forming the transducer element 13 onto the second surface 11 (sometimes referred to as the front-side) of the semiconductor die portion 3.

The acoustic die channel 15 has the advantage of enabling acoustic signals from a side (10) of the MEMS transducer package to reach the transducer element 13 when the MEMS transducer package 1 is used in different assembly or mounting configurations.

It is noted that in the example of FIGS. 32a to 32c, and the other examples described herein, the semiconductor die portion 3 incorporates a transducer element 13 that may be formed using silicon processing techniques, possibly in conjunction with additional processes such as the deposition of piezo-electric or piezo-resistive thin films. Preferably any such transducer processing techniques are compatible in terms of processing temperature and suchlike with providing active circuitry in the same silicon die.

In addition, it is noted that in the example of FIGS. 32a to 32c, and the other examples described herein, the footprint of the cap portion 23 may be the same size as the footprint of the semiconductor die portion 3, or substantially the same size as the semiconductor die portion 3 (for example within 10% of the size of the semiconductor die portion 3).

In the example of FIGS. 32a to 32c, the cap portion 23 is shown as comprising a cap back volume 27, which cooperates with the die back volume 7 to advantageously increase the overall back volume. This can be advantageous in certain embodiments where a greater back volume is desired, or to aid the overall height of a MEMS device to be reduced. It is noted, however, that the cap back volume may be dispensed with in some embodiments.

In the embodiment of FIGS. 32a to 32c, the acoustic die channel 15 together with the sealed volume 35 between the MEMS transducer package 1 and the substrate 30 onto which the MEMS transducer package is mounted, cooperate to provide an acoustic path through which sound or pressure waves can travel from a side surface of the MEMS transducer package (and from a top side of the host substrate 30) to the transducer element 13 (i.e. from the side surface 10 through the acoustic die channel 15 and the volume 35 to the surface of the MEMS transducer element 13).

The embodiment of FIGS. 32a to 32c has an advantage of providing a compact MEMS transducer package which can be entirely formed by wafer-level processing techniques, for example wherein a first semiconductor wafer is used to fabricate a plurality of semiconductor die portions 3, and a second wafer used to fabricate a plurality of cap portions 23, wherein the wafers may be bonded together to form a plurality of MEMS transducer packages, which may then be singulated to form a plurality of individual MEMS transducer packages. The footprint or lateral external dimensions of the package will then just be that of the semiconductor die portion 3 rather than increased by any surrounding structure.

The cap portion 23 may naturally be the same footprint as the die portion 3, since the two portions may be singulated together. Alternatively at least some of the height of some of the perimeter of cap portion 23 may comprise side faces inset from the underlying semiconductor die edges by incorporating trenches that are etched prior to singulation in a similar way to etching the acoustic die channel 25 so as to aid the singulation process.

Although not shown in all the diagrams throughout, it is noted that the semiconductor die portion 3 may also comprise integrated electronic circuitry 14.

Figure 33A:
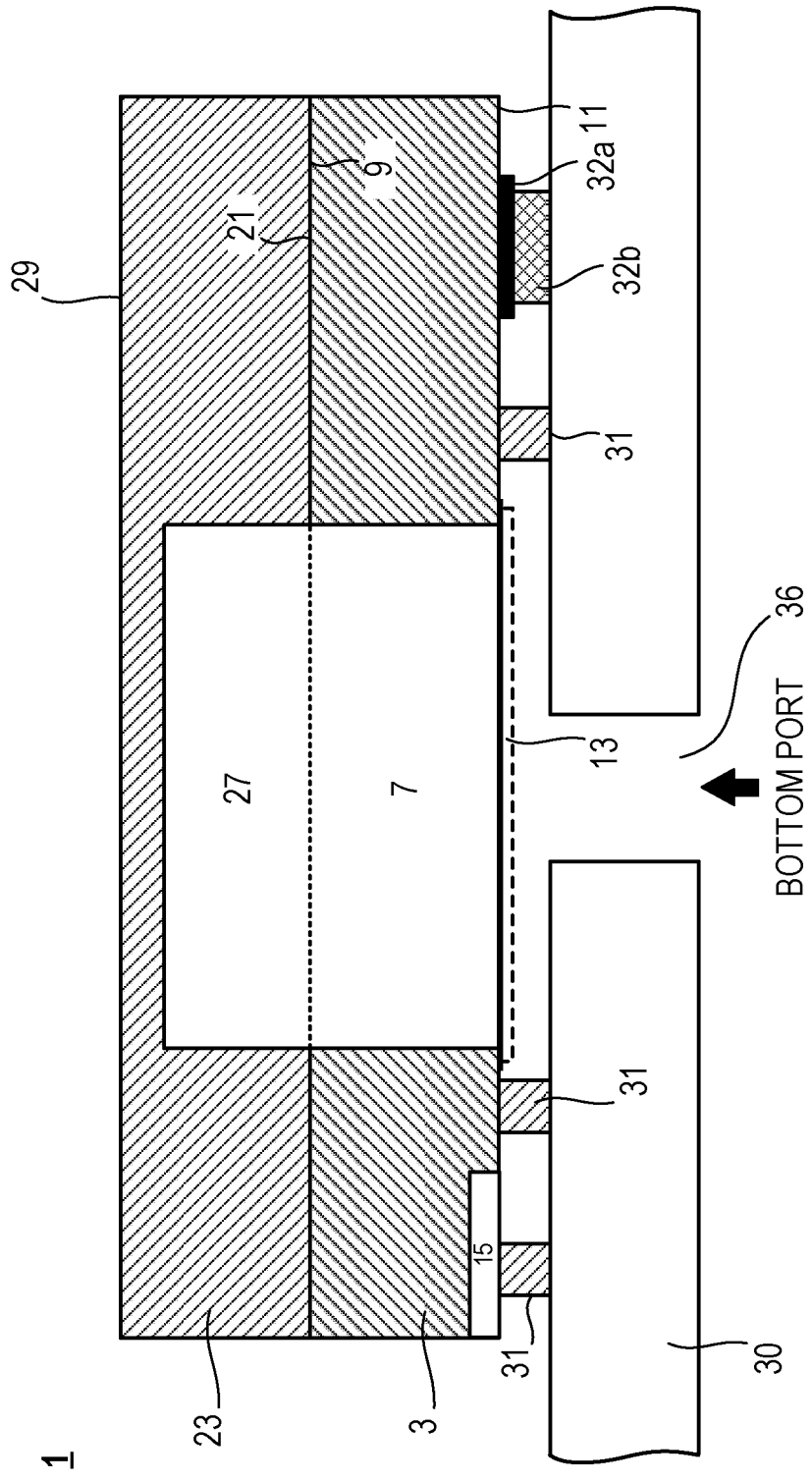
FIG. 33a illustrates a cross-sectional side view of an example of a MEMS transducer package according to an embodiment of the present disclosure, mounted for a bottom-port configuration.

FIG. 33a shows an example of a MEMS transducer package 1 which is mounted in what may be referred to as a bottom port mounted configuration, whereby sound is received from a bottom side of the MEMS transducer package, the bottom side of the MEMS transducer package being the side which faces the substrate 30, and which may comprise solder pads 32a and solder 32b for electrical connection to electrical conductors on the host substrate 30.

In the bottom port mounted configuration, the MEMS transducer package 1 is for use with a host substrate 30 that comprises an opening 36 for allowing acoustic signals to reach the transducer element 13, from a bottom side of the host substrate 30.

In the example of FIG. 33a, the MEMS transducer package 1 comprises an acoustic seal ring 31 which is structured to provide a seal between an opening in the acoustic die channel 15 and the transducer element 13. As may be seen more clearly in the perspective view of FIG. 33b, the acoustic seal 31 in this example, encloses the transducer element 13 separately from the opening of the acoustic die channel 15. As such, the transducer element 13 is configured to receive acoustic signals via the aperture 36 in the host substrate 30 and to be acoustically isolated from any acoustic signal in the acoustic channel.

In another example, the acoustic seal 31 of FIG. 33a may be structured such that there is no seal between the acoustic die channel 15 and transducer element 13 (i.e. such that the acoustic seal 31 is similar to that of FIGS. 32a, 2b and 2c). In such an example, the transducer element 13 receives acoustic signals via the opening 36 in the host substrate 30, and via the acoustic die channel 15. Such an embodiment provides for the acoustic addition of the two acoustic signals and may be used for a directional microphone.

Figure 33B:
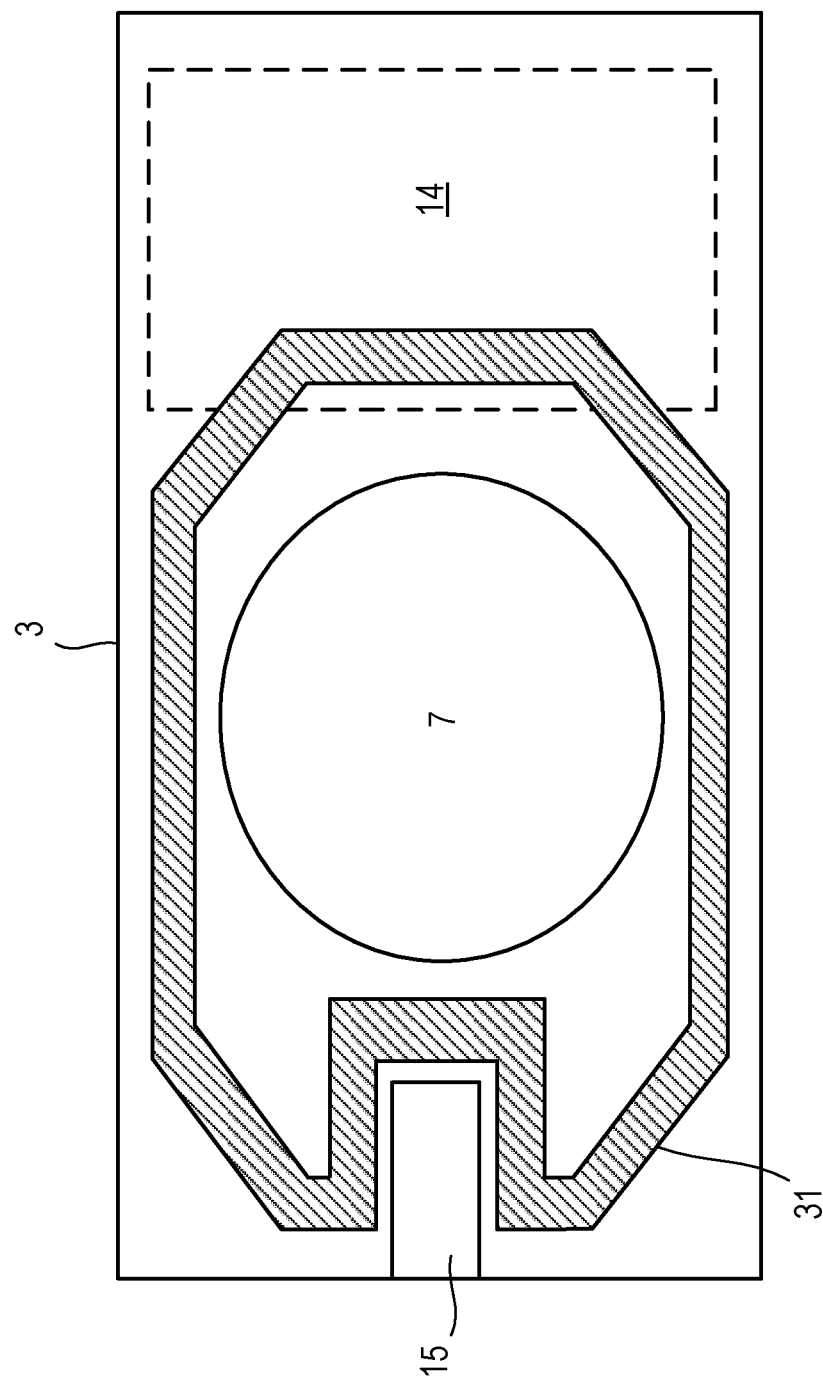

Thus, it can be seen from the above that the same transducer package 1 may be used in a number of different configurations, including a side port configuration such as that illustrated in FIGS. 32a to 32c or in a bottom port configuration as illustrated in FIGS. 33a and 33b.

As mentioned above, the acoustic seal 31 of any of the embodiments described herein, may comprises a conductive portion, for example made of solder, which can function to both connect the MEMS transducer package to a substrate, for example using a solder reflow process, and to provide an electrical connection, for example a ground connection, between the MEMS transducer package 1 and a substrate. The acoustic seal 31 may also comprise a resilient material, for example made from a rubber or silicon material, or some other flexible or compliant material, which can help provide mechanical stress relief between the MEMS transducer package 1 and a substrate onto which the package is mounted. The acoustic seal may also be mounted on a structure which contains a buried layer of flexible material, for providing further stress relief.

In the examples described above, a cross-sectional area of the acoustic die channel 15 is substantially constant along a length of the acoustic channel. By substantially constant, it is noted that this may include the cross-sectional area narrowing slightly due to non-uniformity in etching processes.

It is noted, however, that the shape or profile of the acoustic die channel 15 may be deliberately changed or varied to suit a particular application, for example to provide a desired acoustic property, or a particular acoustic impedance or filtering characteristic. The shapes may be formed, for example, by profiling an edge of a photo resist layer through photolithography and thermal exposure.

The acoustic die channel 15 may also be formed to provide a funnel type shape between its side opening and its internal opening. The acoustic die channel 15 may be configured to comprise other shapes, such as meandering channels, for channeling the acoustic signals towards the transducer element 13.

If the acoustic channel is too narrow, it will present a high acoustic resistance or acoustic inductance. Thus the channel may be tens of microns in lateral dimensions, and may be at least 100 um in one direction (for example 250 um), or more than 10000 square microns in cross-sectional area orthogonal to the direction of air flow.

It is noted that in the examples described herein, the semiconductor die portion 3 may comprise, for example, a silicon die portion.

It is also noted that in the examples described herein, the cap portion 23 may comprise, for example, a semiconductor or silicon cap portion, or a non-silicon laminated wafer, or a molded cap wafer, or a plastic cap portion, or a film or tape layer, or any other form of material. A cap portion made from semiconductor or silicon has an advantage of allowing the cap portion to be formed using wafer-level processing techniques similar to those used for manufacturing the semiconductor die portion, which means that the entire MEMS transducer package can be manufactured and assembled at the same processing site, with the cost advantages of wafer-level batch processing and other advantages such as matching the coefficients of thermal expansion to avoid thermally induced stresses.

Labyrinth Embodiments

Figure 34:
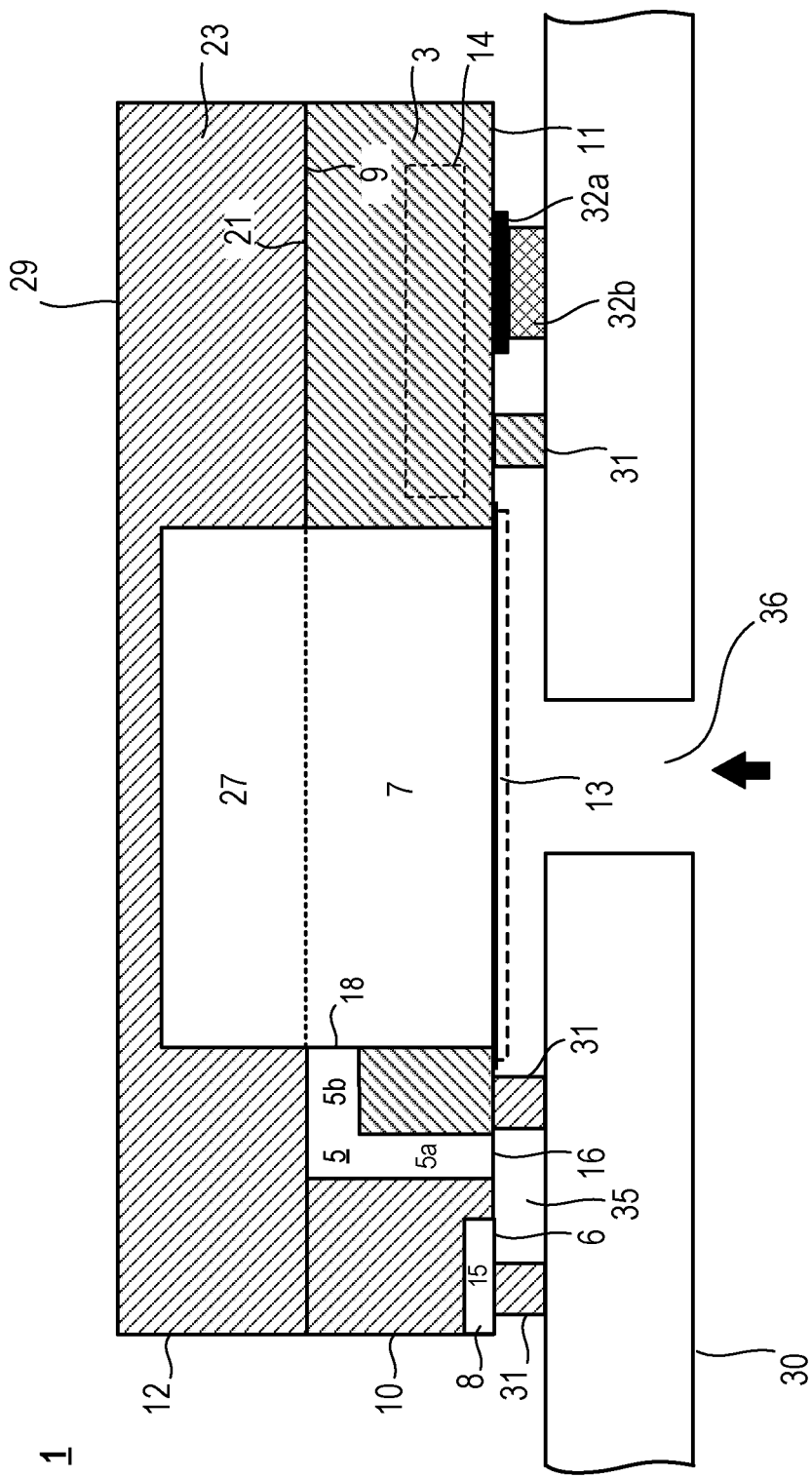
FIG. 34 illustrates a cross-sectional side view of an example of a MEMS transducer package according to an embodiment of the present disclosure.

FIG. 34 shows an example of a MEMS transducer package 1 according to another embodiment of the present disclosure. The example of FIG. 34 is similar to that of FIG. 33a, in so far as a semiconductor die portion 3 comprises a thickness bounded by a first surface 9 and an opposite second surface 11, the second surface 11 incorporating a transducer element 13 (for example a microphone comprising a membrane and back-plate). A die back volume 7 extends through the thickness of the semiconductor die portion 3 between the first surface 9 and the transducer element 13. An acoustic die channel 15 extends into the semiconductor die portion 3 between the second surface 11 and a side surface 10 of the semiconductor die portion 3.

In the example of FIG. 34 the semiconductor die portion 3 comprises a second acoustic channel 5. The second acoustic channel 5 is configured to provide an acoustic path between a third opening 16 in the second surface 11 of the semiconductor die portion 3 and a fourth opening 18 that is in acoustic connection with the die back volume 7.

In the example of FIG. 34, the second acoustic channel 5 comprises a first portion 5a which extends between the first surface 9 and the second surface 11 of the semiconductor die portion 3, and a second portion 5b which extends substantially orthogonal to the first portion 5a. The first portion 5a and the second portion 5b cooperate to provide an acoustic path between the third opening 16 in the second surface 11 of the semiconductor die portion 3 and the fourth opening 18 that is acoustically coupled to the die back volume 7.

The MEMS transducer package 1 may be mounted on a host substrate 30 comprising an aperture 36, which functions as a bottom port to allow sound or pressure waves to be received by the transducer element 13. The transducer package may further comprise an acoustic seal structure 31 for coupling the MEMS transducer package 1 to the host substrate 30. In the example of FIG. 34 the acoustic seal structure 31 is configured similar to that of FIG. 33b above, such that a first opening 6 formed by the acoustic die channel 15 and a third opening 16 formed by the second acoustic channel 5 lie between a first seal boundary, and the transducer element 13a second seal boundary.

Therefore, in use, the transducer element 13 of the example of FIG. 34 will receive first acoustic signals on its front side via the bottom port 36 of the substrate 30, and second acoustic signals via the fourth opening 18 (i.e. via the side port formed from the second opening 8 to the fourth opening 18 via the acoustic die channel 15, sealed volume 35, and the second acoustic channel 5). The acoustic channels 15, 5 act as a tortuous path so as to delay the second acoustic signals compared to the first acoustic signals, thereby enabling the MEMS transducer package 1 to provide directivity to a received acoustic signal. The labyrinth, i.e. tortuous, acoustic channel (i.e. acoustic path provided via the acoustic channels 15, 5) may also be used to tune the resonance of the channel acoustic impedance with the acoustic capacitance of the back volume. Another possible use is that of a low-pass function of the labyrinth acoustic channel, possibly coupled directly to the back volume 7, for preventing low frequencies, for example wind noise, into the back volume thereby providing some passive wind noise rejection.

In the example of FIG. 34, it can be seen that the acoustic channels are provided entirely within the semiconductor die portion 3. In particular, the second opening 8 is formed entirely in a side surface 10 of the semiconductor die portion 3. The fourth opening 18 is formed such that the second acoustic channel 5 is acoustically coupled directly to the die back volume 7. In the embodiment of FIG. 34 the fourth opening 18 is wholly formed in a side surface of the semiconductor die portion which opens into the die back volume 7.

Figure 35:
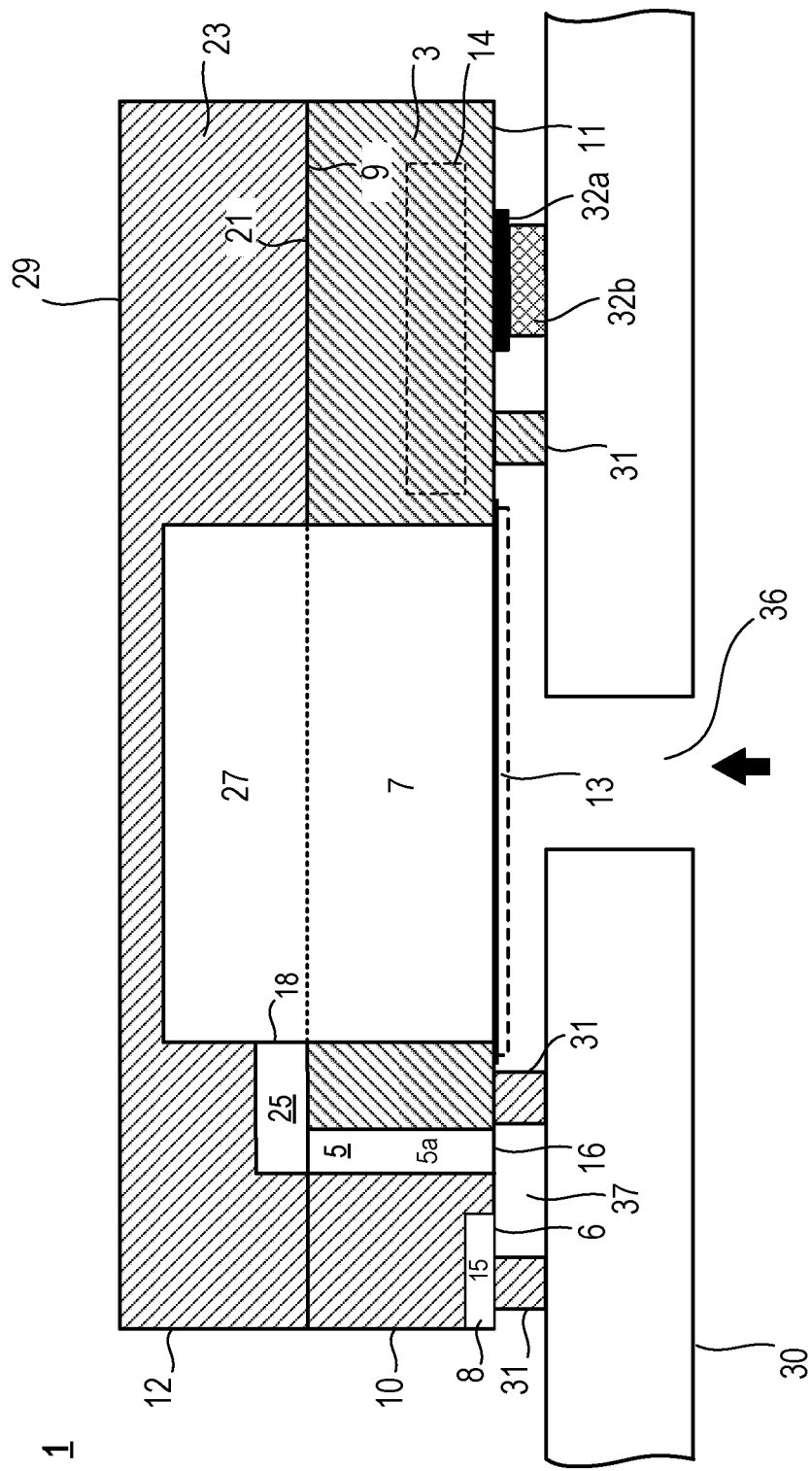
FIG. 35 illustrates a cross-sectional side view of an example of a MEMS transducer package according to an embodiment of the present disclosure.

It is noted that the acoustic channels for providing the second acoustic signals may be formed in other ways. For example, FIG. 35 shows an example similar to FIG. 34, but wherein the semiconductor die portion 3 comprises an acoustic die channel 15, but wherein the second acoustic channel is formed in the cap portion 23. In this embodiment the second acoustic channel comprises a first portion 5a which extends between the first surface 9 and the second surface 11 of the semiconductor die portion 3, and a second portion 25 formed in the cap portion 23, the second portion 25 extending substantially orthogonal to the first portion 5a. The second portion 25 may be etched in the second surface of the cap portion 23, for example while etching a cap back volume 27. The first portion 5a and the second portion 25 of the second acoustic channel cooperate to provide an acoustic path between the third opening 16 in the second surface 11 of the semiconductor die portion 3 and the fourth opening 18 that is acoustically coupled to the die back volume 7 (in this embodiment via the cap back volume 27). In the embodiment of FIG. 35 the fourth opening 18 is partly wholly in a side surface of the cap portion which opens into the cap back volume 27.

Figure 36:
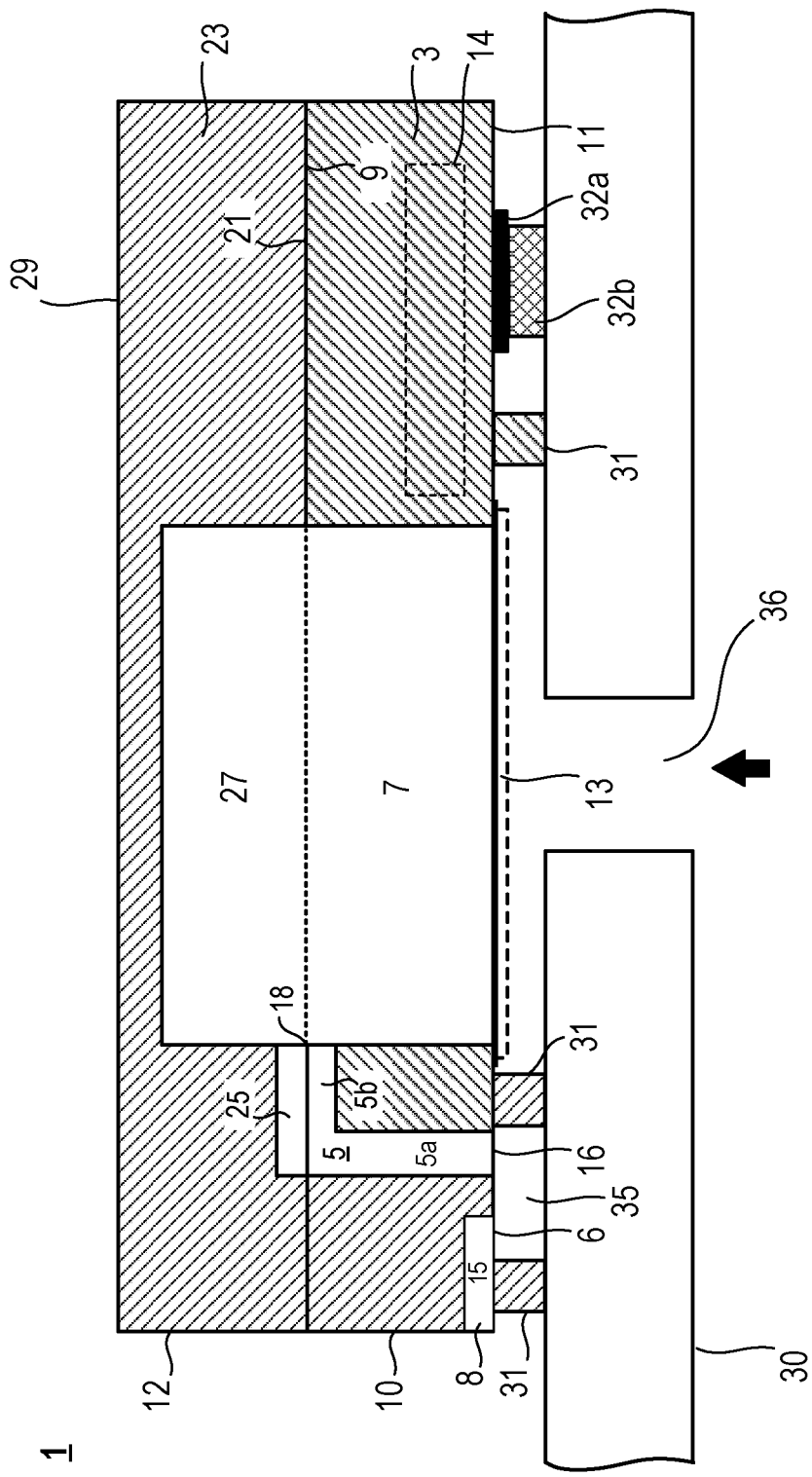
FIG. 36 illustrates a cross-sectional side view of an example of a MEMS transducer package according to an embodiment of the present disclosure.

FIG. 36 shows another example similar to FIG. 34, but wherein the semiconductor die portion 3 comprises an acoustic die channel 15, but wherein the second acoustic channel is formed partly in the semiconductor die portion 3 and partly in the cap portion 23. In this embodiment the second acoustic channel comprises a first portion 5a which extends between the first surface 9 and the second surface 11 of the semiconductor die portion 3, and a second portion 5b/25. The second portion is partly formed in the cap portion 23 and partly in the semiconductor die portion 3. The second portion 5b/25 extends substantially orthogonal to the first portion 5a. The first portion 5a and the second portion 5b/25 of the second acoustic channel cooperate to provide an acoustic path between the third opening 16 in the second surface 11 of the semiconductor die portion 3 and the fourth opening 18 that is acoustically coupled to the die back volume 7 (in this embodiment partly via the cap back volume 27). In the embodiment of FIG. 36 the fourth opening 18 is partly formed in a side surface of the cap portion 23 which opens into the cap back volume 27, and partly formed in a side surface of the semiconductor die portion which opens into the die back volume 7.

Thin Film Cap

Figure 37:
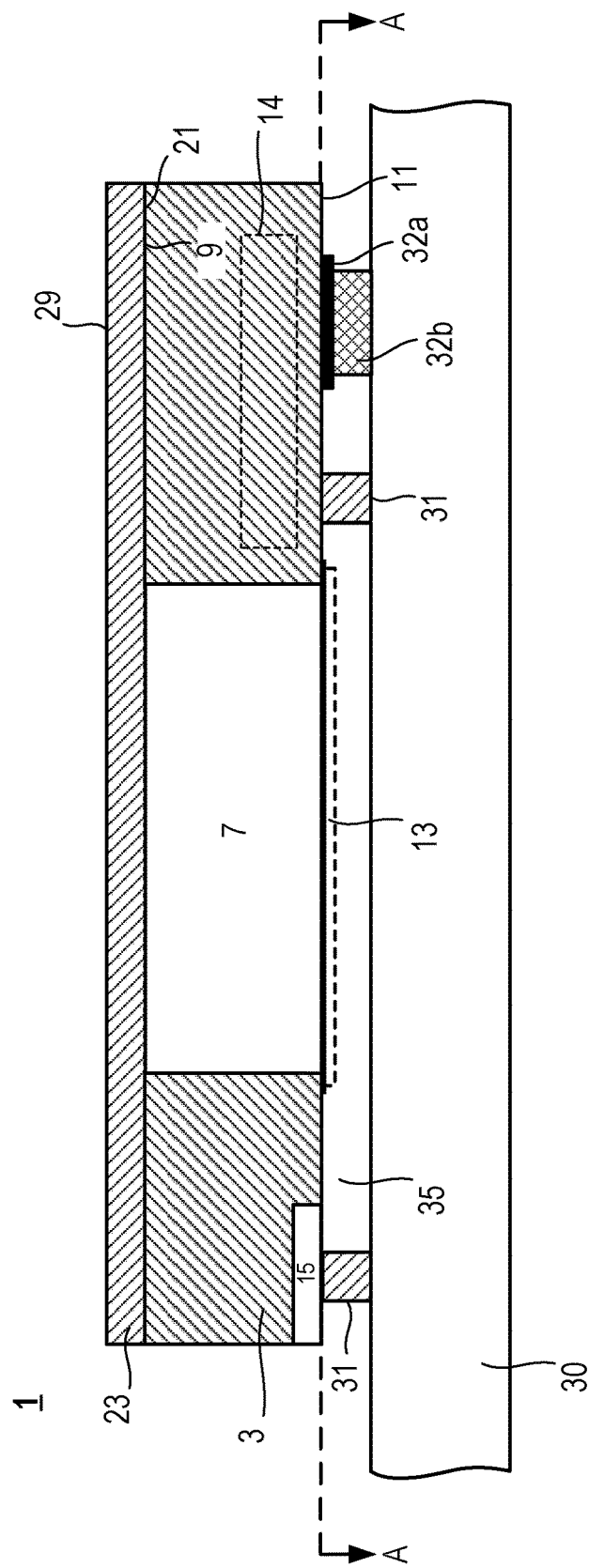
FIG. 37 illustrates a cross-sectional side view of an example of a MEMS transducer package according to an embodiment of the present disclosure.

Referring to FIG. 37, according to one embodiment, the cap portion 23 comprises a thin film or tape. This film may be a die attach film (DAF) which may be elastic and may be stretched during the package singulation process to assist the separation of the structures. Alternatively it may be some other suitable film or tape material. This embodiment, although not having a cap back volume, has the advantage of providing a low cost MEMS transducer package. Such an embodiment may be used, for example, where low cost microphone devices are required, or where the size of a back volume is not a significant factor on the operation of the MEMS transducer, or for space-sensitive applications where the reduced overall height is important. A cap portion of this tape/film type may be used with any of the other embodiments described herein.

Stepped Back Volumes

Figure 38:
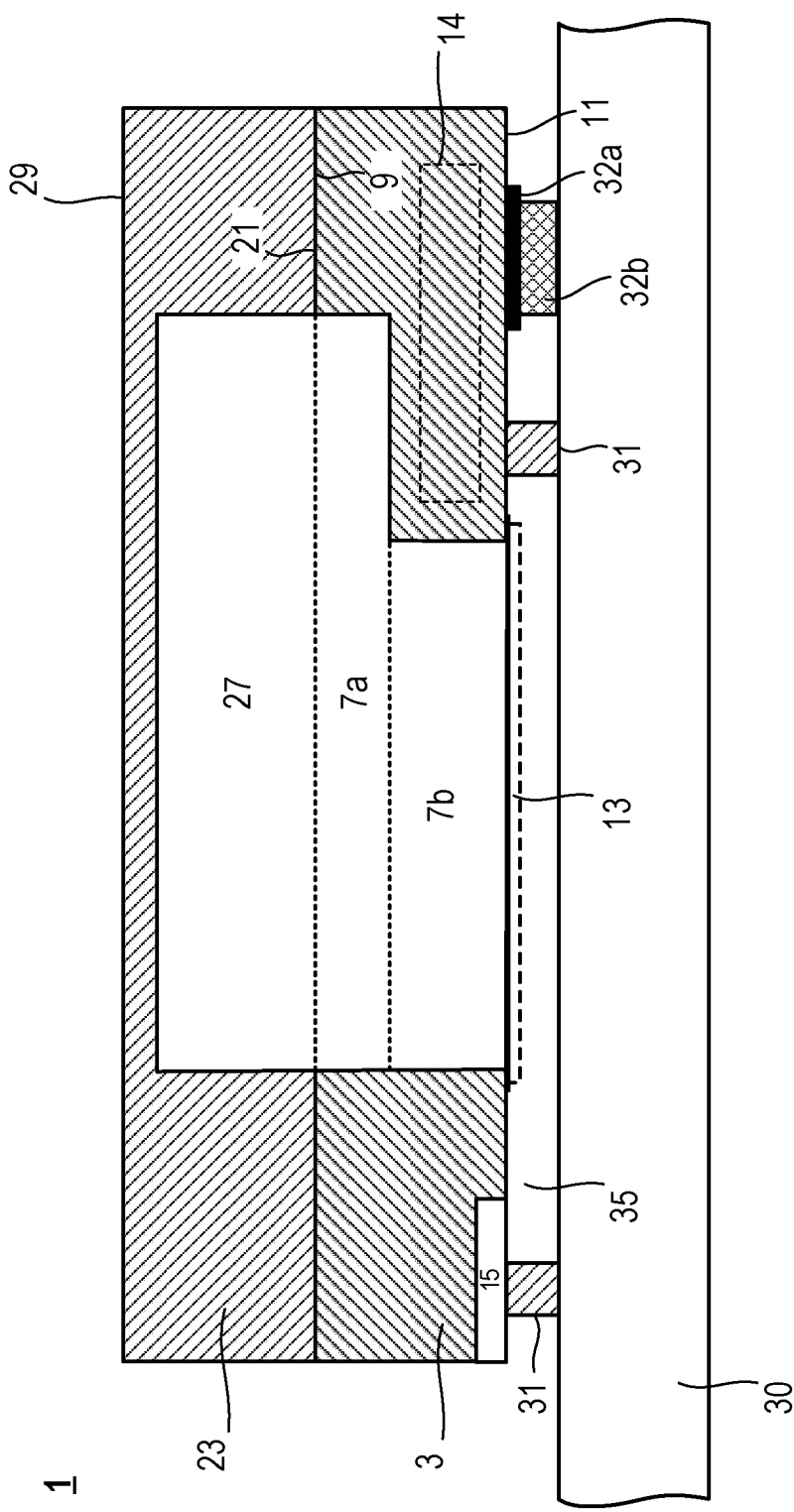
FIG. 38 illustrates a cross-sectional side view of an example of a MEMS transducer package according to an embodiment of the present disclosure.

Referring to FIG. 38, according to one embodiment, a die back volume 7 comprises a stepped back volume 7a/7b. For example, the stepped back volume may comprise at least one discontinuity along a sidewall of the stepped back volume, between the first surface 9 and the second surface 11 of the semiconductor die portion 3.

In one example, the stepped back volume comprises a first sub-volume 7a adjacent to the first surface 9 of the semiconductor die portion 3 and a second sub-volume 7b adjacent to the transducer 13. The first and second sub-volumes 7a, 7b may abut as shown (that is to form a single back volume). A lateral dimension of the first sub-volume 7a may be greater than a corresponding lateral dimension of the second sub-volume 7b. The lateral dimension of the second sub-volume may correspond to that of the transducer 13, whereas the lateral dimension of the first sub-volume is not so constrained.

In one example, a cross-sectional area of the die back volume 7 and a cross-sectional area of the cap back volume 27 are substantially the same at a plane where they meet. In other examples, a cross-sectional area of the die back volume 7 is smaller than the cross-sectional area of the cap back volume 27 at a plane where they meet. In other examples a cross-sectional area of the die back volume 7 is greater than the cross-sectional area of the cap back volume 27 at a plane where they meet.

Although the embodiment of FIG. 38 shows the stepped sidewall extending in one lateral direction, it is noted that the stepped sidewall may also extend in another lateral direction.

Furthermore, although the respective sub-volumes are shown as comprising sidewalls that are substantially orthogonal to the first surface 9 of the semiconductor die portion 3, it is noted that the sidewalls of any sub-volume portion may be sloped with respect to the first surface 9 of the semiconductor die portion 3.

The use of a stepped back volume thus has an advantage of enabling the overall volume of the back volume to be increased for a given thickness between the first surface 9 and second surface 11 for a given size of transducer. It is noted that one or more further stepped portions may be provided.

It is noted that a cap portion 23, when comprising a cap back volume 27, may also comprise a stepped cap back volume 27. The stepped cap back volume 27 of the cap portion 23 may comprise any of the characteristics noted above relating to the sub-volumes 7a and 7b of the stepped die back volume 7. In an embodiment having a molded cap portion, this may provide a greater design freedom compared to a silicon cap portion.

It is noted that a stepped die back volume and stepped cap back volume may be used in any of the embodiments described herein that comprise a back volume.

X2 ICP Embodiments

Figure 39:
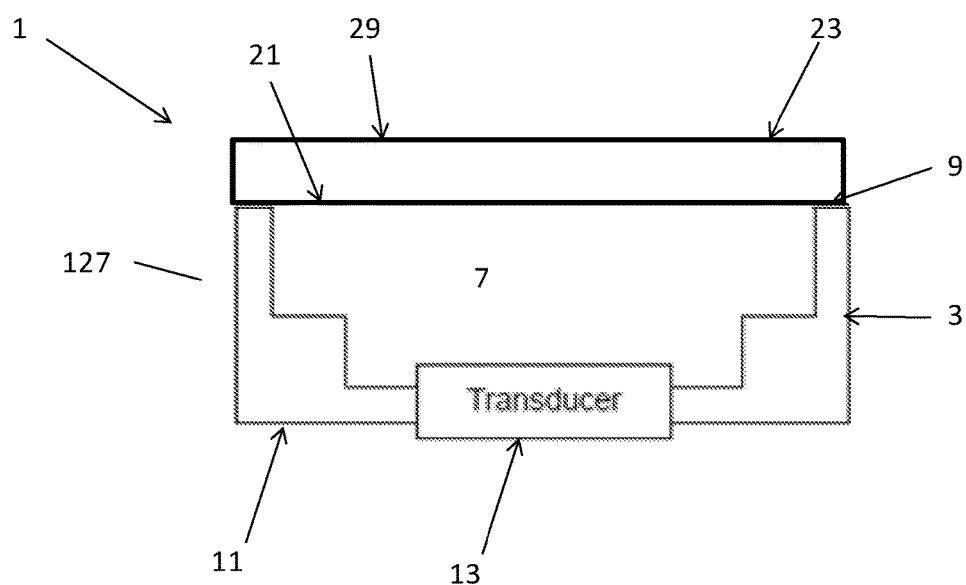
FIG. 39 illustrates a MEMS transducer package according to an embodiment of the present disclosure.
Figure 40:
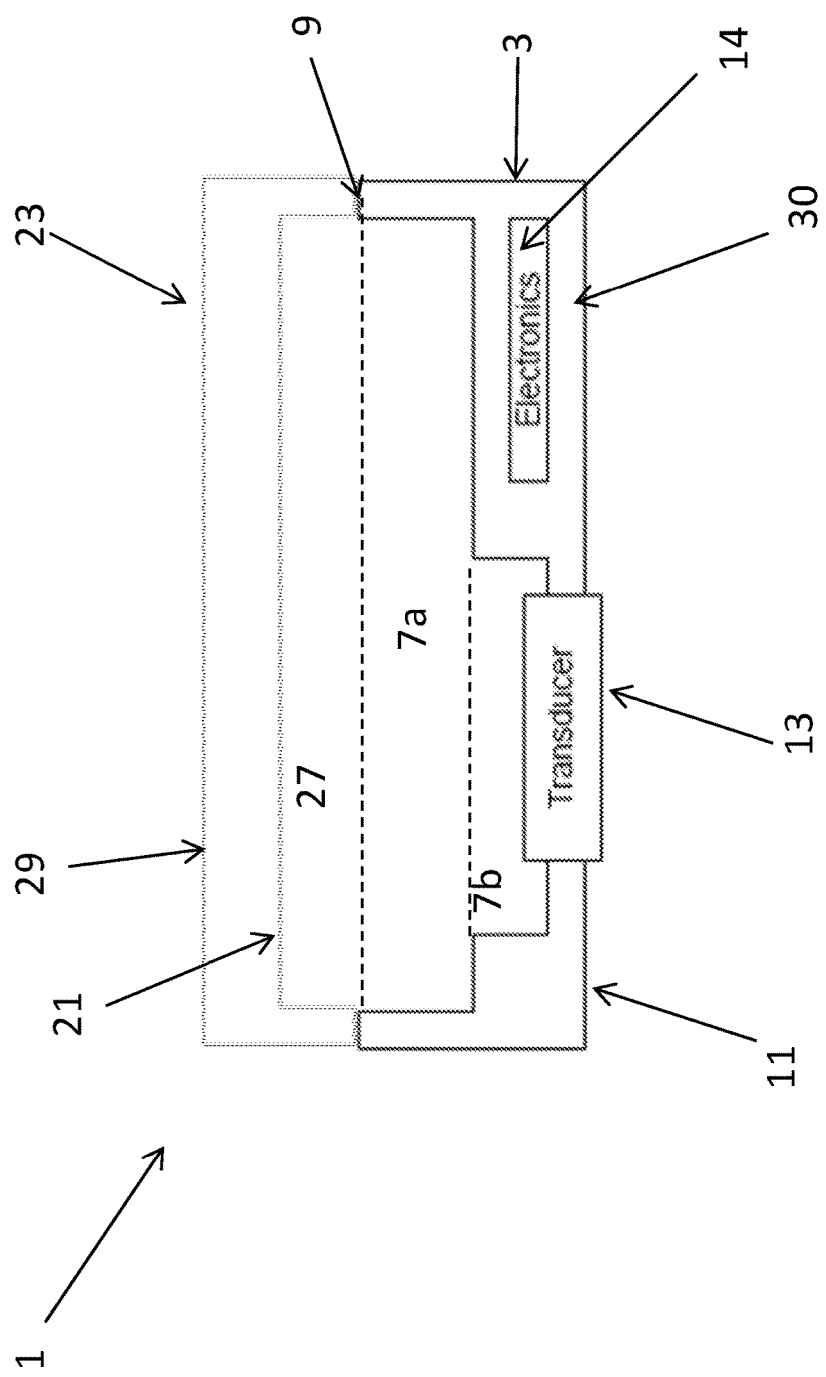
FIG. 40 illustrates a MEMS transducer package according to an embodiment of the present disclosure.

FIG. 39 shows a MEMS transducer package 1 consisting of a semiconductor die portion 3 having a thickness bounded by a first surface 9 and an opposite second surface 11 having a transducer element 13 incorporated therein. The MEMS transducer package further consists of a die back volume 7 that extends through the thickness of the semiconductor die portion 3 between the first surface 9 and the transducer element 13 and a cap portion 23 that abuts the semiconductor die portion (3) at the first surface (9). The cap portion 23 has a thickness bounded by a first surface 29 and an opposite second surface 21. FIG. 40 shows another MEMS transducer package 1, wherein the second surface 21 of the cap portion 23 has a cap back volume 27 which extends from the second surface 21 of the cap portion 23 partially into the thickness of the cap portion 23. And the die back volume (7) and the cap back volume (27) acoustically connect.

As seen in both FIGS. 39 and 40, the first surface (9) of the semiconductor die portion and the second surface (21) of the cap portion (23) are equal in size. In addition to the transducer package of FIG. 39, the transducer package of FIG. 40 has a circuitry portion 30 with a circuit thickness allocated in the semiconductor die portion 3 in proximity of the transducer element 13. The circuitry portion 30 comprises an integrated electronic circuitry 14 for operating the MEMS transducer element 13.

Furthermore, in FIG. 40, the die back volume 7 consists of a first sub-volume 7a with a first cross-section in a plane transverse to the thickness of the semiconductor die portion 3 and a second sub-volume 7b with a second cross-section in a plane transverse to the thickness of the semiconductor die portion 3. The first cross-section is larger than the second cross-section and the thickness of the second sub-volume 7b is equal or larger than the circuit thickness. The first cross-section of the first sub-volume 7a extends over the transducer element 13 and the circuit portion 30.

The second surface 11 of the semiconductor die portion may comprise lead, i.e. solder, pads 32a for electrical connection to electrical conductors on the substrate 30 via solder 32b for example. Respective solder pads 32a may be connected via electrical pathways, such as vias and conductive traces (not illustrated), so as to provide power (V+ and ground potentials) to the transducer and to output a signal from the transducer for example: other solder pads and operative connections may be required as needed and as would be understood by those skilled in the art. Advantageously, the solder pads 32a may be formed from the metal layers associated with the formation of the MEMS backplate and membrane metal electrodes or some other MEMS metal processing layer as opposed to the metal layers associated with the processing of the integrated electronic circuitry. Therefore, the solder pads 32b and associated metal, i.e. conductive, traces to/from the transducer, including any electronic circuitry if present, may be considered a re-distribution layer. Therefore a MEMS package as herein described with a metal layer for solder pads 32a formed during the MEMS transducer metal formation is advantageous in re-distributing the solder pads to various areas of the MEMS transducer which may be over the area where the circuitry is formed, if present.

Figure 41:
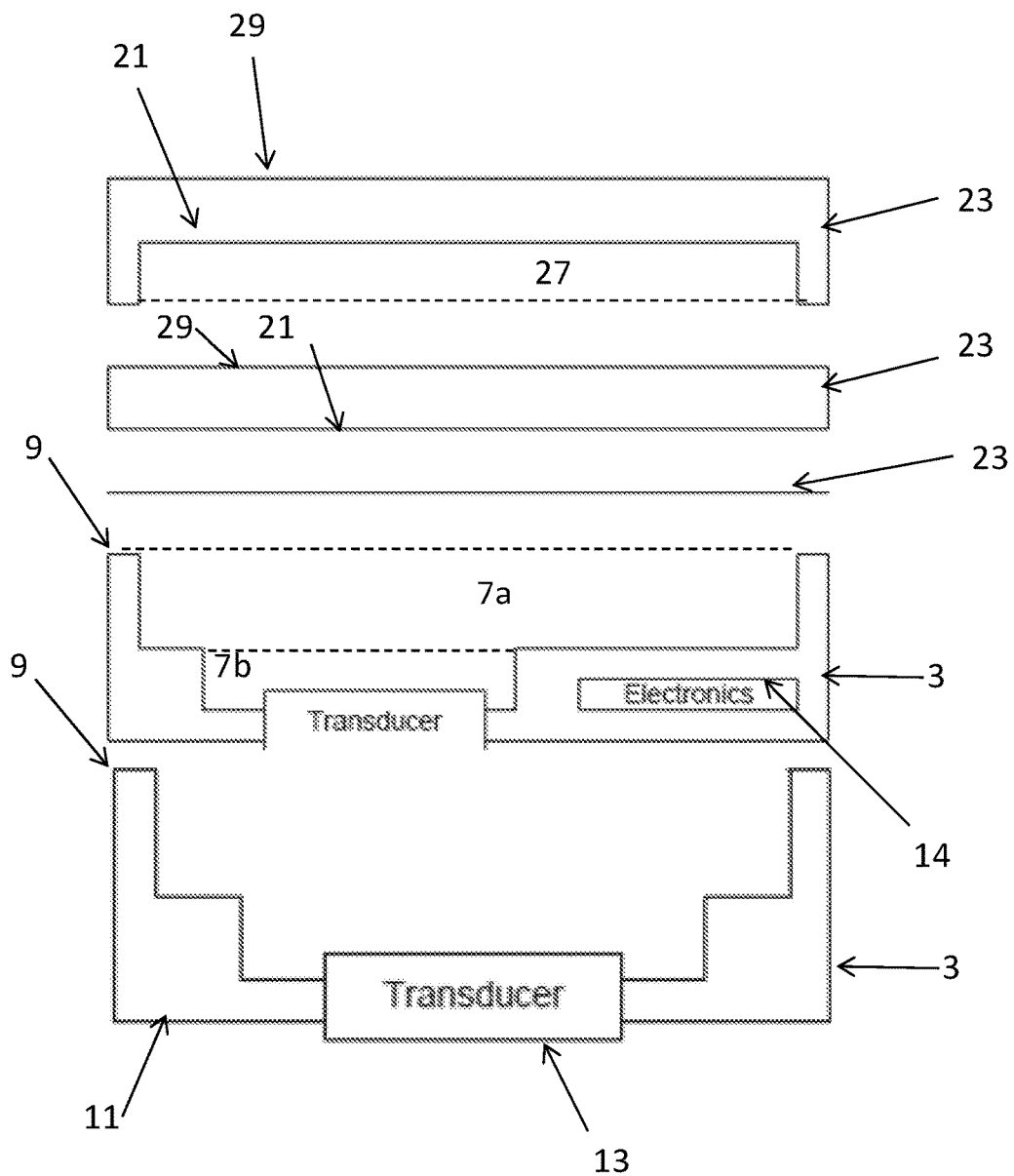
FIG. 41 illustrates a MEMS transducer package according to an embodiment of the present disclosure.

In FIG. 41, two different embodiments of semiconductor die portions 3 are shown, similar to those of FIGS. 39 and 40. It further shows three different embodiments of cap portions 23 that can be joined with each of the semiconductor portions 3 respectively.

It is also noted that in the examples described herein, the cap portion 23 may comprise, for example, a semiconductor or silicon cap portion, or a non-silicon laminated wafer, or a molded cap wafer, or a plastic cap portion, or a film or tape layer, or any other form of material. A cap portion made from semiconductor or silicon has an advantage of allowing the cap portion to be formed using wafer-level processing techniques similar to those used for manufacturing the semiconductor die portion, which means that the entire MEMS transducer package can be manufactured and assembled at the same processing site, with the cost advantages of wafer-level batch processing and other advantages such as matching the coefficients of thermal expansion to avoid thermally induced stresses.

Stepped Back Volumes

Referring to FIGS. 39 and 40, according to one embodiment, a die back volume 7 comprises a stepped back volume 7a/7b. For example, the stepped back volume may comprise at least one discontinuity along a sidewall of the stepped back volume, between the first surface 9 and the second surface 11 of the semiconductor die portion 3.

In one example, the stepped back volume comprises a first sub-volume 7a adjacent to the first surface 9 of the semiconductor die portion 3 and a second sub-volume 7b adjacent to the transducer 13. The first and second sub-volumes 7a, 7b may abut as shown (that is to form a single back volume). A lateral dimension of the first sub-volume 7a may be greater than a corresponding lateral dimension of the second sub-volume 7b. The lateral dimension of the second sub-volume may correspond to that of the transducer 13, whereas the lateral dimension of the first sub-volume is not so constrained.

In one example, a cross-sectional area of the die back volume 7 and a cross-sectional area of the cap back volume 27 are substantially the same at a plane where they meet. In other examples, a cross-sectional area of the die back volume 7 is smaller than the cross-sectional area of the cap back volume 27 at a plane where they meet. In other examples a cross-sectional area of the die back volume 7 is greater than the cross-sectional area of the cap back volume 27 at a plane where they meet.

Although the embodiment of FIG. 40 shows the stepped sidewall extending in one lateral direction, it is noted that the stepped sidewall may also extend in another lateral direction.

Furthermore, although the respective sub-volumes are shown as comprising sidewalls that are substantially orthogonal to the first surface 9 of the semiconductor die portion 3, it is noted that the sidewalls of any sub-volume portion may be sloped with respect to the first surface 9 of the semiconductor die portion 3.

The use of a stepped back volume thus has an advantage of enabling the overall volume of the back volume to be increased for a given thickness between the first surface 9 and second surface 11 for a given size of transducer. It is noted that one or more further stepped portions may be provided.

It is noted that a cap portion 23, when comprising a cap back volume 27, may also comprise a stepped cap back volume 27. The stepped cap back volume 27 of the cap portion 23 may comprise any of the characteristics noted above relating to the sub-volumes 7a and 7b of the stepped die back volume 7. In an embodiment having a molded cap portion, this may provide a greater design freedom compared to a silicon cap portion.

It is noted that a stepped die back volume and stepped cap back volume may be used in any of the embodiments described herein that comprise a back volume.

Figure 42:
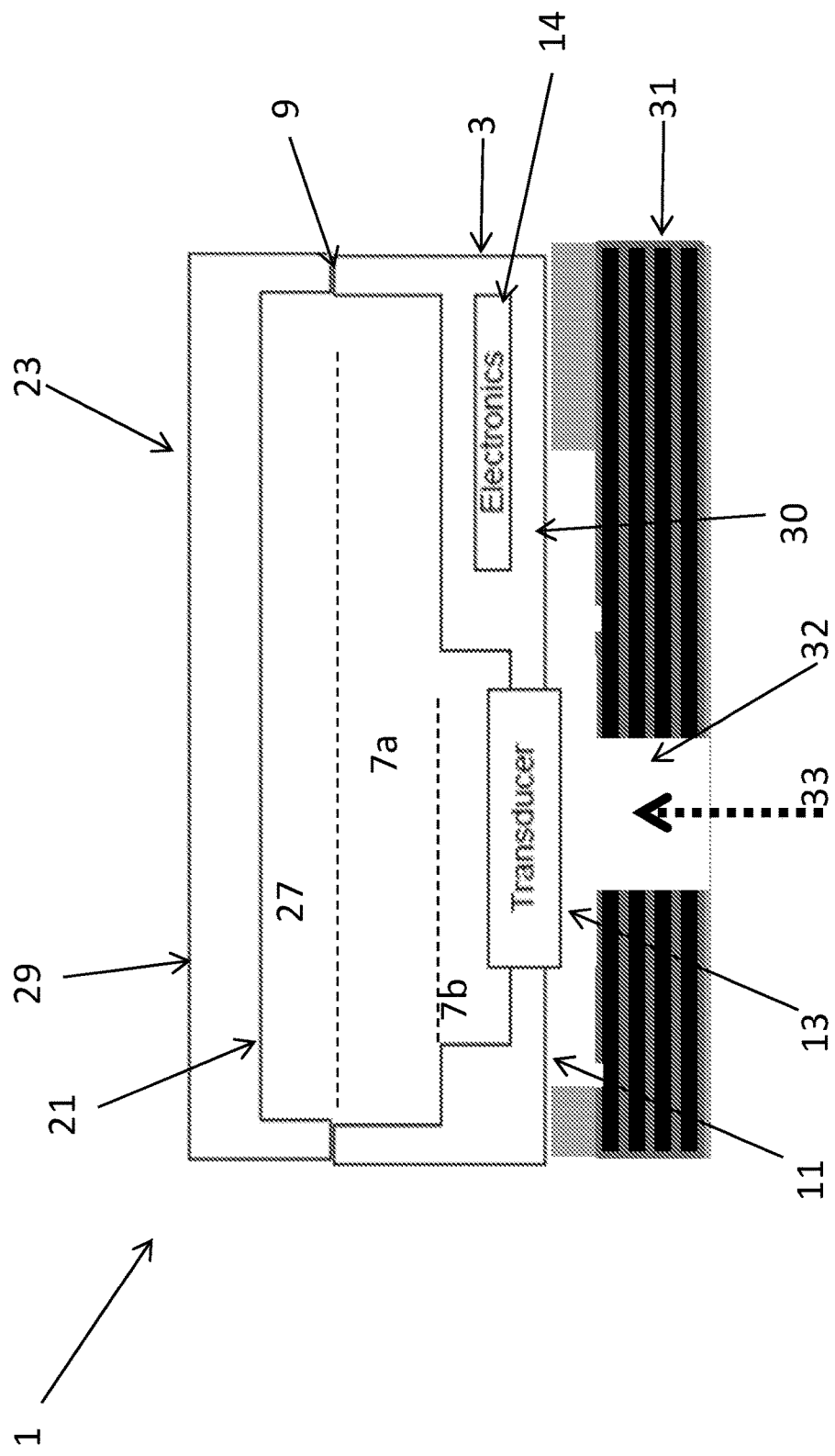
FIG. 42 illustrates a MEMS transducer package according to an embodiment of the present disclosure.

FIG. 42 shows a MEMS transducer device comprising a MEMS transducer package 1 as described above and a substrate 31 provided with a bottom port 32. In this embodiment, the MEMS transducer package 1 is mounted on the substrate 31 and acoustically connected to the bottom port 32. The bottom port 32 provides a sound path 33 allowing sound to travel to and impinge on the transducer element 13.

MEMS transducer packages are fabricated by thousands at a time on a single die wafer. Such a wafer can be directly capped by a cap portion. Thereby obtaining a wafer level package comprising a semiconductor substrate 3 comprising a MEMS microphone and a circuitry portion in proximity of the transducer element 13 and a cap portion 23 attached to said substrate. The circuitry portion comprises the integrated electronic circuitry 14 for operating the MEMS transducer element 13.

In another embodiment, the semiconductor die substrate 3 may comprise a MEMS microphone transducer element 13, a back volume 7, integrated electronic circuitry 14 for operating the MEMS transducer element 13, and a cap portion (23) attached to said substrate (3). In this embodiment, the back volume 7 has a first sub-volume 7a with a cross-section that in a lateral dimension covers the transducer element 13 and at least partially covers the integrated electronic circuitry 14.

In one embodiment there is provided a MEMS transducer package comprising a semiconductor die element 3 and a cap element 23, wherein the semiconductor die element 3 and cap element 23 have mating surfaces 9, 21. The semiconductor die element 3 and cap element 23 are configured such that when the semiconductor die element 3 and cap element 4 are conjoined: a first volume is formed through the semiconductor die element 3 and into the semiconductor cap element 23; and an acoustic channel is formed to provide an opening between a non-mating surface 11 of the semiconductor die element 3 and either a side surface 10, 12 of the transducer package or a non-mating surface 29 of the cap element 23.

In another embodiment, there is provided a MEMS transducer package comprising: a semiconductor die portion 3 having a thickness wherein the thickness spans a first surface 9 and a second surface 11, the second surface incorporating a transducer element 13; an aperture 7 that extends through the thickness of the semiconductor die portion 3 between the first surface and the transducer element 13; and an acoustic channel 15 that is separate from the aperture 7 and that extends through the thickness of the semiconductor die portion 3.

According to another embodiment, there is provided a wafer level package comprising a semiconductor substrate 3 comprising a MEMS microphone, and a cap portion 23, wherein an acoustic channel extends through at least said substrate 3.

According to another embodiment, there is provided a wafer level package comprising a semiconductor substrate 3 comprising a MEMS microphone, and a cap portion 23, wherein an acoustic channel extends through said substrate 3 and said cap portion 23.

According to another embodiment, there is provided a chip scale package comprising a semiconductor substrate 3 comprising a MEMS microphone and a cap portion 23, wherein an acoustic channel extends through at least said substrate 3.

In the embodiments described above it is noted that references to a transducer element may comprise various forms of transducer element. For example, a transducer element may comprise a single membrane and back-plate combination. In another example a transducer element comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprises different individual transducers positioned to receive acoustic signals from different acoustic channels.

It is noted that in the embodiments described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. However, it is noted that the embodiments are also intended to embrace the output signal being derived by monitoring piezo-resistive or piezo-electric elements or indeed a light source. The embodiments are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is also noted that one or more further portions may be added to an embodiment described above, i.e. in addition to the die portion 3 and cap portion 23. Such a portion, if present, may comprise an acoustic channel which cooperates with an acoustic channel(s) in the die portion and/or cap portion, to provide a desired sound port. For example, in an example where a die portion is provided to incorporate a transducer element, an integrated circuit portion to incorporate an integrated circuit, and a cap portion to form a cap, one or more of these portions may comprise acoustic channel(s) to provide a sound port as described herein.

It should be noted that the above-mentioned embodiments illustrate rather than limit the disclosure, and that those skilled in the art will be able to design many alternative embodiments without departing from the scope of the appended claims. The word "comprising" does not exclude the presence of elements or steps other than those listed in a claim, "a" or "an" does not exclude a plurality, "or" does not exclude "and", and a single processor or other unit may fulfil the functions of several units recited in the claims. Any reference signs in the claims shall not be construed so as to limit their scope.

The invention claimed is:

1. A MEMS transducer package comprising:
   a semiconductor die portion having a thickness bounded by a first surface and an opposite second surface;
   a transducer element incorporated in the second surface;
      a die back volume that extends through the thickness of the semiconductor die portion between the first surface and the transducer element; and
      an acoustic die channel that extends through the thickness of the semiconductor die portion between the first surface and the second surface.

2. A MEMS transducer package as claimed in claim 1, further comprising a cap portion that abuts the semiconductor die portion, the cap portion comprising:
   a thickness bounded by a first surface and an opposite second surface; and
   an acoustic cap channel that extends through the thickness of the cap portion between the first surface and the second surface.

3. A MEMS transducer package as claimed in claim 2, wherein the second surface of the cap portion abuts a first surface of the semiconductor die portion.

4. A MEMS transducer package as claimed in claim 2, wherein an opening formed by the acoustic die channel in the first surface of the semiconductor die portion at least partially overlaps with an opening formed by the acoustic cap channel in the cap portion, to provide an acoustic path through the transducer package.

5. A MEMS transducer package as claimed in claim 4, wherein the opening formed by the acoustic die channel and the opening formed by the acoustic cap channel are aligned.

6. A MEMS transducer package as claimed in claim 2, wherein a cross-sectional area of the acoustic die channel and/or a cross-sectional area of the acoustic cap channel is constant along a length of the respective acoustic channel.

7. A MEMS transducer package as claimed in claim 2, wherein a cross-sectional area of the first acoustic channel and/or a cross-sectional area of the second acoustic channel varies along a length of the respective acoustic channel.

8. A MEMS transducer package as claimed in claim 1, wherein the acoustic die channel comprises:
   a first portion that extends through the thickness of the semiconductor die portion to provide an acoustic path between the first surface and the second surface of the semiconductor die portion; and
   a second portion which extends parallel to the first surface of the semiconductor die portion.

9. A MEMS transducer package as claimed in claim 8, wherein the first portion and the second portion cooperate to provide an acoustic path between a first opening and a second opening, the first opening formed by the first portion in the second surface of the semiconductor die portion, and the second opening formed by the second portion in a side surface of the semiconductor die portion.

10. A MEMS transducer package as claimed in claim 8, wherein the second portion of the acoustic die channel forms an opening in the first surface of the semiconductor die portion.

11. A MEMS transducer package as claimed in 8, further comprising a cap portion comprising a thickness bounded by a first surface and an opposite second surface, wherein the second surface of the cap portion abuts the first surface of the semiconductor die portion.

12. A MEMS transducer package as claimed in claim 11, wherein the cap portion comprises an acoustic cap channel.

13. A MEMS transducer package as claimed in claim 12, wherein the acoustic cap channel interfaces with the acoustic die channel to provide an acoustic path between a first opening formed in the second surface of the semiconductor die portion and a second opening formed in a side surface of the transducer package.

14. A MEMS transducer package as claimed in claim 13 wherein the second opening is partly formed in a side surface of the semiconductor die portion and partly formed in a side surface of the cap portion.

15. A MEMS transducer package as claimed in claim 14, wherein a side surface of the semiconductor die portion and/or cap portion is orthogonal to the first surface of the semiconductor die portion.

16. A MEMS transducer package as claimed in claim 1, further comprising a cap portion, the cap portion comprising:
   a thickness bounded by a first surface and an opposite second surface; and
   an acoustic cap channel configured to provide an acoustic path between a first opening in the second surface of the cap portion and a second opening in a side surface of the cap portion.

17. A MEMS transducer package as claimed in claim 16, wherein the acoustic cap channel interfaces with the acoustic die channel to provide an acoustic path between a first opening formed by the acoustic die channel in the second surface of the semiconductor die portion and a second opening formed by the acoustic cap channel in a side surface of the cap portion.

18. A MEMS transducer package as claimed in claim 1, wherein the acoustic die channel comprises:
   a first acoustic channel, and
   a second acoustic channel.

19. A MEMS transducer package as claimed in claim 18 wherein:
   wherein the first acoustic channel is configured to provide an acoustic path between a first opening in the second surface of the semiconductor die portion and a second opening in a side surface of the transducer package, the side surface being orthogonal to the second surface of the semiconductor die portion; and
   wherein the second acoustic channel is configured to provide an acoustic path between a third opening in the second surface of the semiconductor die portion and a fourth opening that is in acoustic connection with the die back volume.

20. A MEMS transducer package as claimed in claim 19, wherein the first acoustic channel comprises:
   at least a first portion which extends between the first surface and the second surface of the semiconductor die portion.

21. A MEMS transducer package as claimed in claim 20, wherein the first acoustic channel further comprises:
   a second portion which extends orthogonal to the first portion; and
   wherein the first portion and the second portion cooperate to provide an acoustic path between the first opening in the second surface of the semiconductor die portion and the second opening in the side surface of the semiconductor die portion.

22. A MEMS transducer package as claimed in claim 19, wherein the second acoustic channel comprises:
at least a first portion which extends between the first surface and the second surface of the semiconductor die portion.

23. A MEMS transducer package as claimed in claim 22, wherein the second acoustic channel further comprises:
a second portion which extends orthogonal to the first portion; and
wherein the first portion and the second portion cooperate to provide an acoustic path between the third opening in the second surface of the semiconductor die portion and the fourth opening that is in acoustic connection with the die back volume.

24. A MEMS transducer package as claimed in claim 19, wherein the second opening is formed entirely in a side surface of the semiconductor die portion.

25. A MEMS transducer package as claimed in claim 18, further comprising a cap portion, the cap portion comprising a thickness bounded by a first surface and an opposite second surface.

26. A MEMS transducer package as claimed in claim 25, wherein the cap portion comprises an acoustic cap channel.

27. A MEMS transducer package as claimed in claim 26, wherein the acoustic cap channel comprises:
a first acoustic channel which extends orthogonal to the second surface of the cap portion; and
wherein the first acoustic channel of the acoustic cap channel and the first acoustic channel of the acoustic die channel cooperate to provide an acoustic path between a first opening in the second surface of the semiconductor die portion and a second opening in the side surface of the transducer package.

28. A MEMS transducer package as claimed in claim 27, wherein the second opening is formed either entirely in a side surface of the cap portion, or partly in a side surface of the cap portion and partly in a side surface of the semiconductor die portion.

29. A MEMS transducer package as claimed in claim 26, wherein the cap portion further comprises a cap back volume, and wherein the acoustic cap channel comprises:
a second acoustic channel which extends orthogonal to the second surface of the cap portion; and
wherein the second acoustic channel of the acoustic cap channel and the second acoustic channel of the acoustic die channel cooperate to provide an acoustic path between a third opening in the second surface of the semiconductor die portion and a fourth opening in acoustic connection with the cap back volume.

30. A MEMS transducer package as claimed in claim 29, wherein the fourth opening is formed either entirely in direct acoustic connection with the cap back volume of the cap portion, or partly in direct acoustic connection with the cap back volume of the cap portion and partly in direct acoustic connection with the die back volume of the semiconductor die portion.

31. A MEMS transducer package as claimed in claim 1, wherein the semiconductor die portion further comprises integrated electronic circuitry for operating the MEMS transducer element; wherein at least part of the integrated electronic circuitry is positioned in a thickness of the semiconductor die portion that is bounded by at least part of a first sub-volume of a stepped die back volume and a second surface of the semiconductor die portion.

32. A MEMS transducer package as claimed in claim 1, further comprising an acoustic seal, wherein the acoustic seal is configured to:
surround an opening of the acoustic die channel and an opening of die back volume; or
surround an opening of the die back volume.

33. A semiconductor die portion for use in a MEMS transducer package, the semiconductor die portion comprising:
a thickness bounded by a first surface and an opposite second surface, wherein the second surface incorporates a transducer element;
a die back volume that extends through the thickness of the semiconductor die portion between the first surface and the transducer element, and
an acoustic die channel that extends through the thickness of the semiconductor die portion between the first surface and the second surface.

34. A semiconductor die portion as claimed in claim 33, wherein the acoustic die channel comprises a first portion that extends between the first surface and the second surface, and a second portion that extends parallel to the first surface, the first and second portions configured to provide an acoustic path between a first opening in the second surface and a second opening in a side surface of the semiconductor die portion.

35. A MEMS transducer package comprising:
a semiconductor die element; and
a cap element;
wherein the semiconductor die element and cap element have mating surfaces,
wherein the semiconductor die element and cap element are configured such that when the semiconductor die element and cap element are conjoined:
a first volume is formed through the semiconductor die element and into the semiconductor cap element; and
an acoustic channel is formed to provide an opening between a non-mating surface of the semiconductor die element and either a side surface of the transducer package or a non-mating surface of the cap element.

* * * * *